US012674019B2

(12) United States Patent
Ogura

(10) Patent No.: US 12,674,019 B2
(45) Date of Patent: Jul. 7, 2026

(54) ESTER COMPOUND AND RESIN COMPOSITION

(71) Applicant: AJINOMOTO CO., INC., Tokyo (JP)

(72) Inventor: Ichiro Ogura, Kawasaki (JP)

(73) Assignee: AJINOMOTO CO., INC., Tokyo (JP)

( * ) Notice: Subject to any disclaimer, the term of this patent is extended or adjusted under 35 U.S.C. 154(b) by 743 days.

(21) Appl. No.: 18/296,042

(22) Filed: Apr. 5, 2023

(65) Prior Publication Data

US 2023/0235115 A1 Jul. 27, 2023

Related U.S. Application Data

(63) Continuation of application No. PCT/JP2021/037068, filed on Oct. 6, 2021.

(30) Foreign Application Priority Data

Oct. 7, 2020 (JP) ................................ 2020-170110

(51) Int. Cl.
*C08G 59/42* (2006.01)
*C07C 67/14* (2006.01)
(Continued)

(52) U.S. Cl.
CPC ......... *C08G 59/4276* (2013.01); *C08G 59/06* (2013.01); *C08G 63/197* (2013.01); (Continued)

(58) Field of Classification Search
None
See application file for complete search history.

(56) References Cited

U.S. PATENT DOCUMENTS 5,157,066 A 10/1992 Shoji et al.
5,750,711 A * 5/1998 Sezi ...................... C08G 69/40 560/84

(Continued)

FOREIGN PATENT DOCUMENTS

CN 112707804 A 4/2021
CN 113372211 A 9/2021

(Continued)

OTHER PUBLICATIONS

International Search Report in Application No. PCT/JP2021/037068 issued Nov. 30, 2021.

(Continued)

*Primary Examiner* — Ha S Nguyen
(74) *Attorney, Agent, or Firm* — Oblon, McClelland, Maier & Neustadt, L.L.P.

(57) ABSTRACT

Compounds containing, in one molecule thereof, a structure represented by formula (1), a structure represented by formula (2), and a structure represented by formula (3) (all the symbols are those described in the specification).

(1)

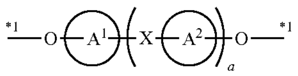

(2)

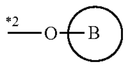

(3)

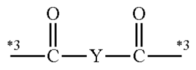

are useful as epoxy resin curing agents.

20 Claims, 6 Drawing Sheets

(51) Int. Cl.

| | |
|---|---|
| ***C07C 69/80*** | (2006.01) |
| ***C07C 69/90*** | (2006.01) |
| ***C07C 69/94*** | (2006.01) |
| ***C08G 59/06*** | (2006.01) |
| ***C08G 59/40*** | (2006.01) |
| ***C08G 63/19*** | (2006.01) |
| ***C08G 63/193*** | (2006.01) |
| ***C08G 63/197*** | (2006.01) |
| ***C08G 63/91*** | (2006.01) |
| ***H05K 1/03*** | (2006.01) |
| ***H05K 3/46*** | (2006.01) |
| ***H10W 70/685*** | (2026.01) |
| ***H10W 74/40*** | (2026.01) |
| ***H10W 74/47*** | (2026.01) |

(52) U.S. Cl.

CPC ........ *C08G 63/916* (2013.01); *H10W 70/685* (2026.01); *H10W 74/473* (2026.01)

(56) References Cited

U.S. PATENT DOCUMENTS

| | | | |
|---|---|---|---|
| 2020/0148618 | A1 | 5/2020 | Okamoto et al. |
| 2020/0216603 | A1 | 7/2020 | Satou et al. |

FOREIGN PATENT DOCUMENTS

| | | | | |
|---|---|---|---|---|
| JP | S621725 | A | * | 1/1987 |
| JP | 2-88635 | A | | 3/1990 |
| JP | 5-58958 | A | | 3/1993 |
| JP | H0558958 | A | * | 3/1993 |
| JP | 9-194431 | A | | 7/1997 |
| JP | H1077339 | A | * | 3/1998 |
| JP | 2000-273169 | A | | 10/2000 |
| WO | WO 2018/207532 | A1 | | 11/2018 |

OTHER PUBLICATIONS

European Office Action issued on Sep. 30, 2025 in European Patent Application No. 21 877 682.1, 6 pages.

* cited by examiner

ESTER COMPOUND AND RESIN COMPOSITION

CROSS REFERENCES TO RELATED APPLICATIONS

This application is a continuation of International Patent Application No. PCT/JP2021/037068, filed on Oct. 6, 2021, and claims priority to Japanese Patent Application No. 2020-170110, filed on Oct. 7, 2020, both of which are incorporated herein by reference in their entireties.

BACKGROUND OF THE INVENTION

Field of the Invention

The present invention relates to novel ester compounds, epoxy resin curing agents, methods for producing such an ester compound, products obtained therefrom, and resin compositions containing such an ester compound. The present invention also relates to cured products, sheet-like laminate materials, resin sheets, printed wiring boards, and semiconductor devices, these being obtained by using the said resin composition.

Discussion of the Background

A resin composition containing an epoxy resin and a curing agent for it has been widely used as the material for an electronic component such as a semiconductor and a printed circuit board because it can provide the cured product thereof with such properties as excellent insulation, heat resistance, and adhesiveness. On the other hand, to achieve a high-speed communication such as 5G, a circuit design to reduce a transmission loss in a high-frequency environment needs to be realized. Therefore, there is a need to develop a novel insulating material having superior dielectric properties (low relative permittivity and low dielectric loss tangent) more than ever.

Domestic Re-publication of PCT International Application No. 2018/207532, which is incorporated herein by reference in its entirety, disclosed an example of an insulating material having excellent dielectric properties in which a resin composition using an active ester compound containing a fluorine-containing aliphatic group such as a trifluoromethyl group is used as an epoxy curing agent. However, although the cured product using the compound of Domestic Re-publication of PCT International Application No. 2018/207532 as the curing agent exhibited superior dielectric properties as compared to the cured product using a general phenol curing agent, the properties thereof were not necessarily in a satisfactory level. In addition, a curing agent having excellent properties such as dielectric properties, a curing property, a heat resistance, and a moisture resistance is required. Therefore, there is a need to develop a novel ester compound that is useful as the curing agent for the epoxy resin.

SUMMARY OF THE INVENTION

Accordingly, it is one object of the present invention to provide a novel ester compound useful as an epoxy resin curing agent.

This and other objects, which will become apparent during the following detailed description, have been achieved by the inventor's focusing on the structure having a fluorine atom introduced, i.e., the structure of a fluorine group that can exhibit the dielectric properties most efficiently. As a result of the investigation, it was found that an introduction of the structure in which a fluorine atom is directly bonded to an aromatic carbon was a means to achieve the above effect in an even higher level.

Thus, the present invention includes the following aspects.

(1) A compound comprising, in one molecule thereof, a structure represented by formula (1):

(1)

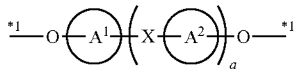

wherein a ring $A^1$ and a ring $A^2$ each independently represent an aromatic ring optionally having a substituent group;

X represents a single bond or a divalent organic group;

a represents 0 or 1; and

*1 indicates a bonding site to a carbonyl carbon atom to form an ester structure by bonding to the carbonyl carbon atom;

a structure represented by formula (2):

(2)

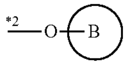

wherein a ring B represents an aromatic ring substituted with one or more fluorine atoms; and

*2 indicates a bonding site with a carbonyl carbon atom to form an ester structure by bonding to the carbonyl carbon atom; and a structure represented by formula (3):

(3)

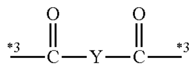

wherein

Y represents a divalent organic group; and

*3 indicates a bonding site with an oxygen atom to form an ester structure by bonding to the oxygen atom.

(2) The compound according to (1), wherein the ring B is an aromatic ring substituted with two or more fluorine atoms.

(3) The compound according to (1) or (2), wherein the structure represented by the formula (1) comprises 3 or more fluorine atoms in one unit of the structure.

(4) The compound according to (1), wherein the compound is represented by formula (A1):

(A1)

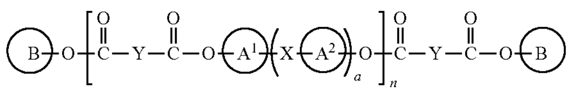

wherein the ring $A^1$ and the ring $A^2$ each independently represent an aromatic ring optionally having a substituent group;

each of the ring B independently represents an aromatic ring substituted with one or more fluorine atoms;

each X independently represents a single bond or a divalent organic group;

each Y independently represents a divalent organic group;

each a independently represents 0 or 1; and n represents an integer of 1 or more.

(5) The compound according to (4), wherein the compound is represented by formula (A2):

(A2)

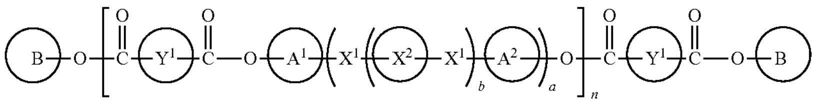

wherein the ring $A^1$ and the ring $A^2$ each independently represent an aromatic ring optionally having a substituent group;

each of the ring B independently represents an aromatic ring substituted with one or more fluorine atoms;

each $X^1$ independently represents a single bond, $—C(R^x)_2—$, —O—, —CO—, —S—, —SO—, $—SO_2—$, —CONH—, or —NHCO—;

each $R^x$ independently represents a hydrogen atom, an alkyl group optionally having a substituent group, or an aryl group optionally having a substituent group;

each of the ring $X^2$ independently represents an aromatic ring optionally having a substituent group or a non-aromatic ring optionally having a substituent group;

each of the ring $Y^1$ independently represents an aromatic carbon ring optionally having a substituent group;

each a independently represents 0 or 1;

each b independently represents an integer of 0 to 3; and n represents an integer of 1 or more.

(6) The compound according to any one of (1) to (5), wherein a content of the fluorine atom is 28% or more by mass.

(7) An epoxy resin curing agent comprising the compound according to any one of (1) to (6).

(8) A method for producing a compound comprising, in one molecule thereof, a structure represented by formula (1):

(1)

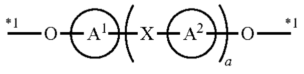

wherein a ring $A^1$ and a ring $A^2$ each independently represent an aromatic ring optionally having a substituent group;

X represents a single bond or a divalent organic group;

a represents 0 or 1; and

*1 indicates a bonding site to a carbonyl carbon atom to form an ester structure by bonding to the carbonyl carbon atom;

a structure represented by formula (2):

(2)

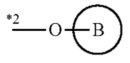

wherein a ring B represents an aromatic ring substituted with one or more fluorine atoms; and

*2 indicates a bonding site with a carbonyl carbon atom to form an ester structure by bonding to the carbonyl carbon atom; and a structure represented by formula (3):

(3)

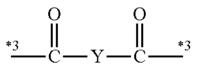

wherein

Y represents a divalent organic group; and

*3 indicates a bonding site with an oxygen atom to form an ester structure by bonding to the oxygen atom, the method comprising causing a reaction of a mixture comprising a compound represented by formula (B1):

(B1)

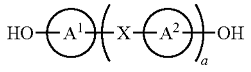

wherein all the symbols are the same as those described above, a compound represented by formula (C1):

(C1)

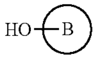

wherein all the symbols are the same as those described above, and a compound represented by formula (D1-1) or (D1-2):

(D1-1)

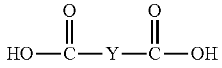

(D1-2)

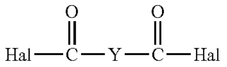

wherein Hal represents a halogen atom; other symbols are the same as those described above, or a salt thereof.

(9) A product obtained by causing a reaction of a mixture comprising a compound represented by formula (B1):

(B1)

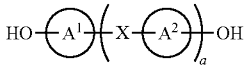

wherein all the symbols are the same as those described above, a compound represented by formula (C1):

(C1)

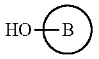

wherein all the symbols are the same as those described above, and a compound represented by formula (D1-1) or (D1-2):

(D1-1)

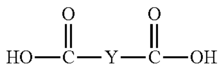

(D1-2)

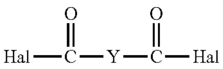

wherein Hal represents a halogen atom; other symbols are the same as those described above, or a salt thereof.

(10) A resin composition comprising an epoxy resin and a compound comprising, in one molecule thereof, a structure represented by formula (1):

(1)

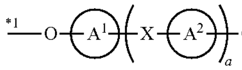

wherein a ring $A^1$ and a ring $A^2$ each independently represent an aromatic ring optionally having a substituent group;

X represents a single bond or a divalent organic group;

a represents 0 or 1; and

*1 indicates a bonding site to a carbonyl carbon atom to form an ester structure by bonding to the carbonyl carbon atom;

a structure represented by formula (2):

(2)

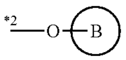

wherein a ring B represents an aromatic ring substituted with one or more fluorine atoms; and

*2 indicates a bonding site with a carbonyl carbon atom to form an ester structure by bonding to the carbonyl carbon atom; and a structure represented by formula (3):

(3)

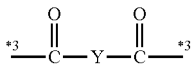

wherein

Y represents a divalent organic group; and

*3 indicates a bonding site with an oxygen atom to form an ester structure by bonding to the oxygen atom.

(11) The resin composition according to (10), further comprising an inorganic filler.

(12) The resin composition according to (11), wherein a content of the inorganic filler is 60% or more by mass relative to 100% by mass of nonvolatile components in the resin composition.

(13) The resin composition according to any one of (10) to (12), wherein the resin composition is to form an insulating layer of a printed wiring board.

(14) The resin composition according to any one of (10) to (12), wherein the resin composition is to encapsulate a semiconductor chip.

(15) A cured product of the resin composition according to any one of (10) to (14).

(16) A sheet-like laminate material comprising the resin composition according to any one of (10) to (14).

(17) A resin sheet comprising:

a support; and a resin composition layer formed on the support, the resin composition layer being formed of the resin composition according to any one of (10) to (14).

(18) A printed wiring board comprising an insulating layer formed of a cured product of the resin composition according to any one of (10) to (14).

(19) A semiconductor device comprising the printed wiring board according to (18).

(20) The semiconductor device according to (19), wherein the semiconductor device is a Fan-Out semiconductor device.

Advantageous Effects of Invention

According to the present invention, a novel ester compound useful as a novel epoxy resin curing agent can be provided.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Figure 1:
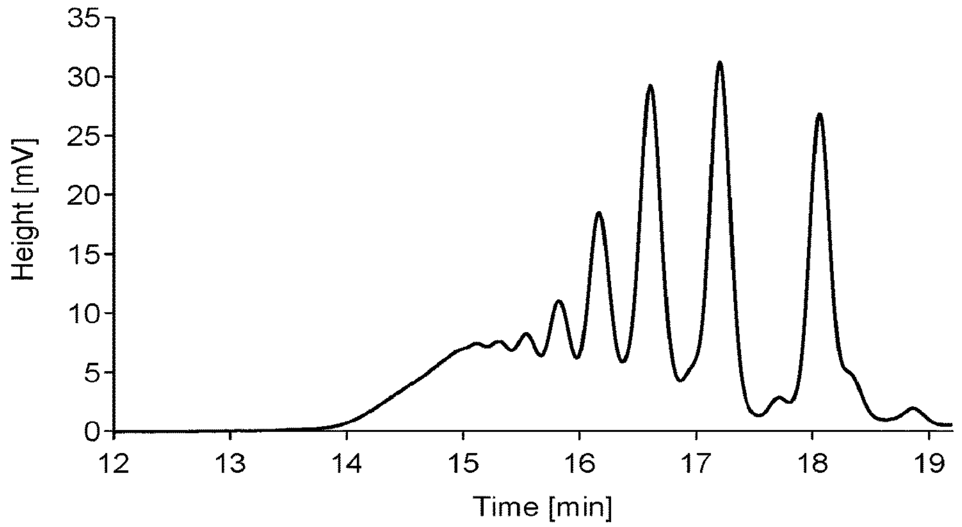
FIG. 1 illustrates the GPC chart of the product (A-1) in Example A-1.

Hereinafter, the present invention will be described in detail in line with the preferred embodiments thereof. Herein, it must be noted that the present invention is not limited to the embodiments and examples described below, and that the present invention may be carried out with any arbitrary modification as long as such modification is not outside the claims or the equivalent thereof in the present invention.

The present invention provides a compound containing, in one molecule thereof, a structure represented by the formula (1):

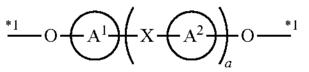

(1)

wherein a ring $A^1$ and a ring $A^2$ each independently represent an aromatic ring optionally having a substituent group;

X represents a single bond or a divalent organic group;

a represents 0 or 1; and

*1 indicates a bonding site with a carbonyl carbon atom, forming an ester structure by bonding to the carbonyl carbon atom, and a structure represented by the formula (2):

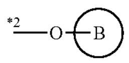

(2)

wherein a ring B represents an aromatic ring substituted with one or more fluorine atoms; and

*2 indicates a bonding site with a carbonyl carbon atom to form an ester structure by bonding to the carbonyl carbon atom and a structure represented by the formula (3):

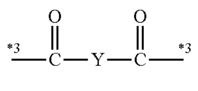

(3)

wherein

Y represents a divalent organic group; and

*3 indicates a bonding site with an oxygen atom to form an ester structure by bonding to the oxygen atom (hereinafter this compound is sometimes referred to as "ester compound (A)").

The number of the structural unit of the structure represented by the formula (1) in one molecule of the ester compound (A) is, in one embodiment, 1 or more, preferably 1 to 100, more preferably 1 to 10, still more preferably 1, 2, 3, 4, or 5, while especially preferably 1, 2, or 3. The number of the structural unit of the structure represented by the formula (2) in one molecule of the ester compound (A) is, in one embodiment, 1 or more, preferably 2 or more, while especially preferably 2. The number of the structural unit of the structure represented by the formula (3) in one molecule of the ester compound (A) is, in one embodiment, 1 or more, preferably 2 or more, more preferably 2 to 100, still more preferably 2 to 10, far still more preferably 2, 3, 4, 5, or 6, while especially preferably 2, 3, or 4.

The ester compound (A) is the ester compound formed by esterification of a hydroxy compound with a carboxylic acid compound (the raw material for production thereof may be a carboxylic acid halide or a carboxylic acid anhydride), in which the structures represented by the formula (1) and the formula (2) are derived from the hydroxy compound, and the structure represented by the formula (3) is derived from the carboxylic acid compound. The ester compound (A) may, in one embodiment, further include structures derived from other hydroxy compound such as other monohydroxy compound, other dihydroxy compound, a trihydroxy compound, a tetrahydroxy compound, or the like; and structures derived from other carboxylic acid compound such as a monocarboxy compound, a tricarboxy compound, a tetracarboxy compound, or the like. In this embodiment, the ratio of the total of the structure represented by the formula (1) and the structure represented by the formula (2) in the structure derived from the hydroxy compound in the ester compound (A) is preferably 50% or more by mole, more preferably 70% or more by mole, still more preferably 80% or more by mole, far still more preferably 90% or more by mole, while especially preferably 95% or more by mole, 98% or more by mole, or 100% by mole. The ratio of the structure represented by formula (3) in the structure derived from the carboxylic acid compound in the ester compound (A) is preferably 50% or more by mole, more preferably 70% or more by mole, still more preferably 80% or more by mole, far still more preferably 90% or more by mole, while especially preferably 95% or more by mole, 98% or more by mole, or 100% by mole.

In the ester compound (A), it is preferable that at least one of the bonding sites *1 in the structure represented by the formula (1) is bonded to the bonding site *3 in the structure represented by the formula (3), and it is more preferable that both of the bonding sites *1 are bonded to the bonding site *3. In the ester compound (A), it is preferable that the bonding site *2 in the structure represented by the formula (2) is bonded to the bonding site *3 in the structure represented by the formula (3). In the ester compound (A), it is preferable that at least one of the bonding sites *3 in the structure represented by the formula (3) is bonded to the bonding site *1 in the structure represented by the formula (1) or to the *2 bonding site in the structure represented by the formula (2). It is more preferable that both of the bonding sites *3 are bonded to the bonding site *1 or to the bonding site *2. It is especially preferable that the ester compound (A) is a compound in which all the bonding sites *1 in the structure represented by the formula (1) and all the bonding sites *2 in the structure represented by the formula (2) and all the bonding sites *3 in the structure represented by the formula (3) are bonded together to form the structure represented by the formula (A1) to be described below.

Hereinafter, the structure represented by the formula (1) will be described.

The ring $A^1$ and the ring $A^2$ each independently represent an aromatic ring optionally having a substituent group.

The aromatic ring means the ring that obeys Hückel's rule where the number of electrons in the π-electron system on the ring is 4p+2 (p is a natural number). The aromatic ring may be an aromatic carbon ring having a carbon atom as the ring constituent atom, or an aromatic heterocyclic ring having a heteroatom such as an oxygen atom, a nitrogen atom, or a sulfur atom in addition to the carbon atom as the ring constituent atom. In one embodiment, an aromatic carbon ring is preferable. In one embodiment, an aromatic ring formed of 5 to 14 members are preferable, an aromatic ring formed of 5 to 10 members are more preferable, while an aromatic ring formed of 5 or 6 members are still more preferable.

Specifically, illustrative examples of the preferable aromatic ring include: monocyclic aromatic rings such as a benzene ring, a furan ring, a thiophene ring, a pyrrole ring, a pyrazole ring, an oxazole ring, an isoxazole ring, a thiazole ring, an imidazole ring, a pyridine ring, a pyridazine ring, a pyrimidine ring, and a pyrazine ring; and condensed aromatic rings in which two or more monocyclic aromatic rings are condensed, such as a naphthalene ring, an anthracene ring, a phenanthrene ring, a benzofuran ring, an isobenzofuran ring, an indole ring, an isoindole ring, a benzothiophene ring, a benzoimidazole ring, an indazole ring, a benzoxazole ring, a benzoisoxazole ring, a benzothiazole ring, a quinoline ring, an isoquinoline ring, a quinoxaline ring, an acridine ring, a quinazoline ring, a cinnoline ring, and a phthalazine ring. In one embodiment, an aromatic carbon ring is preferable, in which a benzene ring and a naphthalene ring are more preferable, while a benzene ring is especially preferable.

There is no particular restriction in the substituent group on the aromatic rings of the ring $A^1$ and the ring $A^2$, but illustrative examples thereof may include the group selected from a halogen atom, an amino group, a mercapto group, a nitro group, a cyano group, —R, —OR, —SR, —$SO_2$R, —NHR, —$NR_2$, —COR, —CO—OR, —CO—NHR, —CO—$NR_2$, —O—COR, —NH—COR, —NR—COR, and —$N(COR)_2$. Herein, R may be (1) an alkyl group optionally substituted by the group selected from a halogen atom, a hydroxy group, an amino group, a mercapto group, a nitro group, a cyano group, —$R^a$, —$OR^b$, —$SR^b$, —$SO_2R^b$, —$NHR^b$, —$N(R^b)_2$, —$COR^b$, —CO—$OR^b$, —CO—$NHR^b$, —CO—$N(R^b)_2$, —O—$COR^b$, —NH—$COR^b$, —NR—$COR^b$, and —$N(COR^b)_2$; (2) an alkenyl group optionally substituted by the group selected from a halogen atom, a hydroxy group, an amino group, a mercapto group, a nitro group, a cyano group, —$R^a$, —$OR^b$, —$SR^b$, —$SO_2R^b$, —$NHR^b$, —$N(R^b)_2$, —$COR^b$, —CO—$OR^b$, —CO—$NHR^b$, —CO—$N(R^b)_2$, —O—$COR^b$, —NH—$COR^b$, —$NR^b$—$COR^b$, and —$N(COR^b)_2$; or (3) an aryl group optionally substituted by the group selected from a halogen atom, a hydroxy group, an amino group, a mercapto group, a nitro group, a cyano group, —$R^b$, —$OR^b$, —$SR^b$, —$SO_2R^b$, —$NHR^b$, —$N(R^b)_2$, —$COR^b$, —CO—$OR^b$, —CO—$NHR^b$, —CO—$N(R^b)_2$, —O—$COR^b$, —NH—$COR^b$, —$NR^b$—$COR^b$, and —$N(COR^b)_2$. Illustrative examples of $R^a$ include: a halogen atom and a substituted or an unsubstituted aryl group; specifically, a halogen atom, an aryl group, a halogen-substituted aryl group, an alkyl-aryl group (aryl group substituted with one or more alkyl groups), and an aryl-aryl group (aryl group substituted with one or more aryl groups). Illustrative examples of $R^b$ include: a halogen atom, a substituted or an unsubstituted alkyl group, a substituted or an unsubstituted alkenyl group, and a substituted or an unsubstituted aryl group; specifically, a halogen atom, an alkyl group, an alkenyl group, an aryl group, a halogen-substituted alkyl group, a halogenated alkenyl group, a halogen-substituted aryl group, an alkyl-aryl group, an aryl-aryl group, an aryl-alkyl group (alkyl group substituted with one or more aryl groups), and the like may be mentioned.

The alkyl (group) means a linear, a branched-chain and/or a cyclic monovalent saturated hydrocarbon group. The alkyl (group) is preferably an alkyl (group) having 1 to 14 carbon atoms, more preferably 1 to 10 carbon atoms, while still more preferably 1 to 6 carbon atoms, unless otherwise specifically noted. Illustrative examples of the alkyl (group) include a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, a cyclopentyl group, a cyclohexyl group, a 2-methylcyclohexyl group, a 3-methylcyclohexyl group, a 4-methylcyclohexyl group, a 3,3-dimethylcyclohexyl group, a 3,3,5-trimethylcyclohexyl group, a cyclopentylmethyl group, a cyclohexylmethyl group, and a 2-cyclohexylethyl group.

The alkenyl (group) means a linear, a branched-chain and/or a cyclic monovalent aliphatic unsaturated hydrocarbon group having at least one carbon-carbon double bond. The alkenyl (group) is preferably an alkenyl group having 2 to 14 carbon atoms, more preferably 2 to 10 carbon atoms, while still more preferably 2 to 6 carbon atoms, unless otherwise specifically noted. Illustrative examples of the alkenyl group include a vinyl group, a 1-propenyl group, a 2-propenyl group (allyl group), an isopropenyl group, a 2-methyl-2-propenyl group, a 1-butenyl group, a 2-butenyl group, a 3-butenyl group, a 2-pentenyl group, a 3-pentenyl group, a 4-pentenyl group, a 1-methyl-1-butenyl group, a 2-methyl-1-butenyl group, a 2-methyl-2-butenyl group, a 3-methyl-2-butenyl group, a 3-methyl-3-butenyl group, a 1-pentenyl group, a 2-pentenyl group, a 3-pentenyl group, a 4-pentenyl group, a 4-methyl-4-pentenyl group, a 1-hexenyl group, a 2-hexenyl group, a 3-hexenyl group, a 4-hexenyl group, a 5-hexenyl group, a 1-cyclopentenyl group, a 2-cyclopentenyl group, a 3-cyclopentenyl group, a 1-cyclohexenyl group, a 2-cyclohexenyl group, and a 3-cyclohexenyl group.

The aryl (group) means a monovalent aromatic hydrocarbon group having one hydrogen atom removed in the aromatic carbon ring. The aryl (group) is preferably an aryl (group) having 6 to 14 carbon atoms, while more preferably 6 to 10 carbon atoms, unless otherwise specifically noted. Illustrative examples of the aryl (group) include a phenyl group, a 1-naphthyl group, a 2-naphthyl group, a 9-anthryl group, and a 9-phenanthrenyl group.

The halogen atom is a fluorine atom, a chlorine atom, a bromine atom, or an iodine atom, in which a fluorine atom is preferable unless otherwise specifically noted. The halogen-substituted alkyl group, the halogen-substituted alkenyl group, and the halogen-substituted aryl group each are an alkyl group that is substituted with one or more halogen atoms, an alkenyl group that is substituted with one or more halogen atoms, and an aryl group that is substituted with one or more halogen atoms, respectively, in which a fluorine-substituted alkyl group, a fluorine-substituted alkenyl group, and a fluorine-substituted aryl group are preferable. The fluorine-substituted alkyl group, the fluorine-substituted alkenyl group, and the fluorine-substituted aryl group each mean an alkyl group that is substituted with one or more fluorine atoms, an alkenyl group that is substituted with one or more fluorine atoms, and an aryl group that is substituted with one or more fluorine atoms, respectively.

In one embodiment, preferably, the ring $A^1$ and the ring $A^2$ each independently represent an aromatic carbon ring optionally having a substituent group.

In one embodiment, more preferably, the ring $A^1$ and the ring $A^2$ each independently represent a benzene ring optionally having a substituent group, or a naphthalene ring optionally having a substituent group.

In one embodiment, still more preferably, the ring $A^1$ and the ring $A^2$ each independently represent (1) a benzene ring optionally having a substituent group selected from (a) a halogen atom; (b) an alkyl group optionally having a substituent group selected from a halogen atom and an aryl group; (c) an alkyl-oxy group (namely, an alkoxy group) optionally having a substituent group selected from a halogen atom and an aryl group; (d) an alkenyl group optionally having a substituent group selected from a halogen atom and an aryl group; (e) an aryl group optionally having a substituent group selected from a halogen atom, an aryl group, an alkenyl group, and an alkyl group; and (f) an aryl-oxy group optionally having a substituent group selected from a halogen atom, an aryl group, an alkenyl group, and an alkyl group; or (2) a naphthalene ring optionally having a substituent group selected from (a) a halogen atom; (b) an alkyl group optionally having a substituent group selected from a halogen atom and an aryl group; (c) an alkyl-oxy group optionally having a substituent group selected from a halogen atom and an aryl group; (d) an alkenyl group optionally having a substituent group selected from a halogen atom and an aryl group; (e) an aryl group optionally having a substituent group selected from a halogen atom, an aryl group, an alkenyl group, and an alkyl group; and (f) an aryl-oxy group optionally having a substituent group selected from a halogen atom, an aryl group, an alkenyl group, and an alkyl group.

In one embodiment, far still more preferably, the ring $A^1$ and the ring $A^2$ each independently represent (1) a benzene ring optionally having a substituent group selected from a halogen atom, an aryl group, an alkyl group, an aryl-oxy group, an alkyl-oxy group, a halogen-substituted aryl group, or a halogen-substituted alkyl group; or (2) a naphthalene ring optionally having a substituent group selected from a halogen atom, an aryl group, an alkyl group, an aryl-oxy group, an alkyl-oxy group, a halogen-substituted aryl group, or a halogen-substituted alkyl group.

In one embodiment, especially preferably, the ring $A^1$ and the ring $A^2$ each independently represent (1) a benzene ring optionally having a substituent group selected from a fluorine atom, an aryl group, an alkyl group, a fluorine-substituted aryl group, or a fluorine-substituted alkyl group, or (2) a naphthalene ring optionally having a substituent group selected from a fluorine atom, an aryl group, an alkyl group, a fluorine-substituted aryl group, or a fluorine-substituted alkyl group.

Each X independently represents a single bond or a divalent organic group. In one embodiment, the divalent organic group in X is preferably a divalent organic group composed of one or more (for example, 1 to 3000, 1 to 1000, 1 to 100, or 1 to 50) skeleton atoms selected from a carbon atom, an oxygen atom, a nitrogen atom, and a sulfur atom. In one embodiment, the divalent organic group in X may have a halogen atom, in addition to or in place of a hydrogen atom, as the non-skeleton atom. The divalent organic group in X include a linear structure, a branched-chain structure and/or a cyclic structure. The divalent organic group in X may be any of a divalent organic group not containing an aromatic ring and a divalent organic group containing an aromatic ring.

Herein, a represents 0 or 1; in one embodiment, a is preferably 1, and in the other embodiment, a is preferably 0.

In one embodiment, the structure represented by the formula (1):

(1)

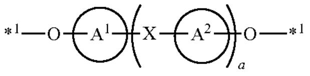

wherein all the symbols are the same as those described before, is preferably the structure represented by the formula (1'):

(1')

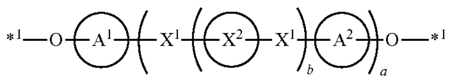

wherein each $X^1$ independently represents a single bond, $-C(R^x)_2-$, $-O-$, $-CO-$, $-S-$, $-SO-$, $-SO_2-$, $-CONH-$, or $-NHCO-$; each $R^x$ independently represents a hydrogen atom, an alkyl group optionally having a substituent group, or an aryl group optionally having a substituent group; each of the ring $X^2$ independently represents an aromatic ring optionally having a substituent group, or a non-aromatic ring optionally having a substituent group; b represents an integer of 0 to 3; and other symbols are the same as those described before. More preferable is any of the structures represented by the formula (1"-1) and the formula (1"-2):

(1"-1)

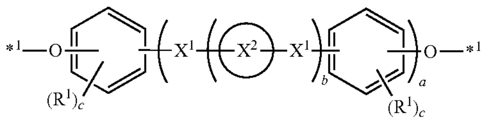

(1"-2)

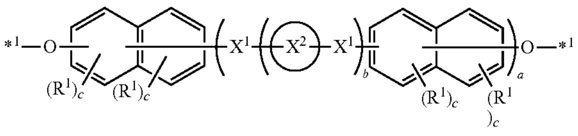

wherein each $R^1$ independently represents a substituent group; each c independently represents an integer of 0, or 1 or more; and other symbols are the same as those described before. Still more preferable are any of the structures represented by the formula (1'''-1) to the formula (1'''-38):

(1'''-1)

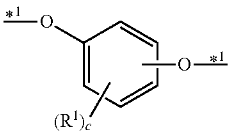

-continued
(1'''-2)
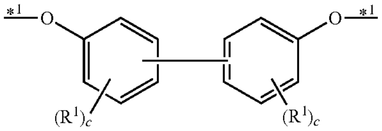
(1'''-3)
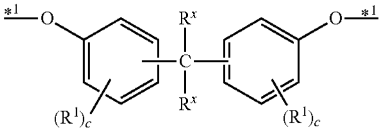
(1'''-4)
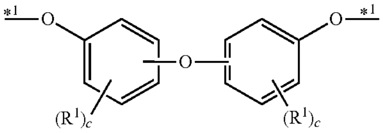
(1'''-5)
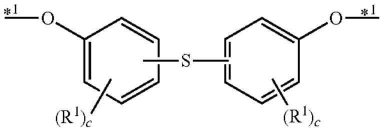
(1'''-6)
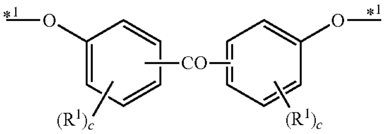
(1'''-7)
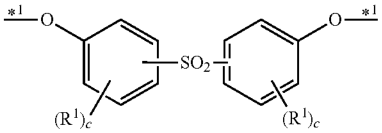
(1'''-8)
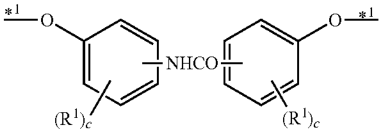
(1'''-9)
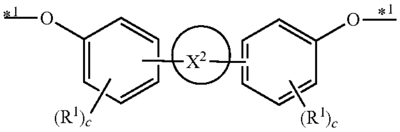
(1'''-10)
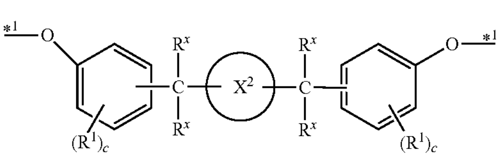
(1'''-11)
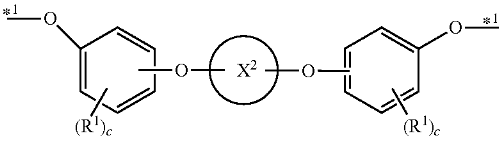
-continued
(1'''-12)
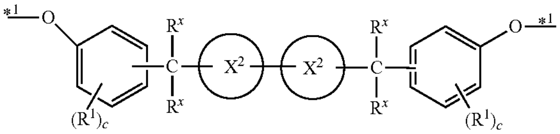
(1'''-13)
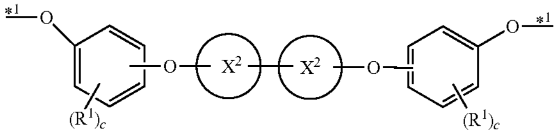
(1'''-14)
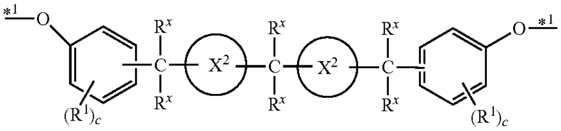
(1'''-15)
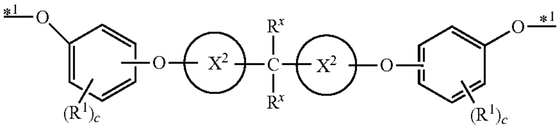
(1'''-16)
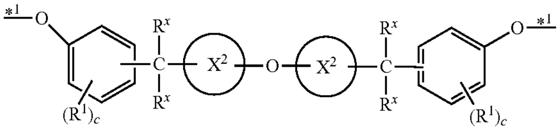
(1'''-17)
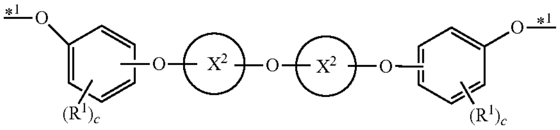
(1'''-18)
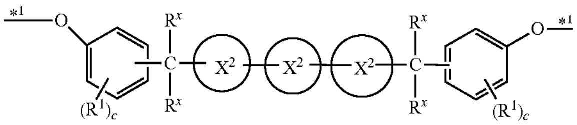
(1'''-19)
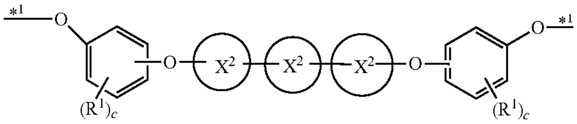
(1'''-20)
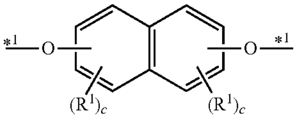
(1'''-21)
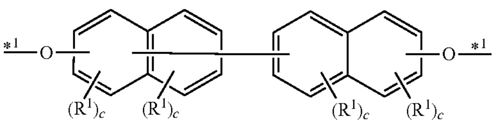

-continued
(1'''-22)
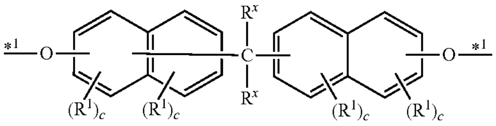
(1'''-23)
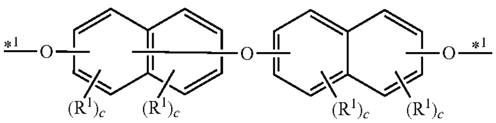
(1'''-24)
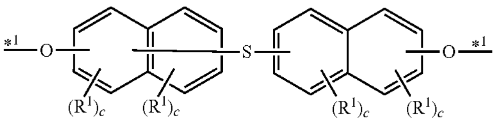
(1'''-25)
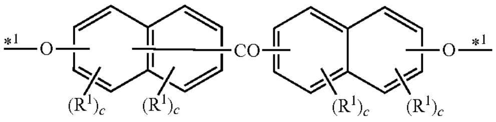
(1'''-26)
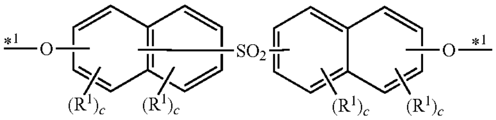
(1'''-27)
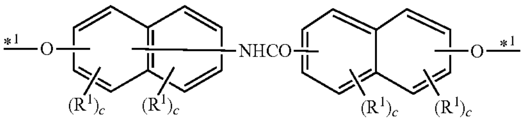
(1'''-28)
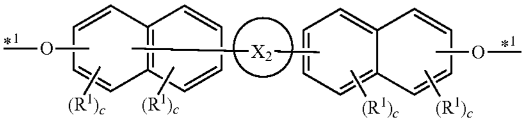
(1'''-29)
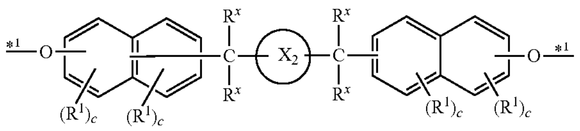
(1'''-30)
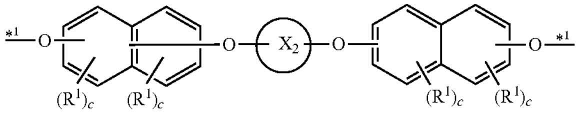
(1'''-31)
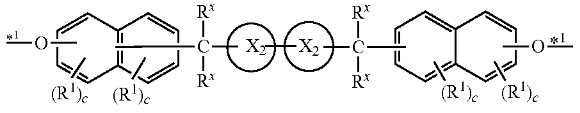
-continued
(1'''-32)
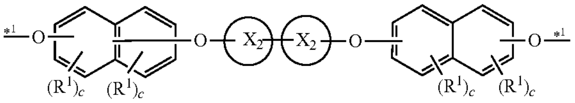
(1'''-33)
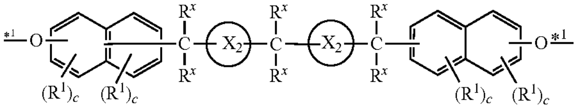
(1'''-34)
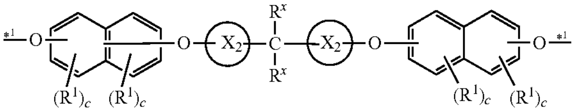
(1'''-35)
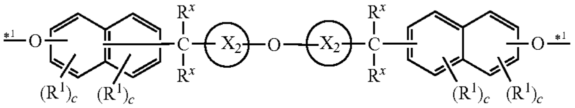
(1'''-36)
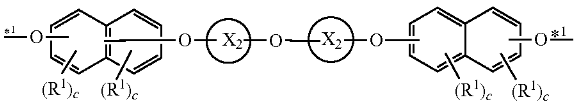
(1'''-37)
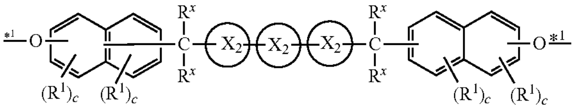
(1'''-38)
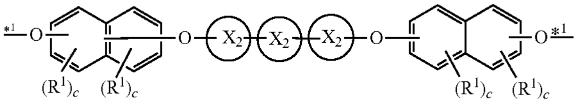
wherein all the symbols are the same as those described before. Specifically, there is no particular restriction, but illustrative examples thereof may include the structures represented by the following formulae (1""-1) to (1""-87):
(1'''-1)
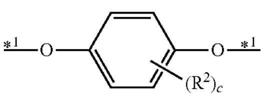
(1'''-2)
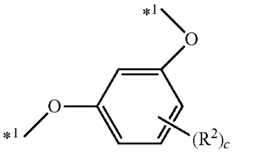
(1'''-3)
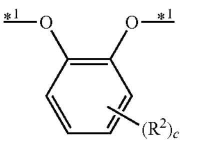

-continued
(1'''-4)
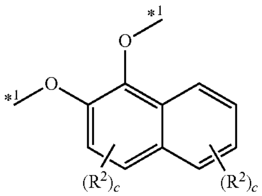
(1'''-5)
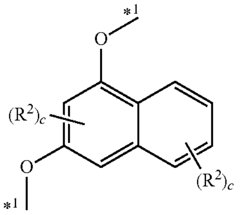
(1'''-6)
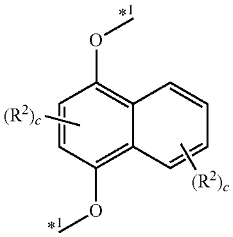
(1'''-7)
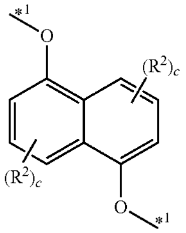
(1'''-8)
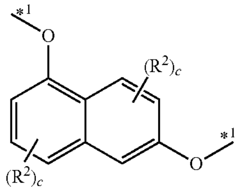
(1'''-9)
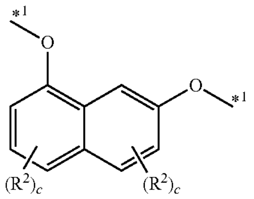
(1'''-10)
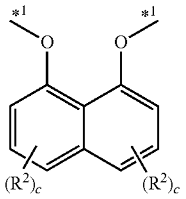
-continued
(1'''-11)
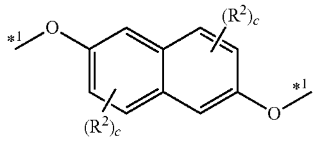
(1'''-12)
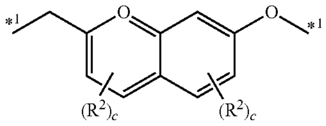
(1'''-13)
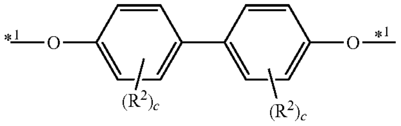
(1'''-14)
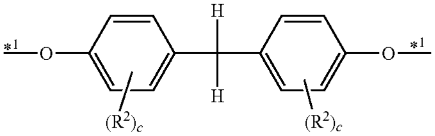
(1'''-15)
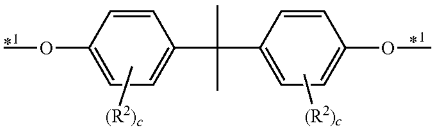
(1'''-16)
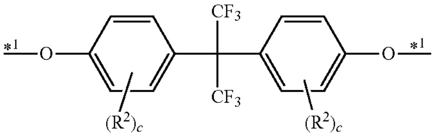
(1'''-17)
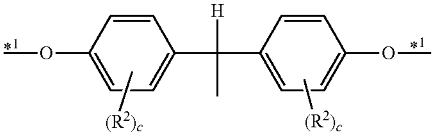
(1'''-18)
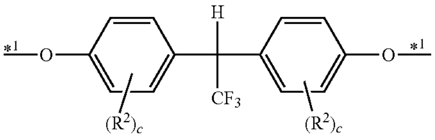
(1'''-19)
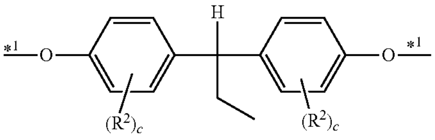
(1'''-20)
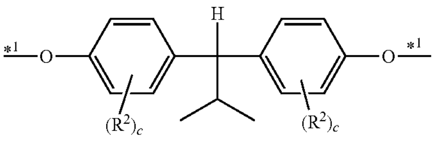

-continued
(1'''-21)
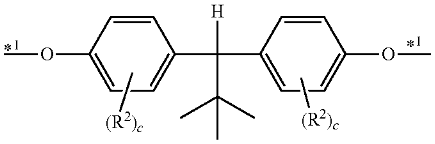
(1'''-22)
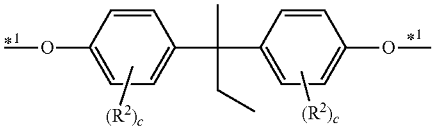
(1'''-23)
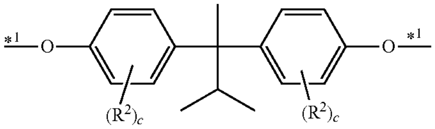
(1'''-24)
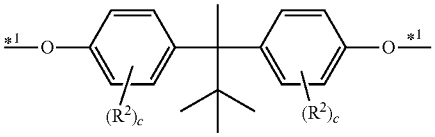
(1'''-25)
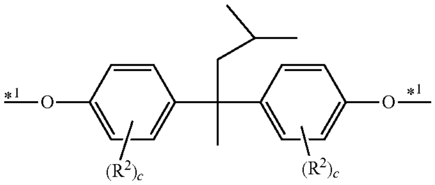
(1'''-26)
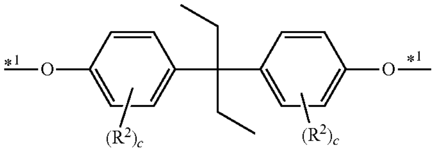
(1'''-27)
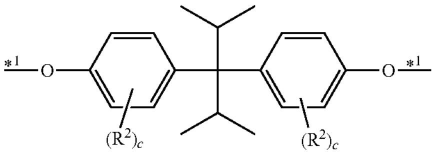
(1'''-28)
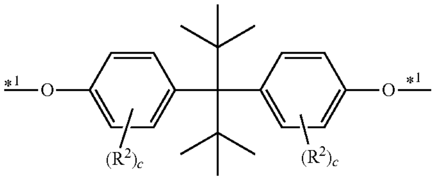
(1'''-29)
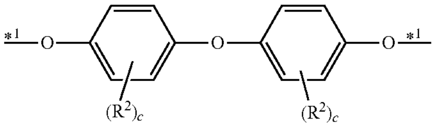
(1'''-30)
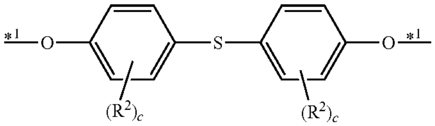
-continued
(1'''-31)
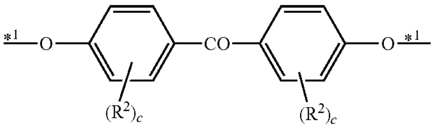
(1'''-32)
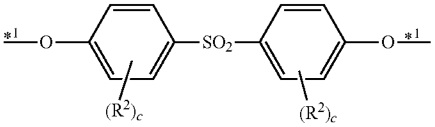
(1'''-33)
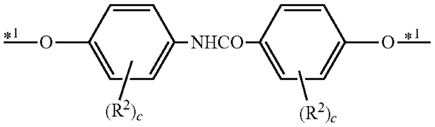
(1'''-34)
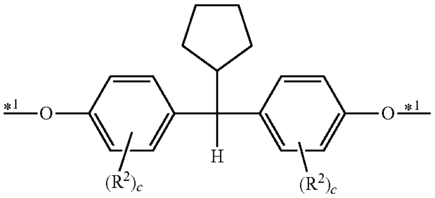
(1'''-35)
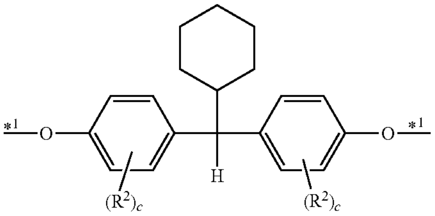
(1'''-36)
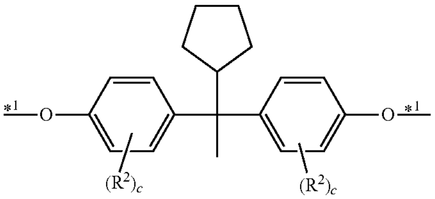
(1'''-37)
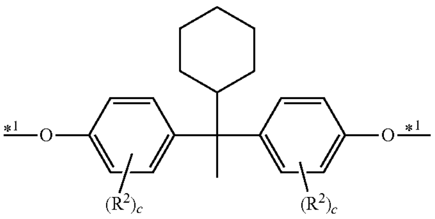
(1'''-38)
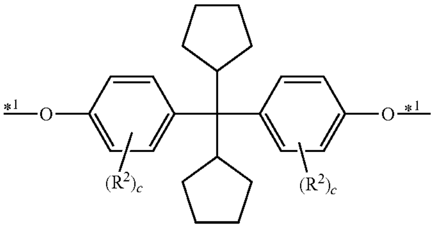

-continued
(1'''-39)
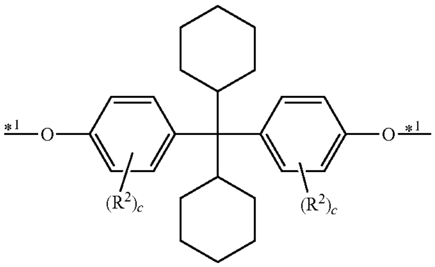
(1'''-40)
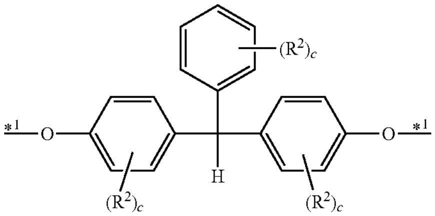
(1'''-41)
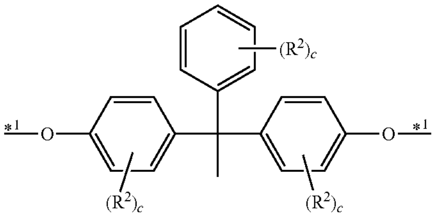
(1'''-42)
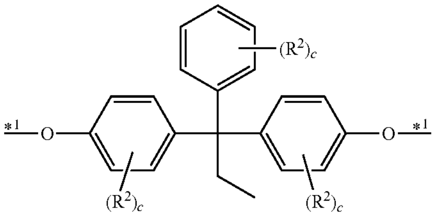
(1'''-43)
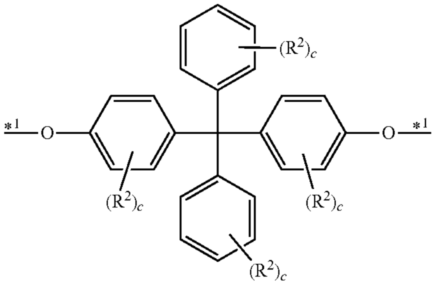
(1'''-44)
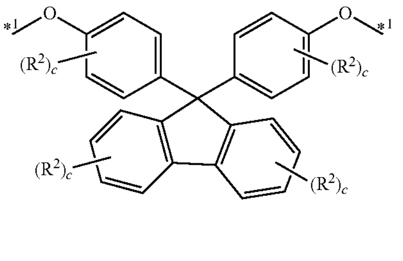
-continued
(1'''-45)
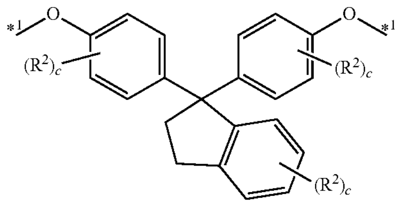
(1'''-46)
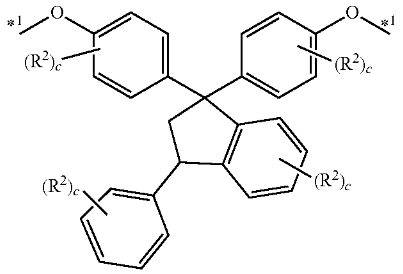
(1'''-47)
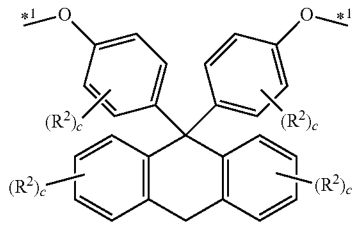
(1'''-48)
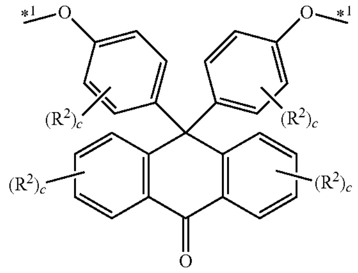
(1'''-49)
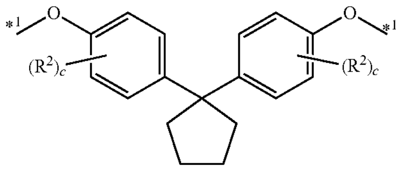
(1'''-50)
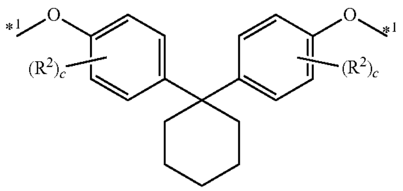
(1'''-51)
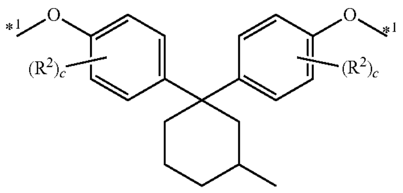

-continued
(1'''-52)
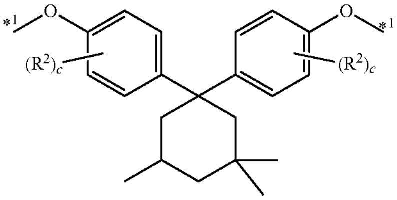
(1'''-53)
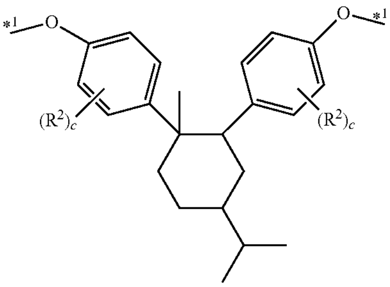
(1'''-54)
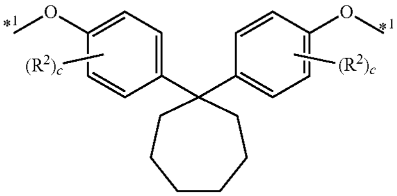
(1'''-55)
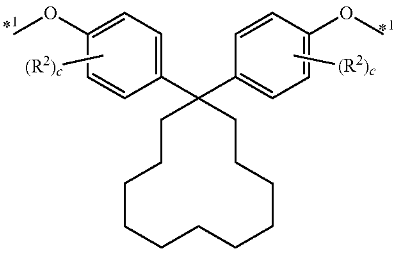
(1'''-56)
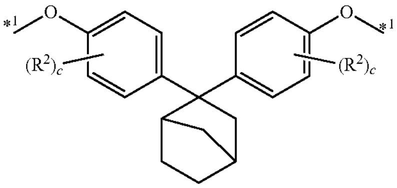
(1'''-57)
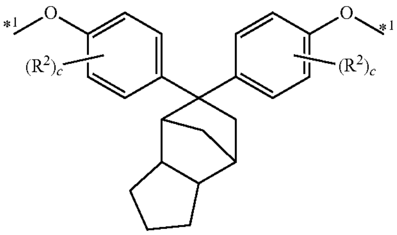
(1'''-58)
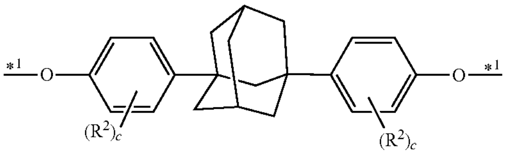
-continued
(1'''-59)
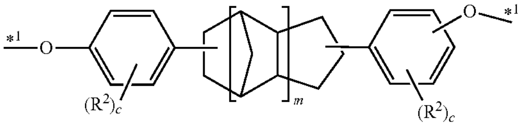
(1'''-60)
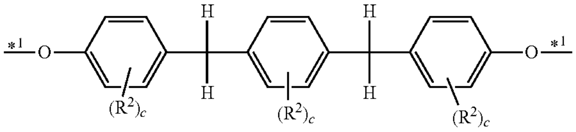
(1'''-61)
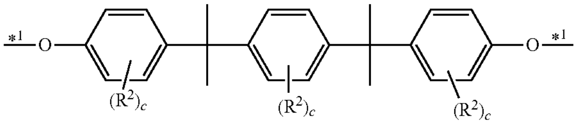
(1'''-62)
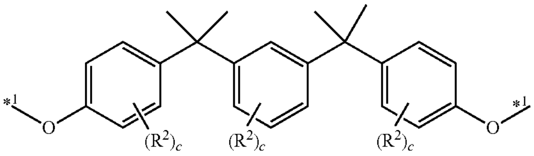
(1'''-63)
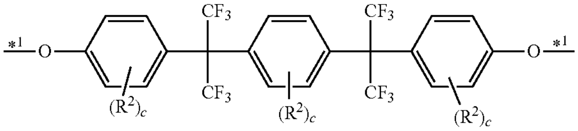
(1'''-64)
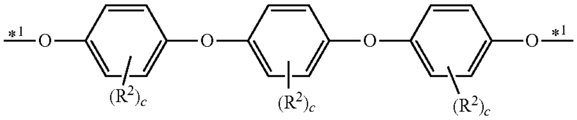
(1'''-65)
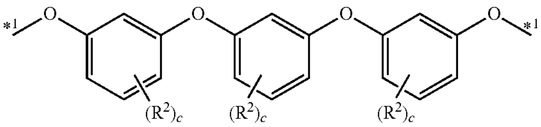
(1'''-66)
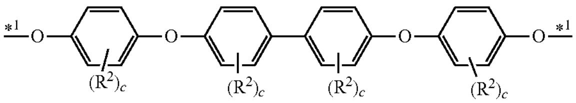
(1'''-67)
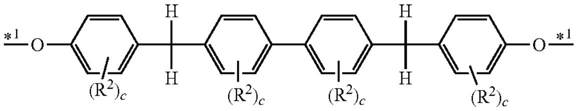
(1'''-68)
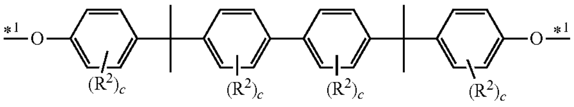

-continued
(1'''-69)
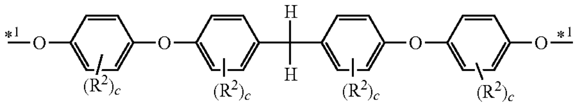
(1'''-70)
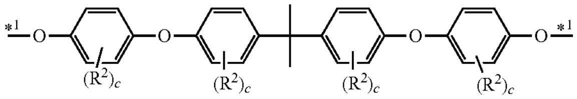
(1'''-71)
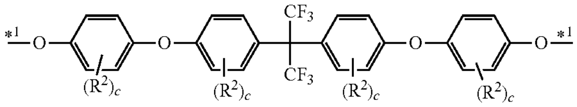
(1'''-72)
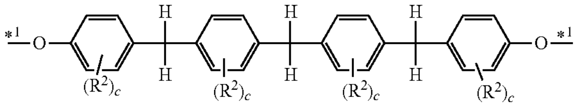
(1'''-73)
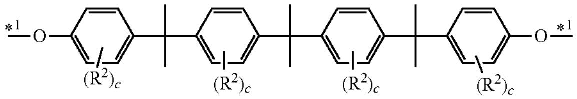
(1'''-74)
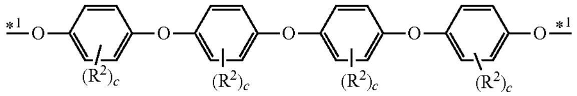
(1'''-75)
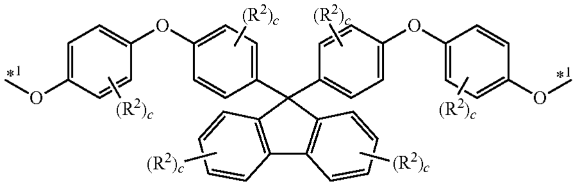
(1'''-76)
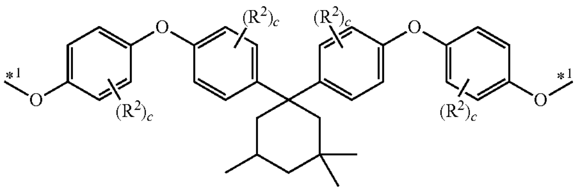
(1'''-77)
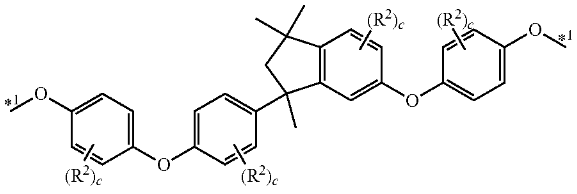
-continued
(1'''-78)
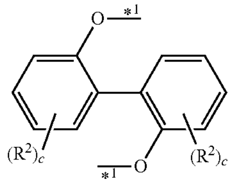
(1'''-79)
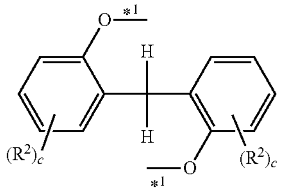
(1'''-80)
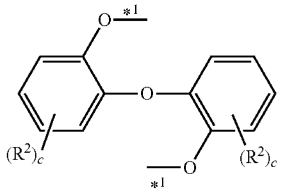
(1'''-81)
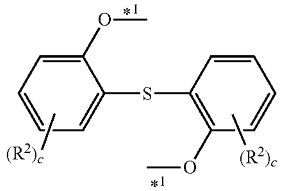
(1'''-82)
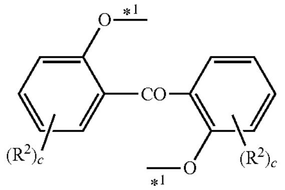
(1'''-83)
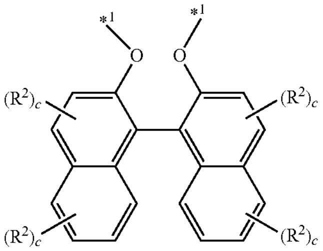
(1'''-84)
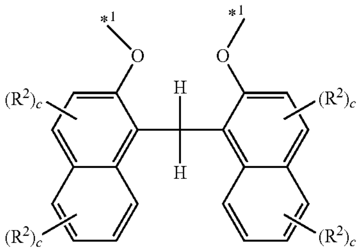

-continued (1'''-85)

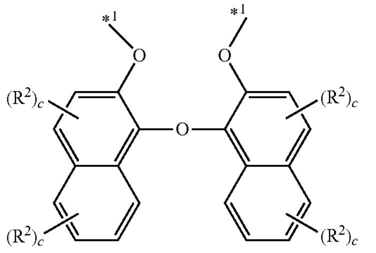

(1'''-86)

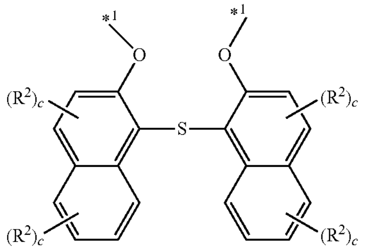

(1'''-87)

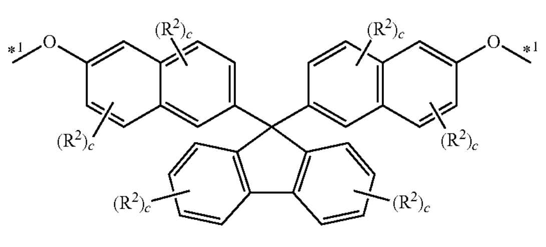

wherein each $R^2$ independently represents a halogen atom, an aryl group, an alkyl group, an aryl-oxy group, an alkyl-oxy group, a halogen-substituted aryl group, or a halogen-substituted alkyl group; m represents 1 or 2; and other symbols are the same as those described before. The b unit may be the same or different in each structural unit. The c unit may be the same or different in each structural unit.

Each $X^1$ independently represents a single bond, $—C(R^x)_2—$, —O—, —CO—, —S—, —SO—, $—SO_2—$, —CONH—, or —NHCO—. In one embodiment, each $X^1$ independently represents preferably a single bond, $—C(R^x)_2—$, —O—, —CO—, —S—, —SO—, or $—SO_2—$, more preferably a single bond or $—C(R^x)_2—$, while especially preferably $—C(R^x)_2—$.

Each $R^x$ independently represents a hydrogen atom, an alkyl group optionally having a substituent group, or an aryl group optionally having a substituent group.

There is no particular restriction in the substituent group in "the aryl group optionally having a substituent group" in $R^x$, but illustrative examples thereof may include the group selected from a halogen atom, a hydroxy group, an amino group, a mercapto group, a nitro group, a cyano group, —R, —OR, —SR, $—SO_2R$, —NHR, $—NR_2$, —COR, —CO—OR, —CO—NHR, $—CO—NR_2$, —O—COR, —NH—COR, —NR—COR, and $—N(COR)_2$. There is no particular restriction in the substituent group in "the alkyl group optionally having a substituent group" in $R^x$, but illustrative examples thereof may include the group selected from a halogen atom, a hydroxy group, an amino group, a mercapto group, a nitro group, a cyano group, —R', —OR, —SR, $—SO_2R$, —NHR, $—NR_2$, —COR, —CO—OR, —CO—NHR, $—CO—NR_7$, —O—COR, —NH—COR, —NR—COR, and $—N(COR)_2$. R represents the same as before, and R' represents an aryl group optionally substituted by the substituent group selected from, for example, a halogen atom, a hydroxy group, an amino group, a mercapto group, a nitro group, a cyano group, —Rn, $—OR^b$, $—SR^b$, $—SO_2R^b$, $—NHR^b$, $—N(R^b)_2$, $—COR^b$, $—CO—OR^b$, $—CO—NHR^b$, $—CO—N(R^b)_2$, $—O—COR^b$, $—NH—COR^b$, $—NR^b—COR^b$, and $—N(COR^b)_2$. Rn is the same as before.

In one embodiment, preferably, each $R^x$ independently represents (1) a hydrogen atom; (2) an alkyl group optionally having a substituent group selected from a halogen atom, an aryl group, an aryl-oxy group, an alkyl-oxy group, and a halogen-substituted aryl group; or (3) an aryl group optionally having a substituent group selected from a halogen atom, an aryl group, an alkenyl group, an alkyl group, an aryl-oxy group, an alkyl-oxy group, a halogen-substituted aryl group, and a halogen-substituted alkyl group. In one embodiment, more preferably, each $R^x$ independently represents a hydrogen atom, an aryl group, an alkyl group, a halogen-substituted aryl group, or a halogen-substituted alkyl group. In one embodiment, still more preferably, each $R^x$ independently represents a hydrogen atom, an aryl group, an alkyl group, a fluorine-substituted aryl group, or a fluorine-substituted alkyl group. In one embodiment, especially preferably, each $R^x$ independently represents a hydrogen atom, a methyl group, or a trifluoromethyl group.

Each of the ring $X^2$ independently represents an aromatic ring optionally having a substituent group, or a non-aromatic ring optionally having a substituent group.

The non-aromatic ring means any ring other than an aromatic ring. The non-aromatic ring may be a non-aromatic carbon ring having a carbon atom as the ring constituent atom, or a non-aromatic heterocyclic ring having a heteroatom such as an oxygen atom, a nitrogen atom, and a sulfur atom in addition to the carbon atom as the ring constituent atom, but in one embodiment, a non-aromatic carbon ring is preferable. The non-aromatic ring may be a saturated ring or an unsaturated non-aromatic ring, but in one embodiment, a saturated ring is preferable. In one embodiment, the non-aromatic ring is preferably a 3- to 15-membered non-aromatic ring.

Illustrative examples of the non-aromatic carbon ring include (a1) a monocyclic non-aromatic carbon ring, (a2) a bridged carbon ring consisting of two or more rings that share two or more atoms, and (a3) a complex condensed carbon ring of an aromatic ring with a non-aromatic ring in which one or more aromatic carbon rings are condensed with one or more monocyclic non-aromatic carbon rings and/or with the bridging carbon rings.

The monocyclic non-aromatic carbon ring is a monocyclic non-aromatic ring having a carbon atom as the ring constituent atom and may have a carbon-carbon double bond; herein, a monocyclic non-aromatic carbon ring having 3 to 15 carbon atoms is preferable, while a monocyclic non-aromatic carbon ring having 3 to 8 carbon atoms is more preferable. Illustrative examples thereof include cycloalkane rings (monocyclic non-aromatic saturated carbon rings) such as a cyclobutane ring, a cyclopentane ring, a cyclohexane ring, a cycloheptane ring, a cyclooctane ring, a cyclononane ring, a cyclodecane ring, a cycloundecane ring, and a cyclododecane ring; and cycloalkene rings (monocyclic non-aromatic unsaturated carbon rings) such as a cyclobutene ring, a cyclopentene ring, a cyclohexene ring, a cycloheptene ring, a cyclooctene ring, a cyclononene ring, a cyclodecene ring, a cycloundecene ring, a cyclododecene ring, a cyclopentadiene ring, a 1,3-cyclohexadiene ring, and a 1,4-cyclohexadiene ring.

The bridged carbon ring is a bridged ring having a carbon atom as the ring constituent atom and optionally having a carbon-carbon double bond; herein, the bridged carbon ring having 8 to 15 carbon atoms is preferable. Illustrative examples thereof include: bicyclic saturated, bridged carbon rings such as a bicyclo[2.2.1]heptane ring (norbornane ring), a bicyclo[4.4.0]decane ring (decalin ring), a bicyclo[5.3.0]decane ring, a bicyclo[4.3.0]nonane ring (hydrindane ring), a bicyclo[3.2.1]octane ring, a bicyclo[5.4.0]undecane ring, a bicyclo[3.3.0]octane ring, and a bicyclo[3.3.1]nonane; tricyclic saturated, bridged carbon rings such as a tricyclo[5.2.1.$0^{2,6}$]decane ring (tetrahydrodicyclopentadiene ring), a tricyclo[3.3.1.$1^{3,7}$]decane ring (adamantane ring), and a tricyclo[6.2.1.$0^{2,7}$]undecane ring; tetracyclic saturated, bridged carbon rings such as a tetracyclo[6.2.1.$1^{3,6}$.$0^{2,7}$]dodecane ring; and pentacyclic saturated, bridged carbon rings such as a pentacyclo[6.5.1.$1^{3,6}$.$0^{2,7}$.$0^{9,13}$]pentadecane ring (tetrahydrotricyclopentadiene ring); bicyclic unsaturated, bridged carbon rings such as a bicyclo[2.2.1]hept-2-ene ring (norbornene ring), a bicyclo[2.2.1]hepta-2,5-diene ring (norbornadiene ring), a bicyclo[2.2.2]oct-5-ene ring, and a bicyclo[4.4.0]dec-2-ene ring; and tricyclic unsaturated, bridged carbon rings such as a tricyclo[5.2.1.$0^{2,6}$]deca-3,8-diene ring (dicyclopentadiene ring).

The complex condensed carbon ring of an aromatic ring and a non-aromatic ring is a complex condensed ring having a carbon atom as the ring constituent atom; herein, the complex condensed carbon ring of an aromatic ring and a non-aromatic ring having 8 to 15 carbon atoms is preferable. Illustrative examples thereof include; bicyclic complex condensed carbon rings such as an indane ring, an indene ring, a tetralin ring, a 1,2-dihydronaphthalene ring, and a 1,4-dihydronaphthalene ring; tricyclic complex condensed carbon rings such as a fluorene ring, a 9,10-dihydroanthracene ring, and a 9,10-dihydrophenanthrene ring; tetracyclic complex condensed carbon rings such as a 2,3-benzofluorene ring; and pentacyclic complex condensed carbon rings such as a 2,3,6,7-dibenzofluorene ring.

Illustrative examples of the non-aromatic heterocyclic ring include (b1) a monocyclic non-aromatic heterocyclic ring, (b2) a bridged heterocyclic ring consisting of two or more rings that share two or more atoms, and (b3) a complex condensed heterocyclic ring of an aromatic ring with a non-aromatic ring in which one or more monocyclic aromatic rings (monocyclic aromatic carbon ring and/or monocyclic non-aromatic heterocyclic ring) and/or a bridged ring (bridged carbon ring and/or bridged heterocyclic ring) is/are condensed with one or more aromatic rings (aromatic carbon ring and/or aromatic heterocyclic ring).

The monocyclic non-aromatic heterocyclic ring is a monocyclic non-aromatic ring having, in addition to a carbon atom, a heteroatom such as an oxygen atom, a nitrogen atom, or a sulfur atom as the ring constituent atom, and may have a carbon-carbon double bond and/or a nitrogen-carbon double bond, in which a monocyclic non-aromatic heterocyclic ring of 3 to 15 members is preferable, while a monocyclic non-aromatic heterocyclic ring of 3 to 8 members is more preferable. Herein, illustrative examples of the monocyclic non-aromatic heterocyclic ring include: monocyclic non-aromatic saturated heterocyclic rings such as a pyrrolidine ring, a pyrazolidine ring, an imidazolidine ring, a tetrahydrofuran ring, a piperidine ring, a piperazine ring, a tetrahydropyran ring, a 1,3-dioxane ring, a 1,4-dioxane ring, a thiane ring, a 1,3-dithiane ring, a 1,4-dithiane ring, a morpholine ring, a thiomorpholine ring, and an oxazolidine ring; and monocyclic non-aromatic unsaturated heterocyclic rings such as a 2-pyrroline ring, a 3-pyrroline ring, a 2-pyrazoline ring, and a 2-imidazoline ring.

The bridged heterocyclic ring is a bridged ring having, in addition to a carbon atom, a heteroatom such as an oxygen atom, a nitrogen atom, or a sulfur atom, as the ring constituent atom, and may have a carbon-carbon double bond and/or a nitrogen-carbon double bond, in which a bridged heterocyclic ring of 8 to 15 members is preferable. Illustrative examples of the bridged heterocyclic ring include: bicyclic saturated, bridged heterocyclic rings such as a 7-oxabicyclo[4.1.0]heptane ring (1,2-epoxycyclohexane ring), a 1-azabicyclo[2.2.2]octane ring (quinuclidine ring), a decahydroquinoline ring, and a decahydroisoquinoline ring; and tricyclic saturated, bridged heterocyclic rings such as a 1-azatricyclo[3.3.1.$1^{1,7}$]decane ring (1-azaadamantane ring) and a 2-azatricyclo[3.3.1.$1^{3,7}$]decane ring (2-azaadamantane ring).

The complex condensed heterocyclic ring of an aromatic ring with a non-aromatic ring is a complex condensed ring having, in addition to a carbon atom, a heteroatom such as an oxygen atom, a nitrogen atom, or a sulfur atom as the ring constituent atoms, in which 8- to 15-membered complex condensed heterocyclic rings of an aromatic ring with a non-aromatic ring are preferable. Illustrative examples thereof include: bicyclic complex condensed heterocyclic rings such as a 2,3-dihydrobenzofuran ring, a 1,3-dihydroisobenzofuran ring, a 2H-chromene ring, a 4H-chromene ring, a 1H-isochromene ring, a 3H-isochromene ring, an indoline ring, an isoindoline ring, a 2,3-dihydrobenzothiophene ring, a 1,2-dihydroquinoline ring, a 3,4-dihydroquinoline ring, a 1,2,3,4-tetrahydroquinoline ring, and a benzoxazine ring; and tricyclic complex condensed heterocyclic rings such as a 1,2,3,4-tetrahydrocarbazole ring and a 1,2,3,4-dibenzofuran ring.

In one embodiment, among the non-aromatic rings, more preferable are the monocyclic non-aromatic carbon ring, the bridged carbon ring, the complex condensed carbon ring of an aromatic ring with a non-aromatic ring, the monocyclic non-aromatic heterocyclic ring, the bridged heterocyclic ring, and the complex condensed heterocyclic ring of an aromatic ring with a non-aromatic ring; still more preferable are the monocyclic non-aromatic carbon ring, the bridged carbon ring, and the complex condensed carbon ring of an aromatic ring with a non-aromatic ring are more preferable; especially preferable are the monocyclic non-aromatic carbon ring and the bridged carbon ring.

There is no particular restriction in the substituent group in the "aromatic ring optionally having a substituent group" in the ring $X^2$, but illustrative examples thereof may include the group selected from a halogen atom, an amino group, a mercapto group, a nitro group, a cyano group, —R, —OR, —SR, —$SO_2$R, —NHR, —$NR_2$, —COR, —CO—OR, —CO—NHR, —CO—$NR_2$, —NH—COR, —NR—COR, and —$N(COR)_2$. There is no particular restriction in the substituent group in the "non-aromatic ring optionally having a substituent group" in the ring $X^2$, but illustrative examples thereof may include the group selected from a halogen atom, a hydroxy group, an amino group, a mercapto group, a nitro group, a cyano group, —R, —OR, —SR, —$SO_2$R, —NHR, —$NR_2$, —COR, —CO—OR, —CO—NHR, —CO—$NR_2$, —O—COR, —NH—COR, —NR—COR, —$N(COR)_2$, and ═O. R represents the same as before.

In one embodiment, each of the ring $X^2$ independently represents preferably an aromatic carbon ring optionally having a substituent group, or a non-aromatic carbon ring optionally having a substituent group.

In one embodiment, more preferably, each of the ring $X^2$ independently represents (1) an aromatic carbon ring optionally having a substituent group selected from (a) a halogen atom; (b) an alkyl group optionally having a substituent group selected from a halogen atom and an aryl group; (c) an alkyl-oxy group optionally having a substituent group selected from a halogen atom and an aryl group; (d) an alkenyl group optionally having a substituent group selected from a halogen atom and an aryl group; (e) an aryl group optionally having a substituent group selected from a halogen atom, an aryl group, an alkenyl group, and an alkyl group; and (f) an aryl-oxy group optionally having a substituent group selected from a halogen atom, an aryl group, an alkenyl group, and an alkyl group, or (2) a non-aromatic carbon ring optionally having a substituent group selected from (a) a halogen atom; (b) an alkyl group optionally having a substituent group selected from a halogen atom and an aryl group; (c) an alkyl-oxy group optionally having a substituent group selected from a halogen atom and an aryl group; (d) an alkenyl group optionally having a substituent group selected from a halogen atom and an aryl group; (e) an aryl group optionally having a substituent group selected from a halogen atom, an aryl group, an alkenyl group, and an alkyl group (f) an aryl-oxy group optionally having a substituent group selected from a halogen atom, an aryl group, an alkenyl group, and an alkyl group; and (g) an oxo group (=O).

In one embodiment, more preferably, each of the ring $X^2$ independently represents (1) an aromatic carbon ring optionally having a substituent group selected from a halogen atom, an aryl group, an alkyl group, a halogen-substituted aryl group, and a halogen-substituted alkyl group, or (2) a non-aromatic carbon ring optionally having a substituent group selected from a halogen atom, an aryl group, an alkyl group, a halogen-substituted aryl group, a halogen-substituted alkyl groups, and an oxo group.

In one embodiment, far still more preferably, each of the ring $X^2$ independently represents (1) an aromatic carbon ring optionally having a substituent group selected from a fluorine atom, an aryl group, an alkyl group, a fluorine-substituted aryl group, and a fluorine-substituted alkyl group, or (2) a non-aromatic carbon ring optionally having a substituent group selected from a fluorine atom, an aryl group, an alkyl group, a fluorine-substituted aryl group, a fluorine-substituted alkyl groups, and an oxo group.

In one embodiment, especially preferably, each of the ring $X^2$ independently represents (1) an aromatic carbon ring optionally having a substituent group selected from a fluorine atom, an alkyl group, and a fluorine-substituted alkyl group, or (2) a non-aromatic carbon ring optionally having a substituent group selected from a fluorine atom, an alkyl group, and a fluorine-substituted alkyl group.

Each b independently represents an integer of 0 to 3, and in one embodiment, preferably an integer of 0 to 2, while more preferably 0 or 1.

Each $R^1$ independently represents a substituent group.

There is no particular restriction in the substituent group in $R^1$, but illustrative examples thereof may include the substituent group selected from a halogen atom, an amino group, a mercapto group, a nitro group, a cyano group, —R, —OR, —SR, —$SO_2$R, —NHR, —$NR_2$, —COR, —CO—OR, —CO—NHR, —CO—$NR_2$, —NH—COR, —NR—COR, and —$N(COR)_2$. R represents the same as before.

In one embodiment, preferably, each $R^1$ independently represents (a) a halogen atom; (b) an alkyl group optionally having a substituent group selected from a halogen atom and an aryl group; (c) an alkyl-oxy group optionally having a substituent group selected from a halogen atom and an aryl group; (d) an alkenyl group optionally having a substituent group selected from a halogen atom and an aryl group; (e) an aryl group optionally having a substituent group selected from a halogen atom, an aryl group, an alkenyl group, and an alkyl group; or (f) an aryl-oxy group optionally having a substituent group selected from a halogen atom, an aryl group, an alkenyl group, and an alkyl group. In one embodiment, more preferably, each $R^1$ independently represents a halogen atom, an aryl group, an alkyl group, an aryl-oxy group, an alkyl-oxy group, a halogen-substituted aryl group, or a halogen-substituted alkyl group. In one embodiment, still more preferably, each $R^1$ independently represents a fluorine atom, an aryl group, an alkyl group, an aryl-oxy group, an alkyl-oxy group, a fluorine-substituted aryl group, or a fluorine-substituted alkyl group. In one embodiment, especially preferably, each $R^1$ independently represents a fluorine atom, an aryl group, an alkyl group, a fluorine substituted aryl group, or a fluorine substituted alkyl group.

Each c independently represents an integer of 0, or 1 or more, and in one embodiment, preferably 0, 1, or 2, more preferably 0 or 1, while especially preferably 0.

Each $R^2$ independently represents a halogen atom, an aryl group, an alkyl group, an aryl-oxy group, an alkyl-oxy group, a halogen-substituted aryl group, or a halogen-substituted alkyl group. In one embodiment, each $R^2$ independently represents preferably a fluorine atom, an aryl group, an alkyl group, an aryl-oxy group, an alkyl-oxy group, a fluorine-substituted aryl group, or a fluorine-substituted alkyl group, while more preferably a fluorine atom, an aryl group, an alkyl group, a fluorine-substituted aryl group, or a fluorine-substituted alkyl group.

In one embodiment, it is preferable that the structure represented by the formula (1) (including the structures represented by the formulae (1'), (1"-1), and (1"-2)) contain a fluorine atom. For example, in the case of the structure represented by the formula (1), this fluorine atom can be included in the divalent organic group represented by X and/or in the substituent groups in the aromatic rings represented by the ring $A^1$ and the ring $A^2$, and in the case of the structure represented by the formula (1'), the fluorine atom can be included in the substituent group in the alkyl group or the aryl group represented by $R^x$, in the substituent groups in the aromatic rings represented by the ring $A^1$, the ring $A^2$, and the ring $X^2$, and/or in the substituent groups in the non-aromatic ring represented by the ring $X^2$. In one embodiment, the structure represented by the formula (1) preferably includes 3 or more fluorine atoms, more preferably 4 or more fluorine atoms, while still more preferably 5 or more fluorine atoms in the one structural unit.

Hereinafter, the structure represented by the formula (2) will be described.

The ring B represents an aromatic ring substituted with one or more fluorine atoms. The “aromatic ring substituted with one or more fluorine atoms” in the ring B indicates that at least one hydrogen atom on the aromatic carbon atoms that constitute the aromatic ring is substituted with a fluorine atom.

In one embodiment, the ring B is preferably the aromatic carbon ring substituted with one or more fluorine atoms. In one embodiment, the ring B is more preferably a benzene ring substituted with one or more fluorine atoms, or a naphthalene ring substituted with one or more fluorine atoms.

From a viewpoint of more eminently obtaining the intended effects of the present invention, the substitution number of the fluorine atom in the aromatic ring of the ring B is preferably 2 or more, more preferably 3 or more, still more preferably 4 or more, while far still more preferably 5 or more.

From a viewpoint of more eminently obtaining the intended effects of the present invention, in the aromatic ring of the ring B, it is preferable that at least one hydrogen atom on the aromatic carbon atom in the ortho position to the bonding site with the oxygen atom that constitutes the ester structure (the aromatic carbon atom adjacent to the aromatic carbon atom to which the oxygen atom is bonded) be substituted with a fluorine atom; it is more preferable that 2 hydrogen atoms are substituted with fluorine atoms.

In one embodiment, the structure represented by the formula (2):

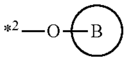
(2)

wherein all the symbols are the same as those described before, is preferably the structures represented by the formulae (2'-1) to (2'-3):

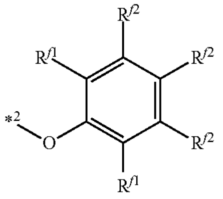
(2'-1)

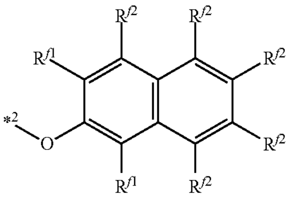
(2'-2)

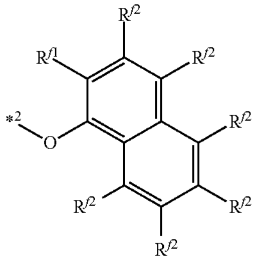
(2'-3)

wherein $R^{f1}$ and $R^{f2}$ each independently represent a hydrogen atom or a fluorine atom, and at least one of $R^{f1}$ and $R^{f2}$ is a fluorine atom; and other symbols are the same as those described before. There is no particular restriction in the structure thereof; but, specifically illustrative examples thereof may include the formulae (2"-1) to (2"-19):

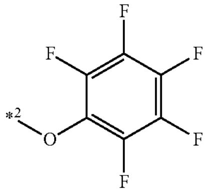
(2"-1)

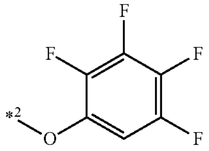
(2"-2)

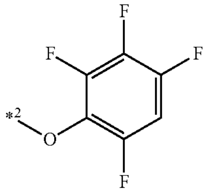
(2"-3)

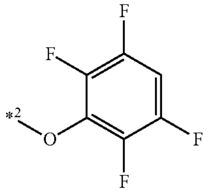
(2"-4)

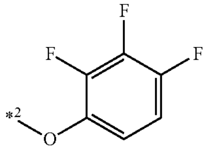
(2"-5)

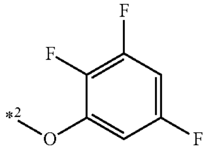
(2"-6)

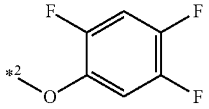
(2"-7)

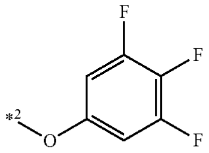
(2"-8)

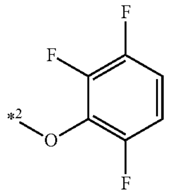
(2"-9)

-continued (2″-10)

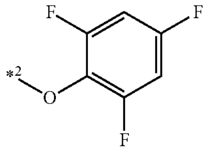

(2″-11)

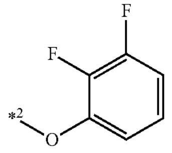

(2″-12)

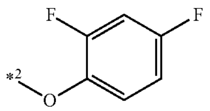

(2″-13)

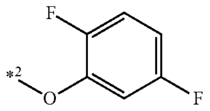

(2″-14)

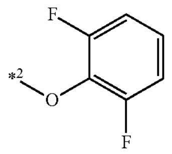

(2″-15)

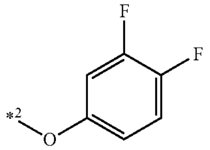

(2″-16)

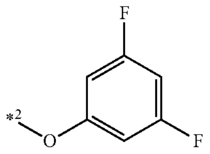

(2″-17)

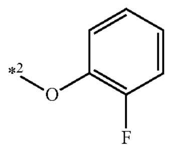

(2″-18)

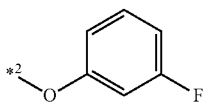

(2″-19)

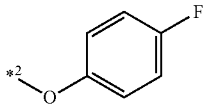

wherein all the symbols are the same as those described before. In one embodiment, among these, the structures represented by the formulae (2"-1) to (2"-4) are especially preferable.

$R^{f1}$ and $R^{f2}$ each independently represent a hydrogen atom or a fluorine atom, and at least one of $R^{f1}$ and $R^{f2}$ is a fluorine atom.

With regard to $R^{f1}$ and $R^{f2}$, from a viewpoint of enhancing the curing reaction rate of an epoxy resin, in one embodiment, preferably, of $R^{f1}$ and $R^{f2}$ at least two are fluorine atoms, more preferably, of $R^{f1}$ and $R^{f2}$ at least three are fluorine atoms, while still more preferably, of $R^{f1}$ and $R^{f2}$ at least four are fluorine atoms.

With regard to $R^{f1}$ and $R^{f2}$, from a viewpoint of enhancing the curing reaction rate of an epoxy resin, in one embodiment, it is preferable that when the number of $R^{f1}$ is two, one of $R^{f1}$ is a fluorine atom and the other $R^{f1}$ and $R^{f2}$ are a hydrogen atom or a fluorine atom, and when the number of $R^{f1}$ is one, $R^{f1}$ is a fluorine atom, and $R^{f2}$ is a hydrogen atom or a fluorine atom. More preferably, $R^{f1}$ is a fluorine atom and $R^{f2}$ is a hydrogen atom or a fluorine atom. Still more preferably, $R^{f1}$ is a fluorine atom and $R^{f2}$ is a hydrogen atom or a fluorine atom, and at least one of $R^{f2}$ is a fluorine atom. Especially preferably, $R^{f1}$ and $R^{f2}$ are fluorine atoms.

Hereinafter, the structure represented by the formula (3) will be described.

Y represents a divalent organic group. In one embodiment, the divalent organic group in Y is preferably a divalent organic group composed of one or more (for example, 1 to 3000, 1 to 1000, 1 to 100, or 1 to 50) skeleton atoms selected from a carbon atom, an oxygen atom, a nitrogen atom, and a sulfur atom. In one embodiment, the divalent organic group in Y may have a halogen atom, in addition to or in place of a hydrogen atom, as the non-skeleton atom. The divalent organic group in Y includes a linear structure, a branched-chain structure and/or a cyclic structure. The divalent organic group in Y may be a divalent organic group not containing an aromatic ring or a divalent organic group containing an aromatic ring.

In one embodiment, preferably, Y represents a divalent hydrocarbon group optionally having a substituent group.

The divalent hydrocarbon group is a divalent hydrocarbon group having one or more carbon atoms (e.g., 1 to 50, 1 to 20, 1 to 10) only as the skeleton atoms. The divalent hydrocarbon group includes a linear structure, a branched-chain structure and/or a cyclic structure. The divalent hydrocarbon group may be any of a hydrocarbon group not containing an aromatic ring and a hydrocarbon group containing an aromatic ring.

Illustrative examples of the divalent hydrocarbon group include: (1) an alkylene group optionally having an aryl group as the substituent group; (2) an alkenylene group optionally having an aryl group as the substituent group; (3) an arylene group optionally having a substituent group selected from an aryl group, an alkyl group, and an alkenyl group; (4) a (an alkylene optionally having an aryl group as the substituent group)-(an arylene optionally having a substituent group selected from an aryl group, an alkyl group, and an alkenyl group) group; (5) a (an arylene optionally having a substituent group selected from an aryl group, an alkyl group, and an alkenyl group)-(an arylene optionally having a substituent group selected from an aryl group, an alkyl group, and an alkenyl group) group; (6) a (an arylene optionally having a substituent group selected from an aryl group, an alkyl group, and an alkenyl group)-(an alkylene optionally having an aryl group as the substituent group)-(an arylene optionally having a substituent group selected from an aryl group, an alkyl group, and an alkenyl group) group; and (7) a (an alkylene optionally having an aryl group as the substituent group)-(an arylene optionally having a substituent group selected from an aryl group, an alkyl group, and an alkenyl group)-(an alkylene optionally having an aryl group as the substituent group) group. In one embodiment, preferable are an alkylene group, an alkenylene group, an arylene group, an alkylene-arylene group, an arylene-arylene group, an arylene-alkylene-arylene group, and an alkylene-arylene-alkylene group; more preferable are an arylene group, an arylene-arylene group, and an arylene-alkylene-arylene group; still more preferable is an arylene group.

The alkylene (group) means a linear, a branched-chain and/or a cyclic divalent saturated hydrocarbon group. The alkylene (group) is preferably an alkylene (group) having 1 to 14 carbon atoms, more preferably 1 to 10 carbon atoms, while still more preferably 1 to 6 carbon atoms, unless otherwise specifically noted. Illustrative examples of the alkylene (group) include: straight-chain alkylene groups such as a methylene group, an ethylene group, a trimethylene group, a tetramethylene group, a pentamethylene group, a hexamethylene group, a heptamethylene group, an octamethylene group, a nonamethylene group, and a decamethylene group; branched-chain alkylene groups such as an ethylidene group, a propylidene group, an isopropylidene group, an ethylmethylmethylene group, and a diethylmethylene group; and cyclic alkylene groups such as a 1,4-cyclohexylene group, a 1,3-cyclohexylene group, a 1,2-cyclohexylene group, a 1,3-cyclopentylene group, and a 1,2-cyclopentylene group.

The alkenylene (group) means a linear, branched-chain and/or cyclic divalent aliphatic unsaturated hydrocarbon group having at least one carbon-carbon double bond. The alkenylene (group) is preferably an alkenylene (group) having 2 to 14 carbon atoms, more preferably 2 to 10 carbon atoms, while more preferably 2 to 6 carbon atoms, unless otherwise specifically noted. Illustrative examples of the alkenylene (group) include $—CH_2═CH_2—$, $—C(═CH_2)—$, $—CH═CH—CH_2—$, $—CH_2—CH═CH—$, $—CH═CH—CH_2—CH_2—$, $—CH_2—CH═CH—CH_2—$, and $—CH_2—CH_2—CH═CH—$.

The arylene (group) means a divalent aromatic hydrocarbon group. The arylene (group) is an arylene (group) having preferably 6 to 14 carbon atoms, while more preferably 6 to 10 carbon atoms, unless otherwise specifically noted. Illustrative examples of the arylene (group) include a 1,2-phenylene group, a 1,3-phenylene group, a 1,4-phenylene group, a 1,2-naphthylene group, a 1,3-naphthylene group, a 1,4-naphthylene group, a 1,6-naphthylene group, a 1,7-naphthylene group, a 1,8-naphthylene group, a 2,6-naphthylene group, and 2,7-naphthylene group.

There is no particular restriction in the substituent group in "the divalent hydrocarbon group optionally having a substituent group" in Y, but illustrative examples thereof may include the group selected from a halogen atom, a hydroxy group, an amino group, a mercapto group, a nitro group, a cyano group, —OR, —SR, $—SO_2R$, —NHR, $—NR_2$, —COR, —CO—OR, —CO—NHR, $—CO—NR_2$, —O—COR, —NH—COR, —NR—COR, and $—N(COR)_2$. R represents the same as before.

In one embodiment, the structure represented by the formula (3):

(3)

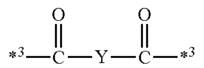

wherein all the symbols are the same as those described before, is preferably the structure represented by the formula (3'):

(3')

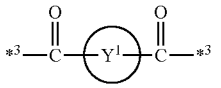

wherein all the symbols are the same as those described before. More preferable is the structure represented by the formula (3"-1) or (3"-2):

(3"-1)

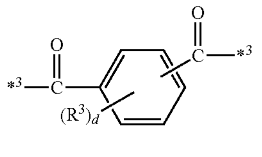

(3"-2)

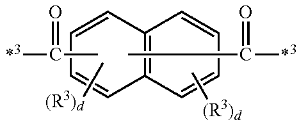

wherein each $R^3$ independently represents a substituent group; each d independently represents an integer of 0, or 1 or more; and other symbols are the same as those described before. There is no restriction in the structure thereof; but specifically, illustrative examples thereof may include the structures represented by the formulae (3'''-1) to (3'''-12):

(3'''-1)

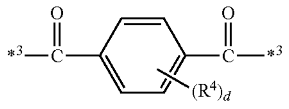

(3'''-2)

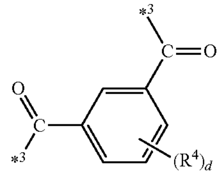

(3'''-3)

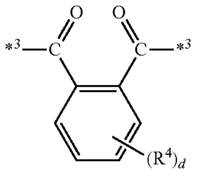

(3'''-4)

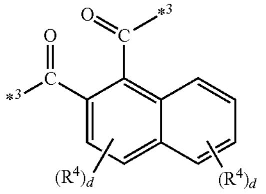

-continued (3'''-5)

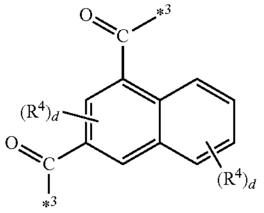

(3'''-6)

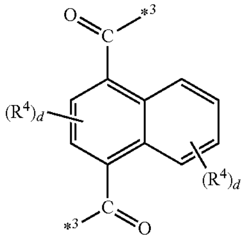

(3'''-7)

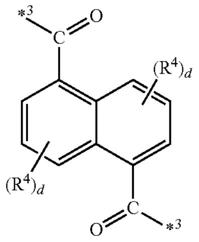

(3'''-8)

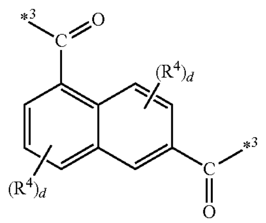

(3'''-9)

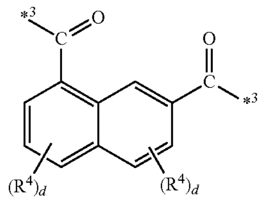

(3'''-10)

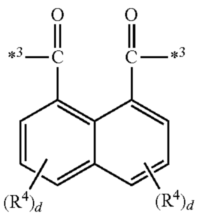

(3'''-11)

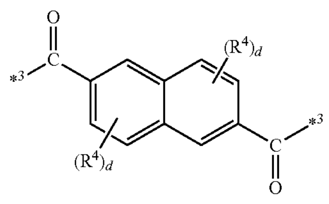

-continued (3'''-12)

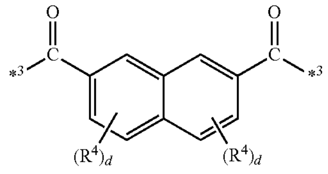

wherein each $R^4$ independently represents a halogen atom, an aryl group, an alkyl group, an aryl-oxy group, an alkyl-oxy group, a halogen-substituted aryl group, or a halogen-substituted alkyl group; and other symbols are the same as those described before. The d unit may be the same or different in each structural unit.

Each of the ring $Y^1$ independently represents an aromatic carbon ring optionally having a substituent group.

The aromatic carbon ring is the aromatic ring having a carbon atom as the ring constituent atom. In one embodiment, the aromatic carbon ring is preferably a 6- to 14-membered aromatic carbon ring, while more preferably a 6- to 10-membered aromatic carbon ring. Specifically, suitable examples of the aromatic carbon ring include a benzene ring, a naphthalene ring, and an anthracene ring. Herein, a benzene ring or a naphthalene ring are preferable, while a benzene ring is especially preferable.

There is no particular restriction in the substituent group in the "aromatic ring optionally having a substituent group" in the ring $Y^1$, but illustrative examples thereof may include the group selected from a halogen atom, a hydroxy group, an amino group, a mercapto group, a nitro group, a cyano group, —R, —OR, —SR, —$SO_2$R, —NHR, —$NR_2$, —COR, —CO—OR, —CO—NHR, —CO—$NR_2$, —O—COR, —NH—COR, —NR—COR, and —N$(COR)_2$. R represents the same as before.

Each of $R^3$ independently represents a substituent group.

There is no particular restriction in the substituent group in $R^3$, but illustrative examples thereof may include the substituent group selected from a halogen atom, an amino group, a mercapto group, a nitro group, a cyano group, —R, —OR, —SR, —$SO_2$R, —NHR, —$NR_2$, —COR, —CO—OR, —CO—NHR, —CO—$NR_2$, —NH—COR, —NR—COR, and —N$(COR)_2$. R represents the same as before.

In one embodiment, preferably, each $R^3$ independently represents (a) a halogen atom; (b) an alkyl group optionally having a substituent group selected from a halogen atom and an aryl group; (c) an alkyl-oxy group optionally having a substituent group selected from a halogen atom and an aryl group; (d) an alkenyl group optionally having a substituent group selected from a halogen atom and an aryl group; (e) an aryl group optionally having a substituent group selected from a halogen atom, an aryl group, an alkenyl group, and an alkyl group; or (f) an aryl-oxy group optionally having a substituent group selected from a halogen atom, an aryl group, an alkenyl group, and an alkyl group. In one embodiment, more preferably, each $R^3$ independently represents a halogen atom, an aryl group, an alkyl group, an aryl-oxy group, an alkyl-oxy group, a halogen-substituted aryl group, or a halogen-substituted alkyl group. In one embodiment, still more preferably, each $R^3$ independently represents a fluorine atom, an aryl group, an alkyl group, an aryl-oxy group, an alkyl-oxy group, a fluorine-substituted aryl group, or a fluorine-substituted alkyl group. In one embodiment, especially preferably, each $R^3$ independently represents a fluorine atom, an aryl group, an alkyl group, a fluorine substituted aryl group, or a fluorine substituted alkyl group.

In one embodiment, each d independently represents an integer of 0, or 1 or more, preferably 0, 1, or 2, more preferably 0 or 1, while especially preferably 0.

Each $R^4$ independently represents a halogen atom, an aryl group, an alkyl group, an aryl-oxy group, an alkyl-oxy group, a halogen-substituted aryl group, or a halogen-substituted alkyl group. In one embodiment, each $R^4$ independently represents preferably a fluorine atom, an aryl group, an alkyl group, an aryl-oxy group, an alkyl-oxy group, a fluorine-substituted aryl group, or a fluorine-substituted alkyl group, while more preferably a fluorine atom, an aryl group, an alkyl group, a fluorine-substituted aryl group, or a fluorine-substituted alkyl group.

In one embodiment, the ester compound (A) is preferably the compound represented by the formula (A1):

(A1)

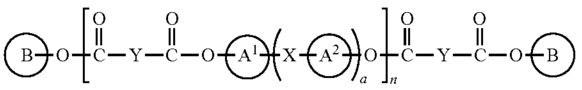

wherein the ring $A^1$ and the ring $A^2$ each independently represent an aromatic ring optionally having a substituent group; each of the ring B independently represents an aromatic ring substituted with one or more fluorine atoms; each X independently represents a single bond or a divalent organic group; each Y independently represents a divalent organic group; each a independently represents 0 or 1; n represents an integer of 1 or more. More preferable is the compound represented by the formula (A2):

(A2)

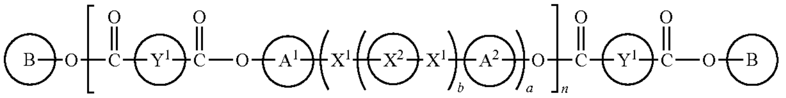

wherein the ring $A^1$ and the ring $A^2$ each independently represent an aromatic ring optionally having a substituent group; each of the ring B independently represents an aromatic ring substituted with one or more fluorine atoms; each $X^1$ independently represents a single bond, $—C(R^x)_2—$, —O—, —CO—, —S—, —SO—, $—SO_2—$, —CONH—, or —NHCO; each $R^x$ independently represents a hydrogen atom, an alkyl group optionally having a substituent group, or an aryl group optionally having a substituent group; each of the ring $X^2$ independently represents an aromatic ring optionally having a substituent group, or a non-aromatic ring optionally having a substituent group; each of the ring $Y^1$ independently represents an aromatic carbon ring optionally having a substituent group; each a independently represents 0 or 1; each b independently represents an integer of 0 to 3; and n represents an integer of 1 or more. In the formula (A1) and the formula (A2), the a unit may be the same or different in each structural unit. The b unit may be the same or different in each structural unit. The n unit may be the same or different in each structural unit.

Herein, n represents an integer of 1 or more. In one embodiment, n is preferably an integer of 1 to 100, more preferably an integer of 1 to 20, still more preferably an integer of 1 to 10 (1, 2, 3, 4, 5, 6, 7, 8, 9, or 10), far still more preferably 1, 2, 3, 4, or 5, while especially preferably 1, 2, or 3. When the value of n increases, the crosslinking density increases upon curing the epoxy resin, resulting in improvement of the curing property. When the value of n decreases, the solvent solubility increases and the viscosity decreases, resulting in improvement of workability and processability.

In one embodiment, the structure represented by the formula (1) in the formula (A1) is preferably the structure represented by the formula (1'), more preferably the structures represented by any of the formula (1"-1) and the formula (1"-2), while still more preferably the structures represented by any of the formulae (1'"-1) to (1'"-38). Specifically, there is no restriction in it, but illustrative example thereof may include the structures represented by the formulae (1""-1) to (1""-87).

In one embodiment, the structure represented by the formula (2) in the formulae (A1) and (A2) is preferably the structures represented by the formulae (2'-1) to (2'-3). Specifically, there is no restriction in it, but illustrative example thereof may include the structures represented by the formulae (2"-1) to (2"-19). In one embodiment, among these, the structures represented by the formulae (2"-1) to (2"-4) are especially preferable.

In one embodiment, the structure represented by the formula (3) in the formula (A1) is preferably the structure represented by the formula (3'), while more preferably the structures represented by any of the formula (3"-1) and the formula (3"-2). Specifically, there is no restriction in it, but illustrative examples thereof may include the structures represented by the formulae (3'"-1) to (3'"-12).

In one embodiment, the structure represented by the formula (1') in the formula (A2) is preferably the structures represented by any of the formula (1"-1) and the formula (1"-2), while more preferably the structures represented by any of the formulae (1'"-1) to (1'"-38). Specifically, there is no restriction in it, but illustrative examples thereof may include the structures represented by the formulae (1""-1) to (1""-87).

In one embodiment, the structure represented by the formula (3') in the formula (A2) is preferably the structures represented by any of the formula (3"-1) and the formula (3"-2). Specifically, there is no restriction in it, but illustrative examples thereof may include the structures represented by the formulae (3'"-1) to (3'"-12).

From a viewpoint of more eminently obtaining the intended effects of the present invention, the content of the fluorine atom in the ester compound (A) is preferably 5% or more by mass, more preferably 10% or more by mass, still more preferably 15% or more by mass, far still more preferably 20% or more by mass, while especially preferably 25% or more by mass, or 28% or more by mass. There is no particular restriction in the upper limit thereof, but this may be made 60% or less by mass. The content of the fluorine atom can be controlled as appropriate within the intended range by a person ordinarily skilled in the art by changing the type of the raw materials in the production method to be described later.

There is no particular restriction in the molecular weight of the ester compound (A), but this may be preferably 100000 or less, more preferably 50000 or less, still more preferably 20000 or less, while far still more preferably 10000 or less. There is no particular restriction in the lower limit of the molecular weight of the ester compound (A), but this may be 400 or more, 600 or more, or 800 or more. The weight-average molecular weight can be measured with gel permeation chromatography (GPC) method in terms of the standard polystyrene.

There is no particular restriction in the ester equivalent based on the total of the ester structure formed by the structure represented by the formula (1) and the structure represented by the formula (3), and the ester structure formed by the structure represented by the formula (2) and the structure represented by the formula (3) (hereinafter this equivalent is sometimes referred to as "ester group equivalent"), but this may be preferably 700 g/eq. or less, more preferably 500 g/eq. or less, still more preferably 450 g/eq. or less, far still more preferably 400 g/eq. or less, while especially preferably 350 g/eq. or less. There is no particular restriction in the lower limit of the ester group equivalent of the ester compound (A); so, for example, this may be 150 g/eq. or more, 180 g/eq. or more, or 200 g/eq. or more.

Hereinafter, the production method of the ester compounds (A) will be described.

The present invention provides a method for producing an ester compound (A); herein, the method includes causing a reaction (i.e., esterification reaction) of a mixture containing a compound represented by the formula (B1):

(B1)

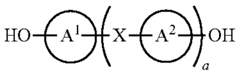

wherein all the symbols are same as those described before (hereinafter this compound is sometimes referred to as "hydroxy compound (B1)"), a compound represented by the formula (C1):

(C1)

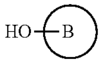

wherein all the symbols are same as those described before (hereinafter this compound is sometimes referred to as "hydroxy compound (C1)"), and a compound represented by the formula (D1-1) or (D1-2):

(D1-1)

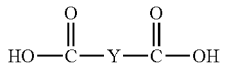

(D1-2)

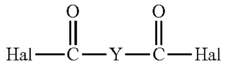

wherein Hal represents a halogen atom (preferably a chlorine atom, a bromine atom, or an iodine atom); other symbols are the same as those described before, or the salt thereof (hereinafter, these are sometimes collectively referred to as "carboxylic acid compound (D1)).

In the method for producing the ester compound (A), in one embodiment, the carboxylic acid compound (D1), as the carboxylic acid compound component, is caused to react, molecule by molecule, with the hydroxy compound (B1), or with both the hydroxy compound (B1) and the hydroxy compound (C1), as the hydroxy compound component, thereby condensing and esterifying to obtain the ester compound (A1) according to the present invention. In one embodiment, in addition to the hydroxy compound (B1), the hydroxy compound (C1), and the carboxylic acid compound (D1), other hydroxy compound component as the hydroxy compound component and other carboxylic acid compound component as the carboxylic acid compound component may be mixed to simultaneously cause the esterification reaction.

In one embodiment, preferably, the production method of the ester compound (A) is to produce the compound represented by the formula (A1), in which the method includes causing a reaction (i.e., esterification reaction) of the hydroxy compound (B1) and the hydroxy compound (C1) with a carboxylic acid compound (D1):

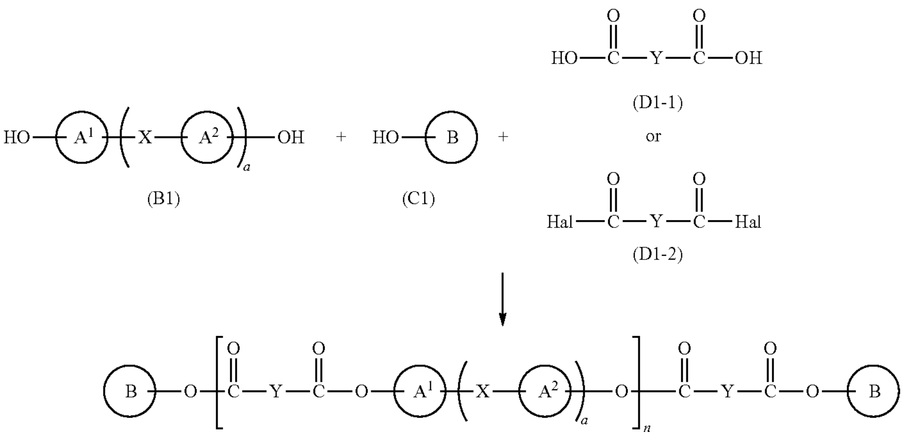

(B1) (C1) (D1-1) or (D1-2)

(A1)

wherein all the symbols are the same as those described before.

In one embodiment, more preferably, the production method of the ester compound (A) is to produce the compound represented by the formula (A2), in which the method includes causing a reaction (i.e., esterification reaction) of the compound represented by the formula (B2) and the hydroxy compound (C1), as the hydroxy compound (B1), with the compound represented by any of the formula (D2-1) or (D2-2):

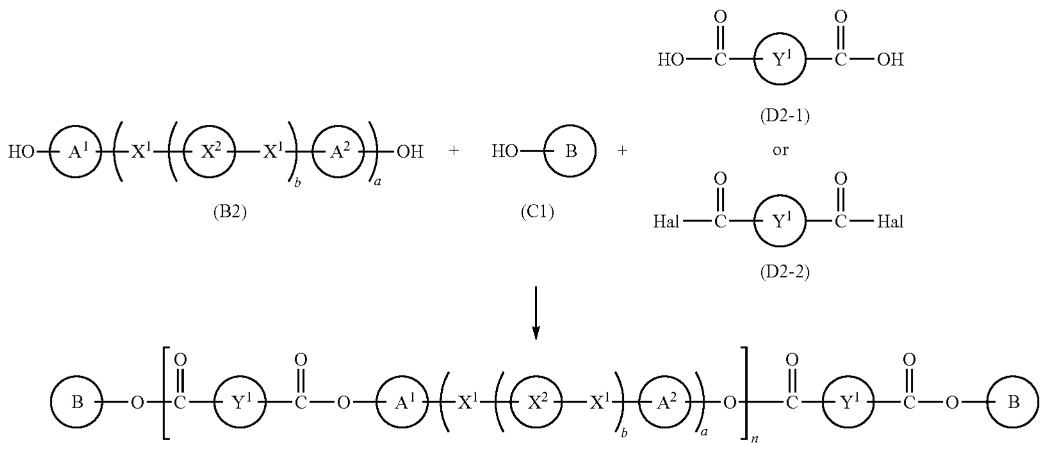

(B2) (C1) (D2-1) or (D2-2)

(A2)

wherein all the symbols are the same as those described before, or a salt thereof as the carboxylic acid compound (D1) (hereinafter, these are sometimes collectively referred to as "carboxylic acid compound (D2)").

Illustrative examples of the salt include alkali metal salts such as a cesium salt, a potassium salt, and a sodium salt.

In one embodiment, the carboxylic acid compound (D1) is preferably the compound represented by the formula (D1-2). In one embodiment, the carboxylic acid compound (D2) is preferably the compound represented by the formula (D2-2).

In the esterification reaction in the production method of the ester compound (A), a base may be used in a preferred embodiment. Illustrative examples of the base include: alkali metal hydroxides such as sodium hydroxide and potassium hydroxide; and tertiary amines such as triethylamine, pyridine, and N,N-dimethyl-4-aminopyridine (DMAP). These bases may be used as-is or after having been diluted to a solution. The bases may be used singly or as an arbitrary combination of two or more of these bases.

In one embodiment, when the alkali metal hydroxide is used as the base, there is an advantage that a reactivity is improved thereby reducing residual starting materials. In one embodiment, when the tertiary amine is used as the base, there is an advantage that the ester bond formed under an anhydrous condition is less susceptible to hydrolysis, resulting in enhancement of the yield.

In one embodiment, the amount of the base to be used may be preferably 80 to 300 moles, while more preferably, in view of the residual raw materials, removal of the base and so on, 100 to 150 moles, relative to 100 moles of the carboxy group (—COOH) or the carboxylic acid halide group (—COHal) in the carboxylic acid compound (D1).

In the esterification reaction in the production method of the ester compound (A), in one embodiment, a condensing agent may be used as needed. Illustrative examples of the condensing agent include carbodiimide condensing agents such as 1,3-dicyclohexylcarbodiimide, 1-cyclohexyl-3-morpholinoethylcarbodiimide, 1-cyclohexyl-3-(4-diethylaminocyclohexyl)carbodiimide, 1,3-diethylcarbodiimide, 1,3-diisopropylcarbodiimide, 1-ethyl-3-(3-dimethylaminopropyl) carbodiimide, and the salts thereof. The amount of the condensing agent to be used may be, for example, 50 to 100 moles relative to 100 moles of the carboxy group (—COOH) or the carboxylic acid halide group (—COHal) in the carboxylic acid compound (D1). In the esterification reaction in the production method of the ester compound (A), in one embodiment, in addition to the condensing agent, a condensation accelerator may be added as needed. Illustrative examples of the condensation accelerator include 1-hydroxybenzotriazole (HOBt), N-hydroxysuccinimide (HOSu), 1-hydroxy-7-azabenzotriazole (HOAt), and hydroxy-3,4-dihydro-4-oxo-1,2,3-benzotriazine (HOOBt). The amount of the condensation accelerator to be used may be, for example, 50 to 100 moles relative to 100 moles of the carboxy group (—COOH) or the carboxylic acid halide group (—COHal) in the carboxylic acid compound (D1).

With regard to the mixing ratio of the hydroxy compound (B1), the hydroxy compound (C1), and the carboxylic acid compound (D1) in the reaction system of the esterification reaction in the production method of the ester compound (A), an appropriate ratio may be selected in accordance with the physical properties of the intended product, the physical properties of the cured product of the epoxy resin, and the like. When designing the cured product of the epoxy resin with emphasis on dielectric properties and moisture resistance, it is preferable that the unreacted carboxylic acid halide or the unreacted aromatic hydroxy group does not remain in the synthetic reaction. Therefore, the mixing ratio of the mole number (d) of the carboxylic acid compound (D1) to the mole number (b) of the hydroxy compound (B1) and the mole number (c) of the hydroxy compound (C1) is preferably a ratio of 2 (d):(2(b)+(c))=90:100 to 100:90, while more preferably a ratio as 2(d):(2(b)+(c))=95:100 to 100:95. Furthermore, the mixing ratio (mole ratio) of the hydroxy compound (B1), the hydroxy compound (C1), and the carboxylic acid compound (D1) is preferably in the range of (b):(d):(c)=0.5:1.5:2.0 (corresponding to n=0.5) to 5.0:6.0:2.0 (corresponding to n=5), while more preferably, in the range of (b):(d):(c)=1.0:2.0:2.0 (corresponding to n=1) to 2.5:3.5:2 (corresponding to n=2.5).

In one embodiment, the esterification reaction in the production method of the ester compound (A) may be carried out in a solventless system not using a solvent, or may be carried out in an organic solvent system using an organic solvent. Illustrative examples of the organic solvent for the esterification reaction include: ketone solvents such as acetone, methyl ethyl ketone, methyl isobutyl ketone, and cyclohexanone; acetate ester solvents such as ethyl acetate, butyl acetate, cellosolve acetate, propyleneglycol monomethyl ether acetate, and carbitol acetate; carbitol solvents such as cellosolve and butyl carbitol; aromatic hydrocarbon solvents such as toluene and xylene; and amide solvents such as N,N-dimethylformamide and N,N-dimethylacetamide, N-methyl-2-pyrrolidone. Among these, in view of purification efficiency after the reaction, hydrophobic solvents such as ketone solvents (e.g., methyl isobutyl ketone) and aromatic hydrocarbon solvents (e.g., toluene) are preferable. The organic solvents may be used singly or as an arbitrary combination of two or more of these.

There is no particular restriction in the reaction temperature of the esterification reaction in the production method of the ester compounds (A), but in one embodiment, the reaction temperature may be preferably in the range of 0 to 70° C.

There is no particular restriction in the reaction time of the esterification reaction in the production method of the ester compound (A), but in one embodiment, the reaction time may be preferably in the range of 30 minutes to 8 hours.

In one embodiment, the esterification reaction in the production method of the ester compound (A) may also be carried out by the method in which by adding a base dropwise into the mixture (in the organic solvent system or in the solventless system) of the hydroxy compound (B1), the hydroxy compound (C1), and a carboxylic acid (D1) with stirring, followed by further stirring after completion of the dropwise addition. In this case, there is no particular restriction in the dropwise addition time, but the time may be preferably in the range of 10 minutes to 3 hours. The stirring time after the dropwise addition is preferably in the range of 30 minutes to 5 hours.

In the production method of the ester compound (A), the ester compound (A) may be purified after the esterification reaction. After the esterification reaction, a purification process such as water washing or microfiltration may be carried out to remove a byproduct salt and excess amounts of the starting materials from the system. For example, in one embodiment, after completion of the esterification reaction, water is added in the amount necessary to dissolve the byproduct salt, and the aqueous phase is discarded after statically separating the phases of the resulting solution. Further, an acid is added as needed to neutralize the solution, and then, the washing with water is repeated. The ester compound (A) can be obtained by dehydration using a chemical or by azeotrope, then purification by removing impurities by microfiltration, and if necessary, distilling out the organic solvent. Without completely removing the organic solvent, the resulting solution may also be used as-is as the solvent for a resin composition.

In the esterification reaction in the production method of the ester compound (A), in one embodiment, a plurality of the ester compounds can be simultaneously produced, so that the product, as a mixture, including one, or two or more ester compounds (A), and arbitrarily, one, or two or more ester compounds other than the ester compounds (A) may be occasionally obtained. Ester compounds other than the ester compound (A) may include compounds that do not contain the structure represented by the formula (1) (for example, n=0 in the formula (A1)), reaction intermediate compounds (for example, a hydroxy group or a carboxy group at one end), and compounds derived from impurities in the raw materials. The product obtained in the esterification reaction may be used as-is as an epoxy resin curing agent, or may be used after removing unnecessary compounds as appropriate.

The ester compound (A) may be used as an epoxy resin curing agent. When the ester compound (A) is used as the epoxy resin curing agent, a cured product having excellent dielectric properties can be obtained. In addition, the ester compound (A) may be used as the epoxy resin curing agent to obtain a cured product that is excellent in a curing property, a heat resistance, a moisture resistance (hydrolysis resistance), and the like. When using a sheet-like laminate material or a semiconductor encapsulating material obtained by using the ester compounds (A), it is possible to provide a printed circuit board having a transmission loss in the high frequency range reduced and a semiconductor device including a fan-out semiconductor device.

Hereinafter, the resin composition according to the present invention will be described.

The present invention provides a resin composition containing the ester compound (A) and an epoxy resin.

There is no restriction in the epoxy resin to be used in the resin composition according to the present invention as long as this is a compound including one or more (preferably two or more) epoxy groups in one molecule thereof.

Illustrative examples of the epoxy resin include a bisphenol A epoxy resin, a bisphenol F epoxy resin, a bisphenol S epoxy resin, a bisphenol AF epoxy resin, a phenol novolac epoxy resin, a tert-butyl-catechol epoxy resin, a naphthol epoxy resin, a naphthalene epoxy resin, a naphthylene ether epoxy resin, a glycidylamine epoxy resin, a glycidyl ester epoxy resin, a cresol novolac epoxy resin, a biphenyl epoxy resin, a phenol aralkyl epoxy resin, a biphenyl aralkyl epoxy resin, a fluorene-skeleton epoxy resin, a dicyclopentadiene epoxy resin, an anthracene epoxy resin, a linear aliphatic epoxy resin, an epoxy resin having a butadiene structure, an alicyclic epoxy resin, a heterocyclic epoxy resin, an epoxy resin having a spiro ring, a cyclohexane dimethanol epoxy resin, a trimethylol epoxy resin, a halogenated epoxy resin. Among these, in view of further improvement in a dielectric property, a moisture resistance, and a flame retardancy, especially preferable are a phenol aralkyl epoxy resin, a biphenyl aralkyl epoxy resin, a fluorene-skeleton epoxy resin, a dicyclopentadiene epoxy resin, and a bisphenol AF epoxy resin. Herein, two or more epoxy resins (Y) may be used concurrently.

In one embodiment, it is preferable that the epoxy resin include an epoxy resin containing a fluorine atom, such as a bisphenol AF epoxy resin.

It is preferable that at least 50% or more of the epoxy resin is the epoxy resin that has two or more epoxy groups in one molecule thereof, relative to 100% by mass of the nonvolatile components in the epoxy resin. In addition, in the use for an interlayer insulating film for a build-up multilayer circuit board, an embodiment including an aromatic epoxy resin that has 2 or more epoxy groups in one molecule thereof and is in a liquid state at a temperature of 20° C. (liquid epoxy resin) is preferable, while an embodiment including the liquid epoxy resin and an aromatic epoxy resin that has 3 or more epoxy groups in one molecule thereof and is in a solid state at a temperature of 20° C. (solid epoxy resin) is more preferable. When the liquid epoxy resin and the solid epoxy resin are used as the epoxy resin, in the case that the resin composition is used in the form of a resin sheet, a film that exhibits a sufficient flexibility and an excellent handling property can be obtained; and at the same time, the breaking strength of the cured product of the resin composition as well as the durability of the build-up multilayer circuit board can be improved. When the liquid epoxy resin and the solid epoxy resin are concurrently used as the epoxy resin, the blending ratio by mass (liquid:solid) is preferably in the range of 1:0.1 to 1:2. When the liquid epoxy resin is used with the amount within the range described above, in the case of using in the form of a resin sheet, a sufficient flexibility can be obtained, and a handling property can be improved, and a sufficient flowability can be obtained during lamination as well. On the other hand, when using the solid epoxy resin with the amount within the range described above, an adhesiveness of the resin composition can be decreased, and in the case of using in the form of a resin sheet, a degassing property during vacuum lamination can be improved. This also improves a peelability of a protective film or a support film during vacuum lamination, and also a heat resistance after curing may be improved.

In one embodiment, the content ratio of the fluorine atom to the total mass of the ester compound (A) and the epoxy resin is preferably 5% or more by mass, more preferably 10% or more by mass, still more preferably 15% or more by mass, far still more preferably 20% or more by mass, while especially preferably 25% or more by mass. There is no particular restriction in the upper limit thereof; for example, this may be made 60% or less by mass.

In the resin composition according to the present invention, the content of the epoxy resin relative to 100% by mass of the nonvolatile components in the resin composition is preferably in the range of 5 to 60% by mass, more preferably in the range of 10 to 50% by mass, still more preferably in the range of 20 to 40% by mass, while especially preferably in the range of 20 to 35% by mass. In one embodiment, when the content of the epoxy resin is made within this range, curability of the resin composition may be improved.

In the resin composition according to the present invention, there is no particular restriction in the content of the ester compound (A); so, this may be, relative to 100% by mass of the nonvolatile components in the resin composition, preferably 60% or less by mass, more preferably 50% or less by mass, still more preferably 40% or less by mass, while especially preferably 30% or less by mass. There is no particular restriction in the lower limit of the content of the ester compound (A); so, this can be, relative to 100% by mass of the nonvolatile components in the resin composition, 0.01% or more by mass, 0.05% or more by mass, 0.1% or more by mass, or the like. In one embodiment, when the content of the ester compound (A) is made within this range, it is possible to improve a dielectric property of a cured product, and in addition, a cured product that is excellent in a curability, a heat resistance, a moisture resistance, etc., can be provided.

The resin composition according to the present invention may further contain an inorganic filler. In one embodiment, when the resin composition according to the present invention contains an inorganic filler, a linear thermal expansion coefficient thereof and a dielectric loss tangent thereof can be decreased.

Illustrative examples of the inorganic filler include silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, and calcium zirconate. Among these, silica such as amorphous silica, pulverized silica, fused silica, crystalline silica, synthetic silica, hollow silica, and spherical silica are preferable. Especially from a viewpoint of decrease in the surface roughness of an insulating layer, fused silica and spherical silica are more preferable, while spherical fused silica is more preferable. These may be used singly or as a combination of two or more of them. Illustrative examples of the commercially available spherical fused silica include "SOC2" and "SOC1" manufactured by Admatechs Co., Ltd.

There is no particular restriction in the average particle diameter of the inorganic filler, but in view of lowering a surface roughness of the insulating layer thereby enabling to form a fine wiring, the average particle diameter is preferably 5 μm or less, more preferably 3 μm or less, still more preferably 2 μm or less, far still more preferably 1 μm or less, while especially preferably 0.8 μm or less. On the other hand, in view of preventing the viscosity of the resin composition from increasing and the handling property thereof from decreasing, the average particle diameter is preferably 0.01 μm or more, more preferably 0.03 μm or more, still more preferably 0.05 μm or more, far still more preferably 0.07 μm or more, while especially preferably 0.1 μm or more. The average particle diameter of the inorganic filler may be measured with laser diffraction scattering method based on the Mie scattering theory. Specifically, the particle diameter distribution of the inorganic filler is prepared on a volume basis by using a laser diffraction scattering particle diameter distribution measurement instrument, in which the median diameter thereof can be measured as the average particle diameter. The inorganic fillers that are dispersed in water by means of an ultrasonic wave may be suitably used as the measurement sample. Illustrative examples of the laser diffraction scattering particle diameter distribution measurement instrument include "LA-950" manufactured by Horiba Ltd.

The inorganic filler is preferably those having the moisture resistance and dispersibility thereof enhanced by surface treatment with a surface modifying agent. Illustrative examples of such surface modifying agent include an amino silane coupling agent, a ureido silane coupling agent, an epoxy silane coupling agent, a mercapto silane coupling agent, a silane coupling agent, a vinyl silane coupling agent, a styryl silane coupling agent, an acrylate silane coupling agent, an isocyanate silane coupling agent, a sulfide silane coupling agent, an organosilazane compound, and a titanate coupling agent. These may be used singly or as a combination of two or more of them.

In the resin composition according to the present invention, the content of the inorganic filler is preferably 90% or less by mass, more preferably 80% or less by mass, still more preferably 75% or less by mass, while especially preferably 70% or less by mass, relative to 100% by mass of the nonvolatile components in the resin composition, but the content varies depending on the characteristics required for the resin composition. The lower limit of the content of the inorganic filler can be, for example, 0% or more by mass, 5% or more by mass, 10% or more by mass, 20% or more by mass, or the like, preferably 30% or more by mass, more preferably 40% or more by mass, still more preferably 50% or more by mass, while especially preferably 60% or more by mass. In one embodiment, when the content of the inorganic filler is too small, the linear thermal expansion coefficient of the cured product increases, while when the content is too large, it may be difficult to form a film in making a resin sheet, or the cured product may become brittle.

The resin composition according to the present invention may further contain a thermoplastic resin. In one embodiment, when the resin composition according to the present invention contains a thermoplastic resin, this can improve the mechanical strength of a cured product thereof, and also the film forming ability at the time when this is used in the form of a resin sheet can also be improved.

Illustrative examples of the thermoplastic resin include a phenoxy resin, a polyvinyl acetal resin, a polyimide resin, a polyamide imide resin, a polyether imide resin, a polysulfone resin, a polyether sulfone resin, a polyphenylene ether resin, a polycarbonate resin, a polyether ether ketone resin, and a polyester resin. Among these, a phenoxy resin and a polyvinyl acetal resin are preferable. These thermoplastic resins may be used singly or as a combination of two or more of them. The weight-average molecular weight of the thermoplastic resin is preferably in the range of 8000 to 200000, while more preferably in the range of 12000 to 100000. The weight-average molecular weight (Mw) in the present invention may be measured with gel permeation chromatography (GPC) method (in terms of the polystyrene). Specifically, the weight-average molecular weight by the GPC method may be done as follows. Namely, measurement is conducted using LC-9A/RID-6A manufactured by Shimadzu Corp. as the measurement instrument and Shodex K-800P/K-804L/K-804L manufactured by Showa Denko K.K. as the column, and chloroform or the like as the mobile phase with a column temperature of 40° C. Then, the calculation is made using a calibration curve of standard polystyrene.

In the resin composition according to the present invention, although there is no particular restriction in the content of the thermoplastic resin, the content is preferably 10% or less by mass, while more preferably 5% or less by mass, and the lower limit thereof is, for example, 0% or more by mass, 0.001% or more by mass, 0.01% or more by mass, or the like, while preferably 0.1% or more by mass, or more preferably 0.5% or more by mass, relative to 100% by mass of the nonvolatile components in the resin composition. In one embodiment, when the content of the thermoplastic resin is in the range of 0.1 to 10% by mass, the effects to improve the film forming ability and the mechanical strength can be expressed, and also it is possible to increase the melt viscosity and to decrease the surface roughness of the insulating layer after the wet roughening process.

The resin composition according to the present invention may further contain an epoxy resin curing agent other than the ester compound (A).

Illustrative examples of the epoxy resin curing agent other than the ester compound (A) include: phenol curing agents such as TD2090 and TD2131 (manufactured by DIC Corp.), MEH-7600, MEH-7851, and MEH-8000H (manufactured by Meiwa Plastic Industries, Ltd.), NHN, CBN, GPH-65, and GPH-103 (manufactured by Nippon Kayaku Co., Ltd.), SN170, SN180, SN190, SN475, SN485, SN495, SN375, and SN395 (manufactured by Nippon Steel Chemical Co., Ltd.), LA7052, LA7054, LA3018, and LA1356 (manufactured by DIC Corp.); benzoxazine curing agents such as F-a and P-d (manufactured by Shikoku Chemical Corp.) and HFB2006M (manufactured by Showa Highpolymer Co., Ltd.); acid anhydride curing agents such as methylhexahydrophthalic anhydride, methylnadic anhydride, and hydrogenated methylnadic anhydride; cyanate ester curing agents such as PT30, PT60, and BA230S75 (manufactured by Lonza Japan, Inc.); and benzoxazine curing agents.

In the resin composition according to the present invention, although there is no particular restriction in the content of the epoxy resin curing agent other than the ester compound (A), the content is preferably 40% or less by mass, more preferably 20% or less by mass, while still more preferably 10% or less by mass, and the lower limit thereof can be 0% or more by mass, 0.01% or more by mass, 0.05% or more by mass, 0.1% or more by mass, or the like, relative to 100% by mass of the nonvolatile components in the resin composition.

The resin composition according to the present invention may further contain an epoxy resin curing accelerator. In one embodiment, when the epoxy resin curing accelerator is included in the resin composition according to the present invention, the curing time and the curing temperature can be efficiently controlled.

Illustrative examples of the epoxy resin curing accelerator include organic phosphine compounds such as TPP, TPP-K, TPP-S, and TPTP-S (manufactured by Hokko Chemical Industry Co., Ltd.); imidazole compounds such as Curezol 2MZ, 2E4MZ, C11Z, C11Z—CN, C11Z—CNS, C11Z-A, 2MZ-OK, 2MA-OK, and 2PHZ (manufactured by Shikoku Chemical Corp.); amine adduct compounds such Novacure (manufactured by Asahi Kasei Corp.) and Fujicure (manufactured by Fuji Kasei Co., Ltd.); amine compounds such as 1,8-diazabicyclo[5,4,0]undecene-7,4-dimethylaminopyridine, benzyl dimethylamine, 2,4,6-tris(dimethylaminomethyl)phenol, and 4-dimethylaminopyridine; and organometallic complexes or organometallic salts of the metals such as cobalt, copper, zinc, iron, nickel, manganese, and tin. Two or more types of the curing accelerators may be used in combination.

In the resin composition according to the present invention, although there is no particular restriction in the content of the epoxy resin curing accelerator, the content is preferably 10% or less by mass, more preferably 5% or less by mass, while still more preferably 1% or less by mass, and the lower limit thereof can be 0% or more by mass, 0.001% or more by mass, 0.01% or more by mass, 0.05% or more by mass, or the like, relative to 100% by mass of the nonvolatile components in the resin composition.

The resin composition according to the present invention may further contain a flame retardant. Illustrative examples of the flame retardant include: inorganic flame retardants including phosphorous-based flame retardants such as a phosphazene compound, a phosphate salt, a phosphate ester, a polyphosphate salt, a phosphinate salt, a phosphinate ester, a phosphonate salt, and a phosphonate ester; nitrogen-based flame retardants such as an aliphatic amine compound, an aromatic amine compound, a nitrogen-containing heterocyclic compound, and an urea compound; metal hydroxides such as magnesium hydroxide and aluminum hydroxide; antimony compounds such as antimony trioxide, antimony pentoxide, and sodium antimonate; and halogen-based flame retardants such as hexabromobenzene, a chlorinated paraffin, a brominated polycarbonate resin, a brominated epoxy resin, a brominated phenoxy resin, a brominated polyphenylene ether resin, a brominated polystyrene resin, and a brominated benzyl polyacrylate resin. Among these, phosphorous-based flame retardants are preferable. These flame retardants may be used singly or as a combination of two or more of them.

In the resin composition according to the present invention, although there is no particular restriction in the content of the flame retardant, the content is preferably 10% or less by mass, while more preferably 9% or less by mass, and the lower limit thereof can be 0% or more by mass, 0.01% or more by mass, 0.1% or more by mass, 0.5% or more by mass, 1% or more by mass, or the like, relative to 100% by mass of the nonvolatile components in the resin composition.

The resin composition according to the present invention may further contain an organic filler. The organic filler may be any organic filler that can be used in forming an insulating layer in a printed wiring board; so, illustrative examples thereof include a rubber particle, a polyamide particle, and a silicone particle, in which a rubber particle is preferable. There is no particular restriction in the rubber particle as long as this is a fine resin particle that is chemically cross-linked with a resin that exhibits a rubber elasticity and is insoluble and non-melting in an organic solvent; so, illustrative examples thereof include an acrylonitrile-butadiene rubber particle, a butadiene rubber particle, and an acrylic rubber particle. Specifically, illustrative examples of the rubber particle include XER-91 (manufactured by Japan Synthetic Rubber Co., Ltd.); Staphyloid AC3355, AC3816, AC3816N, AC3832, AC4030, AC3364, and IM101 (manufactured by Aica Kogyo Co., Ltd.); and Paraloid EXL2655 and EXL 2602 (manufactured by Kureha Corp.). The average particle diameter of the organic filler is preferably in the range of 0.005 μm to 1 μm, more preferably in the range of 0.2 μm to 0.6 μm. The average particle diameter of the organic filler can be measured using dynamic light scattering method. For example, the organic filler is uniformly dispersed in a suitable organic solvent by an ultrasonic wave or the like, and the particle size distribution of the organic filler is prepared on the mass basis by using a concentrated particle size analyzer ("FPAR-1000" manufactured by Otsuka Electronics Co., Ltd.), and then, the median diameter is measured as the average particle diameter.

In the resin composition according to the present invention, although there is no particular restriction in the content of the organic filler, the content is preferably 10% or less by mass, while more preferably 5% or less by mass, and the lower limit thereof can be 0% or more by mass, 0.1% or more by mass, 0.5% or more by mass, 1% or more by mass, 2% or more by mass, or the like, relative to 100% by mass of the nonvolatile components in the resin composition.

The resin composition according to the present invention may further contain an arbitrary additive as the non-volatile component. Illustrative examples of the additive like this include: radical-polymerizable compounds such as a maleimide radical-polymerizable compound, a vinyl phenyl radical-polymerizable compound, a (meth)acrylic radical-polymerizable compound, an allyl radical-polymerizable compound, and a polybutadiene radical-polymerizable compound; radical polymerization initiators such as a peroxide radical polymerization initiator and an azo radical polymerization initiator; thermosetting resins other than the epoxy resin, such as an epoxy acrylate resin, a urethane acrylate resin, a urethane resin, a cyanate resin, a benzoxazine resin, an unsaturated polyester resin, a melamine resin, and a silicone resin; organic metal compounds such as an organic copper compound, an organic zinc compound, and an organic cobalt compound; colorants such as a phthalocyanine blue, a phthalocyanine green, an iodine green, a diazo yellow, a crystal violet, titanium oxide, and carbon black; polymerization inhibitors such as hydroquinone, catechol, pyrogallol, and phenothiazine; leveling agents such as a silicone leveling agent and an acrylic polymer leveling agent; thickeners such as bentone and montmorillonite; antifoaming agents such as a silicone antifoaming agent, an acrylic antifoaming agent, a fluorine antifoaming agent, and a vinyl resin antifoaming agent; UV absorbers such as a benzotriazole UV absorber; adhesion enhancers such as a urea silane; adhesion assisting agents such as a triazole adhesion assisting agent, a tetrazole adhesion assisting agent, and a triazine adhesion assisting agent; antioxidants such as a hindered phenol antioxidant; fluorescent whitening agents such as a stilbene derivative; surfactants such as a fluorine surfactant and a silicone surfactant; dispersants such as a phosphate ester dispersant, a polyoxyalkylene dispersant, an acetylene dispersant, a silicone dispersant, an anionic dispersant, and a cationic dispersant; and stabilizers such as a borate stabilizer, a titanate stabilizer, an aluminate stabilizer, a zirconate stabilizer, an isocyanate stabilizer, a carboxylate stabilizer, and a carboxylic anhydride stabilizer. The other additive may be used singly or as a combination of two or more of them with an arbitrary mixing ratio. The content of the other additive may be set as appropriate by a person ordinarily skilled in the art.

In addition to the non-volatile components mentioned above, the resin composition according to the present invention may further contain an arbitrary organic solvent as a volatile component. There is no particular restriction in the organic solvent; so, as long as this can dissolve at least a part of the nonvolatile components, any known solvent may be used as appropriate. Illustrative examples of the organic solvent include: ketone solvents such as acetone, methyl ethyl ketone, methyl isobutyl ketone, and cyclohexanone; ester solvents such as methyl acetate, ethyl acetate, butyl acetate, isobutyl acetate, isoamyl acetate, methyl propionate, ethyl propionate, and γ-butyrolactone; ether solvents such as tetrahydropyran, tetrahydrofuran, 1,4-dioxane, diethyl ether, diisopropyl ether, dibutyl ether, and diphenyl ether; alcohol solvents such as methanol, ethanol, propanol, butanol, and ethyleneglycol; ether ester solvents such as 2-ethoxyethyl acetate, propyleneglycol monomethyl ether acetate, diethyleneglycol monoethyl ether acetate, ethyldiglycol acetate, γ-butyrolactone, and methyl methoxypropionate; ester alcohol solvents such as methyl lactate, ethyl lactate, and methyl 2-hydroxyisobutyrate; ether alcohol solvents such as 2-methoxypropanol, 2-methoxyethanol, 2-ethoxyethanol, propyleneglycol monomethyl ether, and diethyleneglycol monobutyl ether (butyl carbitol); amide solvents such as N,N-dimethylformamide, N,N-dimethylacetamide, and N-methyl-2-pyrrolidone; sulfoxide solvents such as dimethyl sulfoxide; nitrile solvents such as acetonitrile and propionitrile; aliphatic hydrocarbon solvents such as hexane, cyclopentane, cyclohexane, and methylcyclohexane; and aromatic hydrocarbon solvents such as benzene, toluene, xylene, ethylbenzene, and trimethylbenzene. These organic solvents may be used singly or as a combination of two or more of these solvents with an arbitrary mixing ratio. When using, the organic solvents may be used singly or as a combination of two or more of these solvents with an arbitrary mixing ratio.

There is no particular restriction in the content of the organic solvent; in one embodiment, for example, this can be 60% or less by mass, 40% or less by mass, 30% or less by mass, 20% or less by mass, 15% or less by mass, 10% or less by mass, or the like, relative to 100% by mass of the whole components in the resin composition.

The resin composition according to the present invention may be prepared by mixing the necessary components described above, and also, as needed, by kneading or mixing using kneading means such as a triple mill, a ball mill, a bead mill, or a sand mill, or by means of an agitator such as a super mixer or a planetary mixer.

The resin composition according to the present invention contains the ester compound (A). By using the resin composition as described above, a cured product having an excellent dielectric property can be obtained. By using such resin composition, a cured product that is excellent in the curing property, the heat resistance, the moisture resistance (hydrolysis resistance), and the like can be obtained.

In one embodiment, the resin composition according to the present invention can be excellent in the curing property. Accordingly, in one embodiment, for example, the gelling time that is measured by the method of Test Example 1 to be described later can be preferably 100 seconds or less, more preferably 80 seconds or less, still more preferably 70 seconds or less, while especially preferably 60 seconds or less.

In one embodiment, the cured product of the resin composition according to the present invention can be excellent in the heat resistance or in the moisture resistance (hydrolysis resistance). Accordingly, in one embodiment, for example, when measured by the method in Test Example 2 to be described later in which a voltage of 3.3 V is applied to the wiring that is connected to a DC power source under the condition of 85% RH and the temperature of 130° C. for 200 hours, the insulation resistance of the substrate for evaluation after 200 hours of the application period can be preferably $1.0\times10^5\Omega$ or more, more preferably $1.0\times10^6\Omega$ or more, still more preferably $1.0\times10^7\Omega$ or more, while especially preferably $1.0\times10^8\Omega$ or more.

In one embodiment, the cured product of the resin composition according to the present invention can be excellent in the dielectric property. Accordingly, in one embodiment, for example, when measured at 5.8 GHz and 23° C. as in Test Example 3 to be described later, the dielectric loss tangent (tan δ) of the cured product of the resin composition (cured product obtained by heating at 190° C. for 90 minutes) may be preferably 0.0200 or less, or 0.0100 or less, or 0.0090 or less, more preferably 0.0080 or less, or 0.0070 or less, still more preferably 0.0065 or less, or 0.0060 or less, while especially preferably 0.0055 or less, or 0.0050 or less.

In one embodiment, the cured product of the resin composition according to the present invention may be excellent in the heat resistance. Thus, in one embodiment, for example, when measured by the method in Test Example 4 to be described later, the glass transition temperature of the cured product of the resin composition (cured product obtained by heating at 190° C. for 90 minutes), may be preferably 120° C. or higher, more preferably 130° C. or higher, still more preferably 140° C. or higher, far still more preferably 150° C. or higher, while especially preferably 160° C. or higher.

The resin composition according to the present invention may be suitably used as the resin composition for an insulation application, especially as the resin composition to form an insulating layer. Specifically, this can be suitably used as the resin composition for forming the insulating layer to form a conductive layer (including a rewiring layer) formed on the insulating layer (resin composition for forming an insulating layer to form a conductive layer). In addition, in the printed wiring board to be described later, this can be suitably used as the resin composition for forming the insulating layer in the printed wiring board (resin composition for forming the insulating layer in the printed wiring board). The resin composition according to the present invention can also be used in a wide range of uses where the resin composition is required, including a sheet laminate material such as a resin sheet and a prepreg, a solder resist, an underfill material, a die bonding material, a semiconductor encapsulating material, a hole-filling resin, and a component-embedding resin.

Also, for example, when a semiconductor chip package is manufactured by the processes (1) through (6) below, the resin composition according to the present invention can be suitably used as the resin composition for forming a rewiring layer as an insulating layer to form a rewiring layer (resin composition for forming a rewiring formation layer) and the resin composition for encapsulating a semiconductor chip (resin composition for encapsulating a semiconductor chip). At the time when the semiconductor chip package is manufactured, a rewiring layer may be further formed on the encapsulation layer.

(1) A process of laminating a temporary fixing film on a substrate;
(2) a process for temporarily fixing a semiconductor chip on the temporary fixing film;
(3) a process of forming an encapsulation layer on the semiconductor chip;
(4) a process of peeling the substrate and the temporary fixing film from the semiconductor chip;
(5) a process of forming a rewiring formation layer as an insulating layer on the surface of the semiconductor chip from which the substrate and the temporary fixing film have been peeled off; and
(6) a process of forming a rewiring layer as a conductive layer on the rewiring formation layer.

Because the resin composition according to the present invention can impart the insulating layer with an excellent component-embedding property, this can also be suitably used when the printed wiring board is a component-embedded circuit board.

The resin composition according to the present invention may be used in the state of a varnish at the time of application, but for an industrial use, it is generally suitable to use in the form of a sheet-like laminate material containing this resin composition.

As for the sheet-like laminate material, the resin sheet and the prepreg that are described below are preferable.

In one embodiment, the resin sheet is formed of a support and a resin composition layer formed on the support, in which the resin composition layer is formed from the resin composition according to the present invention.

From the viewpoint of reducing the thickness in the printed wiring board and of providing a cured product having excellent insulation properties even when the cured product of the resin composition is a thin film, the thickness of the resin composition layer is preferably 50 μm or less, while more preferably 40 μm or less. There is no particular restriction in the lower limit of the thickness of the resin composition; in general, this can be 5 μm or more, 10 μm or more, or the like.

Illustrative examples of the support include a film formed of a plastic material, metal foil, and a releasing paper; among them, a film formed of a plastic material and metal foil are preferable.

When the film formed of a plastic material is used as the support, illustrative examples of the plastic material include: polyesters such as polyethylene terephthalate (hereinafter, sometimes this is referred to as simply “PET”) and polyethylene naphthalate (hereinafter, sometimes this is referred to as simply “PEN”); polycarbonate (hereinafter, sometimes this is referred to as simply “PC”); acrylic polymers such as polymethyl methacrylate (PMMA); cyclic polyolefins; triacetyl cellulose (TAC); polyether sulfide (PES); polyether ketone; and polyimide. Among these materials, polyethylene terephthalate and polyethylene naphthalate are preferable, while cheap polyethylene terephthalate is especially preferable.

When the metal foil is used as the support, illustrative examples of the metal foil include copper foil and aluminum foil, while copper foil is preferable. As for the copper foil, the foil formed of a copper single metal or an alloy of copper with other metal (for example, tin, chromium, silver, magnesium, nickel, zirconium, silicon, or titanium) may be used.

The support may be subjected to a mat treatment, a corona treatment, or an antistatic treatment on the surface to be bonded with the resin composition layer.

As for the support, a releasing layer-attached support having the releasing layer on the surface to be bonded with the resin composition layer may also be used. The releasing agent to be used for the releasing layer of the releasing layer-attached support is, for example, one or more releasing agents selected from the group consisting of an alkyd resin, a polyolefin resin, a urethane resin, and a silicone resin. Commercially available products may be used as the releasing layer-attached support; they are, for example, a PET film having the releasing layer mainly formed of an alkyd releasing agent. Illustrative examples thereof include: "SK-1", "AL-5", and "AL-7", which are all manufactured by Lintec Corp.; "Lumirror T60" manufactured by Toray Industries; "Purex" manufactured by Teijin Ltd.; and "Unipeel" manufactured by Unitika Ltd.

Although there is no particular restriction in the thickness of the support, this is preferably in the range of 5 μm to 75 μm, while more preferably in the range of 10 μm to 60 μm. When the releasing layer-attached support is used, total thickness of the releasing layer-attached support is preferably within the above-mentioned range.

In one embodiment, the resin sheet may further contain an arbitrary layer as needed. An example of the arbitrary resin sheet like this may be a protective film, which is similar to the support, that is formed on the surface of the resin composition layer not bonded to the support (namely, on the surface opposite to the support). There is no particular restriction in the thickness of the protective film; this is, for example, in the range of 1 μm to 40 μm. By laminating the protective film, the surface of the resin composition layer may be prevented from attachment of dirt or from formation of a scar.

The resin sheet may be produced, for example, by applying a liquid resin composition as-is or a resin varnish prepared by dissolving the resin composition in an organic solvent onto a support by using a die coater or the like, which is then followed by forming the resin composition layer by drying.

As for the organic solvent, those similar to the organic solvents that have been described as the component of the resin composition may be used. The organic solvents may be used singly or as a combination of two or more of them.

Drying may be carried out by a known method such as heating, blowing a hot air, or the like. There is no particular restriction in the drying condition; the drying is carried out so as to bring the content of the organic solvent in the resin composition layer to 10% or less by mass, while preferably 5% or less by mass. The resin composition layer may be formed, for example, by drying the resin composition containing 30 to 60% by mass of organic solvent or the resin varnish in the temperature range of 50 to 150° C. and the time range of 3 to 10 minutes, but these conditions vary depending on the boiling point of the organic solvent used in the resin composition or in the resin varnish.

The resin sheet may be rolled up so as to be stored. When the resin sheet has the protective film, the resin sheet can be used by removing the protective film.

In one embodiment, a prepreg is formed by impregnating the resin composition of the present invention into a sheet-like fiber substrate.

There is no particular restriction in the sheet-like fiber substrate to be use for a prepreg; herein, a substrate generally used for a prepreg, such as a glass cloth, an aramid non-woven fabric, a liquid crystal polymer non-woven fabric, or the like, may be used. From the viewpoint of decreasing the thickness of a printed wiring board, the thickness of the sheet-like fiber substrate is preferably 50 μm or less, more preferably 40 μm or less, still more preferably 30 μm or less, while especially preferably 20 μm or less. There is no particular restriction in the lower limit of the thickness of the sheet-like fiber substrate. Usually, the thickness is 10 μm or more.

The prepreg may be produced by a known method such as a hot-melting method or a solvent method.

The thickness of the prepreg can be made in the same range as that of the resin composition layer in the resin sheet described above.

The sheet-like laminate material according to the present invention may be preferably used to form an insulating layer of a printed wiring board (for insulating layer of a printed wiring board) and more preferably to form an interlayer insulating layer of a printed wiring board (for interlayer insulating layer of a printed wiring board).

The printed wiring board according to the present invention includes an insulating layer consisting of a cured product obtained by curing the resin composition according to the present invention.

The printed wiring board may be produced, for example, by the method including the processes (I) and (II) described below using the resin sheet described above.

(I) A process of laminating a resin sheet on an inner layer substrate in such a way that the resin composition layer of the resin sheet may be bonded to the inner layer substrate.

(II) A process of forming an insulating layer by curing (e.g., thermosetting) the resin composition layer.

The "inner layer substrate" used at the process (I) is a member that is the substrate for a printed wiring board; and illustrative examples thereof include a glass epoxy substrate, a metal substrate, a polyester substrate, a polyimide substrate, a BT resin substrate, and a thermosetting polyphenylene ether substrate. This substrate may have a conductive layer on one or both sides thereof. Herein, the conductive layer may be patterned. The inner layer substrate having the conductive layer (circuit) on one or both sides of the substrate is sometimes referred to as an "inner layer circuit board". An intermediate product to which an insulating layer and/or a conductive layer is/are to be further formed at the time when producing a printed wiring board is also included in the "inner layer substrate" that is referred to as in the present invention. In the case when the printed wiring board is a circuit board having a built-in component, an inner layer substrate having a built-in component may be used.

Lamination of the inner layer substrate with the resin sheet may be conducted, for example, by hot-pressing of the resin sheet to the inner layer substrate by pressing from the side of the support. Illustrative examples of the member for hot-pressing of the resin sheet to the inner layer substrate (hereinafter, this member is sometimes referred to as "hot-pressing member") include a heated metal plate (stainless steel (SUS) mirror plate and the like) and a heated metal roll (SUS roll). Herein, it is preferable that the hot-pressing member be not pressed directly to the resin sheet but be pressed via an elastic material such as a heat-resistant rubber in order that the resin sheet well follows the surface irregularity of the inner layer substrate.

Lamination of the inner layer substrate with the resin sheet may be conducted by vacuum lamination process. The temperature of the hot-press adhesion in the vacuum lamination is preferably in the range of 60° C. to 160° C., while more preferably in the range of 80° C. to 140° C.; and the pressure at the time of the hot-press adhesion is preferably in the range of 0.098 MPa to 1.77 MPa, while more preferably in the range of 0.29 MPa to 1.47 MPa; and the period at the time of the hot-press adhesion is preferably in the range of 20 seconds to 400 seconds, while more preferably in the range of 30 seconds to 300 seconds. The lamination can be carried out under a reduced pressure, preferably 26.7 hPa or less.

The lamination may be carried out by using a commercially available vacuum laminator. Illustrative examples of the commercially available vacuum laminator include a vacuum pressing laminator manufactured by Meiki Co., Ltd., and a vacuum applicator and a batch vacuum pressing laminator manufactured by Nikko-Materials Co., Ltd.

After the lamination, the laminated resin sheet may be flattened, for example, by pressing the hot-pressing member from the side of the support under a normal pressure (under an atmospheric pressure). The pressing conditions at the flattening process may be the same as the hot-press adhering condition in the before-mentioned lamination. The flattening process may be carried out by using a commercially available laminator. The lamination and the flattening processes may be carried out continuously by using the commercially available vacuum laminator described before.

The support may be removed between the process (I) and the process (II), or after the process (II).

At the process (II), the resin composition layer is cured (e.g., thermally cured) to form an insulating layer consisting of a cured product of the resin composition. There is no particular restriction in the curing condition of the resin composition layer; herein, the conditions generally used in formation of the insulating layer of a printed wiring board may be used.

The condition for thermal curing of the resin composition layer varies depending on the resin composition and so forth; for example, in one embodiment, the curing temperature is preferably 120° C. to 250° C., more preferably 150° C. to 240° C., while still more preferably 170° C. to 230° C. The curing time can be preferably 5 to 120 minutes, more preferably 10 to 100 minutes, while still more preferably 15 to 100 minutes.

Before thermally curing the resin composition layer, the resin composition layer may be preheated at the temperature lower than the curing temperature. For example, before thermally curing the resin composition layer, the resin composition layer may be preliminarily heated at 50° C. to 120° C., preferably 60° C. to 115° C., while more preferably 70° C. to 110° C., and for the period of 5 minutes or longer, preferably 5 to 150 minutes, more preferably 15 to 120 minutes, while still more preferably 15 to 100 minutes.

In production of a printed wiring board, (III) a process of drilling a hole in the insulating layer, (IV) a process of roughening the insulating layer, and (V) a process of forming a conductive layer may be further carried out. These processes (III) through (V) may be carried out by any method known to a person ordinarily skilled in the art for production of a printed wiring board. In the case where the support is removed after the process (II), the removal of the support may be carried out between the process (II) and the process (III), between the process (III) and the process (IV), or between the process (IV) and the process (V). When necessary, formation of the insulating layer and the conductive layer in processes (II) through (V) may be repeated to form a multilayered printed wiring board.

In another embodiment, the printed wiring board according to the present invention may be produced using the prepreg described above. The production method thereof is basically the same as those used in production of the resin sheet.

The process (III) is the process of drilling a hole in the insulating layer, and thereby a hole such as a via hole, a through hole, and the like may be formed in the insulating layer. The process (III) may be carried out by using, for example, a drilling method, a laser method, a plasma method, or the like, in accordance with, among other things, the composition of the resin composition that is used to form the insulating layer. The size and shape of the hole may be determined as appropriate in accordance with a design of the printed wiring board.

The process (IV) is the process of roughening the insulating layer. Usually, a smear is also removed at this process (IV). There is no particular restriction in the procedure and condition at the roughening process; for example, the procedure and condition that are usually used in formation of the insulating layer of a printed wiring board may be used. The insulating layer may be roughened by carrying out, for example, a swelling treatment using a swelling liquid, a roughening treatment using an oxidant, and a neutralizing treatment using a neutralizing solution in this order.

There is no particular restriction in the swelling liquid to be used at the roughening process; herein, examples thereof include an alkali solution and a surfactant solution, in which an alkali solution is preferable, and further, a sodium hydroxide solution and a potassium hydroxide solution are more preferable as the alkali solution. Illustrative examples of the swelling liquid that is commercially available include "Swelling Dip Securiganth P" and "Swelling Dip Securiganth SBU", which are both manufactured by Atotech Japan Co., Ltd. There is no particular restriction in the swelling treatment with the swelling liquid; for example, this may be carried out by immersing the insulating layer into the swelling liquid at 30° C. to 90° C. for the period of 1 to 20 minutes. From the viewpoint to suppress swelling of the resin in the insulating layer to a suitable level, it is preferable that the insulating layer is immersed into the swelling liquid at 40° C. to 80° C. for the period of 5 to 15 minutes.

There is no particular restriction in the oxidant to be used in the roughening treatment; herein, illustrative examples thereof include an alkaline permanganate solution having potassium permanganate or sodium permanganate dissolved into an aqueous sodium hydroxide solution. The roughening treatment using the oxidant such as the alkaline permanganate solution may be carried out preferably by immersing the insulating layer into the oxidant solution heated at 60° C. to 100° C. for the period of 10 to 30 minutes. The concentration of the permanganate salt in the alkaline permanganate solution is preferably 5 to 10% by mass. Illustrative examples of the oxidant that is commercially available include alkaline permanganate solutions such as "Concentrate Compact CP" and "Dosing Solution Securiganth P", which are both manufactured by Atotech Japan, Co., Ltd.

Illustrative examples of the commercially available neutralizing solution to be used for the roughening treatment include "Reduction Solution Securiganth P", which is manufactured by Atotech Japan Co., Ltd.

The treatment with the neutralizing solution may be carried out by immersing the surface, which has been treated with the roughening treatment using the oxidant, into the neutralizing solution at 30° C. to 80° C. for the period of 5 to 30 minutes. From the viewpoint of workability and the like, it is preferable to immerse the subject, which has been treated with the roughening process using the oxidant, in the neutralizing solution at 40° C. to 70° C. for the period of 5 to 20 minutes.

In one embodiment, there is no particular restriction in the arithmetic average roughness (Ra) of the surface of the insulating layer after the roughening treatment; herein, the roughness is preferably 500 nm or less, more preferably 400 nm or less, while still more preferably 300 nm or less. There is no particular restriction in the lower limit thereof; for example, this can be 1 nm or more, or 2 nm or more. The root mean square surface roughness (Rq) of the surface of the insulating layer after the roughening treatment is preferably 500 nm or less, more preferably 400 nm or less, while still more preferably 300 nm or less. There is no particular restriction in the lower limit thereof; for example, this can be 1 nm or more, or 2 nm or more. The arithmetic surface roughness (Ra) and the root mean square surface roughness (Rq) may be measured by using a non-contact surface roughness meter.

The process (V) is the process of forming a conductive layer, at which process a conductive layer is formed on the insulating layer. There is no particular restriction in the conductive material to be used in the conductive layer. In a preferred embodiment, the conductive layer includes one or more metals selected from the group consisting of gold, platinum, palladium, silver, copper, aluminum, cobalt, chromium, zinc, nickel, titanium, tungsten, iron, tin, and indium. The conductive layer may be a single metal layer or an alloy layer. The alloy layer is, for example, a layer formed from an alloy of two or more metals selected from the group described above (e.g., a nickel-chromium alloy, a copper-nickel alloy, and a copper-titanium alloy). Among these, in view of general applicability in formation of the conductive layer, cost, easiness in patterning, and the like, preferably usable are single metal layers of chromium, nickel, titanium, aluminum, zinc, gold, palladium, silver, or copper, as well as alloy layers of a nickel-chromium alloy, a copper-nickel alloy, or a copper-titanium alloy; more preferable are single metal layers of chromium, nickel, titanium, aluminum, zinc, gold, palladium, silver, or copper, as well as alloy layers of a nickel-chromium alloy; still more preferable is a single metal layer of copper.

The conductive layer may be any of a monolayer structure and a multilayer structure in which two or more of the monolayers formed of the single metal layer formed of different metals or alloys, or of the alloy layers are laminated. When the conductive layer has the multilayer structure, the layer in contact with the insulating layer is preferably a single metal layer of chromium, zinc, or titanium, or an alloy layer of a nickel-chromium alloy.

The thickness of the conductive layer is generally in the range of 3 μm to 35 μm, while preferably in the range of 5 μm to 30 μm, but this varies depending on the intended design of the printed wiring board.

In one embodiment, the conductive layer may be formed by plating. For example, the conductive layer having an intended wiring pattern may be formed by plating on the surface of the insulating layer using a conventionally known technique such as semi-additive process and full-additive process. From the viewpoint of simplicity in production thereof, it is preferable to form the conductive layer by semi-additive process. Hereinafter, an example of forming the conductive layer by semi-additive process will be described.

First, a plating seed layer is formed on the surface of the insulating layer by an electroless plating. Next, on the formed plating seed layer a mask pattern is formed to expose a part of the plating seed layer correspondingly to the intended wiring pattern. After forming a metal layer on the exposed plating seed layer by an electrolytic plating, the mask pattern is removed. Then, an unnecessary plated seed layer is removed by etching or the like, so that the conductive layer having the intended wiring pattern can be formed.

In another embodiment, the conductive layer may be formed using metal foil. When metal foil is used to form the conductive layer, it is preferable to carry out the process (V) between the process (I) and the process (II). For example, after the process (I), the support is removed, and then, metal foil is laminated on the surface of the exposed resin composition layer. Lamination of the resin composition layer with the metal foil may be carried out by vacuum lamination process. The conditions for lamination may be the same as those described for the process (I). Next, the process (II) is carried out to form the insulating layer. Then, by using the metal foil on the insulating layer, the conductive layer having the intended wiring pattern can be formed by a conventional known technique such as subtractive process or modified semi-additive process.

The metal foil may be produced, for example, by a known method such as electrolysis process or rolling process. Illustrative examples of the commercially available metal foil include HLP foil and JXUT-III foil manufactured by JX Nippon Mining & Metals Corp., and 3EC-III foil and TP-III foil manufactured by Mitsui Mining & Smelting Co., Ltd.

The semiconductor device according to the present invention includes the printed wiring board according to the present invention. The semiconductor device according to the present invention can be produced using the printed wiring board according to the present invention.

The semiconductor device includes various semiconductor devices that are used in electric products (for example, a computer, a cell phone, a digital camera, a television), and carriers (for example, a motor bike, an automobile, a train, a marine ship, and an airplane), and so forth.

In a suitable embodiment, the semiconductor device according to the present invention is a fan-out semiconductor device.

Other features of the invention will become apparent in the course of the following descriptions of exemplary embodiments which are given for illustration of the invention and are not intended to be limiting thereof.

EXAMPLES

In the description below, "part" and "%" that describe quantities mean "part by mass" and "% by mass", respectively, unless otherwise specifically mentioned. In the case that temperature is not specified, the temperature condition is room temperature (25° C.). In the case that pressure is not specified, the pressure condition is atmospheric pressure (1 atm).

Example A-1

Figure 2:
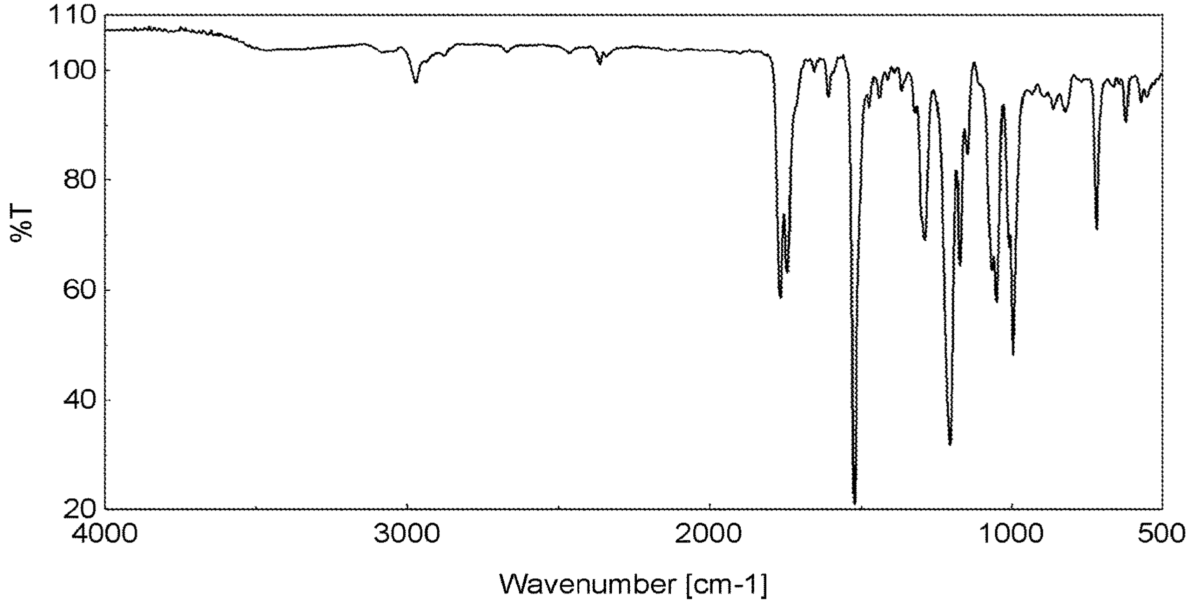
FIG. 2 illustrates the IR chart of the product (A-1) in Example A-1.

Into a flask equipped with a thermometer, a dropping funnel, a cooling tube, and a stirrer were added 228 g (1.0 mol) of 2,2-bis(4-hydroxyphenyl)propane (bisphenol A), 184 g (1.0 mol) of pentafluorophenol, 305 g (1.5 mol) of isophthaloyl chloride, and 800 g of methyl isobutyl ketone; then, they were dissolved while the system was replaced with a nitrogen gas under reduced pressure. After the temperature in the system was raised to 50° C., 404 g (4.0 mol) of triethylamine was added dropwise over 1 hour with vigorous stirring. After completion of the dropwise addition, the resulting mixture was further stirred for 1 hour. After 300 g of water was added to dissolve the byproduct salt, the phases were statically separated and the lower aqueous phase was discarded. Washing with water was repeated until pH of the water phase reached 7, and then, after dehydration, insoluble impurities were removed by microfiltration. The liquid is then dried to remove the solvent by heating to 170° C. under reduced pressure to obtain 540 g of the product (A-1). In the product (A-1), the ester group equivalent was 203 g/eq., and the fluorine atom content was 15.6% by mass. With regard to the obtained product (A-1), the gel permeation chromatography (GPC) and the infrared spectroscopy (IR) were measured based on the GPC measurement condition and the IR measurement condition described below. FIG. 1 illustrates the GPC chart of the obtained product (A-1). FIG. 2 illustrates the IR chart of the obtained product (A-1). By the mass spectrum analysis, the peak at m/z=498, corresponding to the n=0 component, the peak at m/z=856, corresponding to the n=1 component, and the peak at m/z=1214, corresponding to the n=2 component, could be recognized.

GPC Measurement Conditions

- Measurement instrument: "HPLC-8420GPC" manufactured by Tosoh Corp.
- Columns: "TSKgel SuperHZ4000" manufactured by Tosoh Corp (1 column)+"TSKgel SuperHZ3000" manufactured by Tosoh Corp. (1 column)+"TSKgel SuperHZ2000" manufactured by Tosoh Corp (2 columns)
- Detector: RI (differential refractometer)
- Column temperature: 40° C.
- Developing solvent: Tetrahydrofuran
- Flow rate: 1.0 ml/min IR Measurement Conditions

- Measurement Instrument: "FT/IR-4600" manufactured by JASCO Corp.

Example A-2

Figure 3:
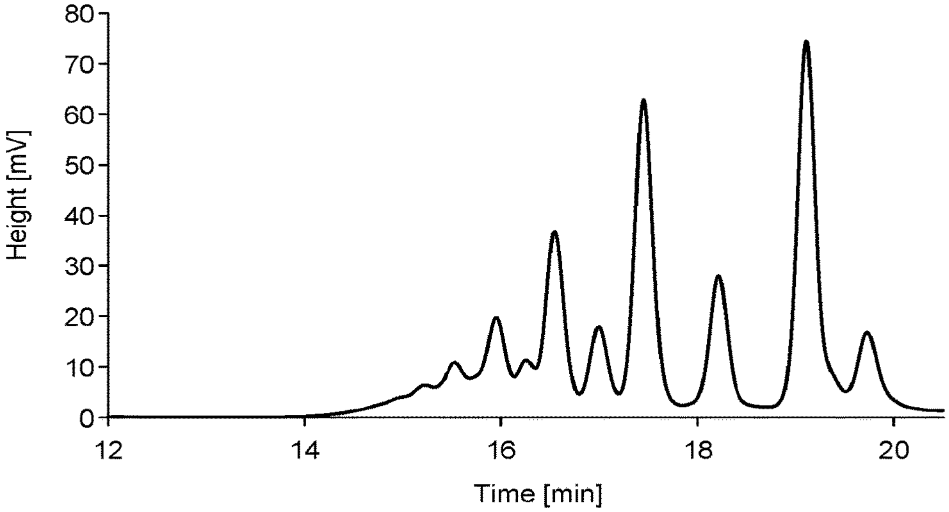
FIG. 3 illustrates the GPC chart of the product (A-2) in Example A-2.
Figure 4:
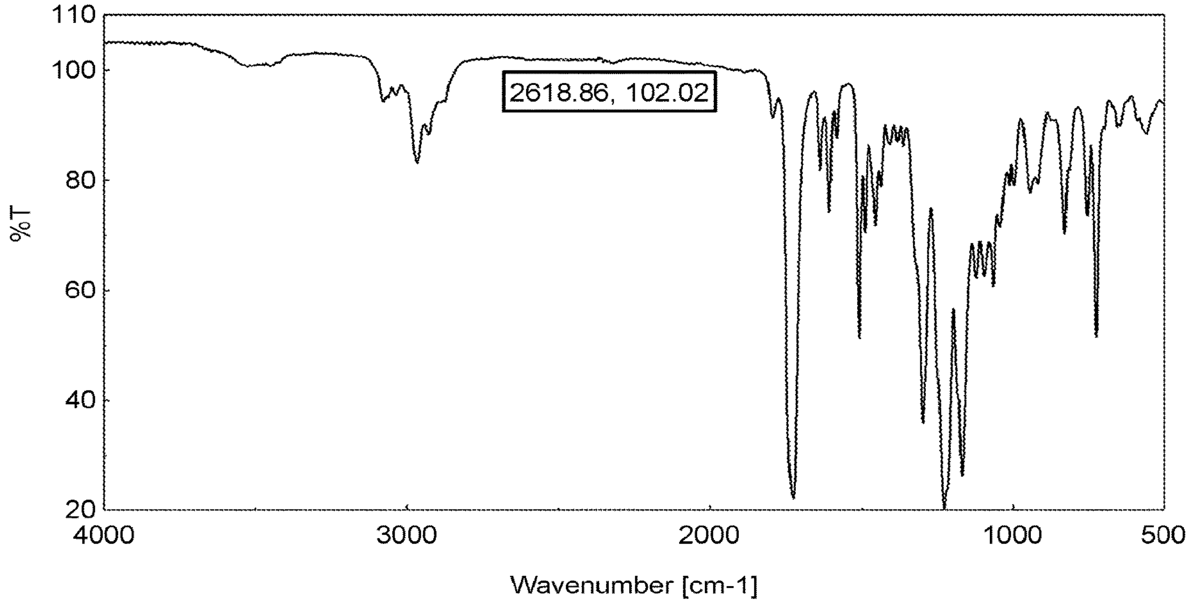
FIG. 4 illustrates the IR chart of the product (A-2) in Example A-2.

The product (A-2) (mixture of the ester compounds) (601 g) was obtained in the same manner as in Example A-1, except that 160 g (1.0 mol) of 2,7-dihydroxynaphthalene was used in place of bisphenol A. In the product (A-2), the ester group equivalent was 194 g/eq., and the fluorine atom content was 24.1% by mass. With regard to the obtained product (A-2), GPC and IR were measured with similar manners as in Example A-1. FIG. 3 illustrates the GPC chart of the obtained product (A-2). FIG. 4 illustrates the IR chart of the obtained product (A-2). By the mass spectrum analysis, the peak at m/z=498, corresponding to the n=0 component, the peak at m/z=788, corresponding to the n=1 component, and the peak at m/z=1078, corresponding to the n=2 component, could be recognized.

Example A-3

Figure 5:
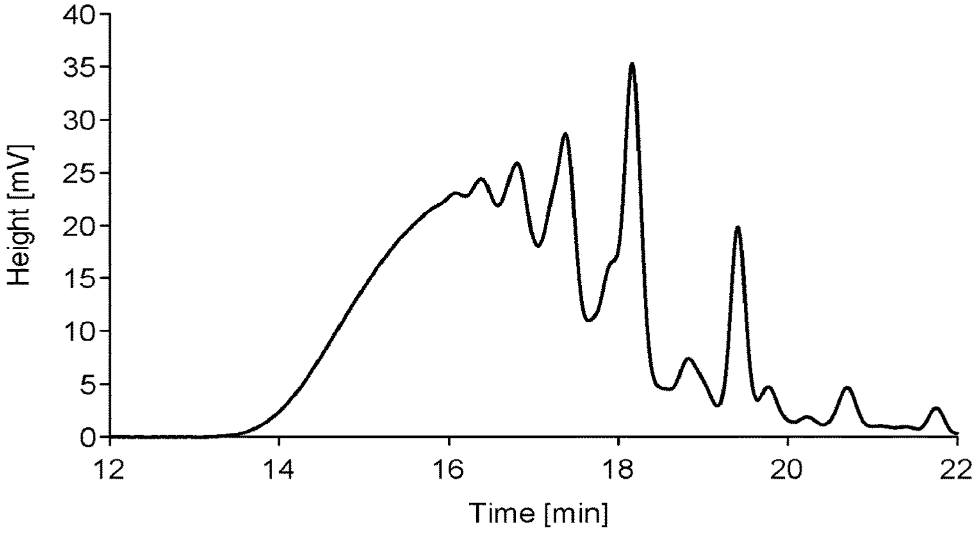
FIG. 5 illustrates the GPC chart of the product (A-3) in Example A-3.
Figure 6:
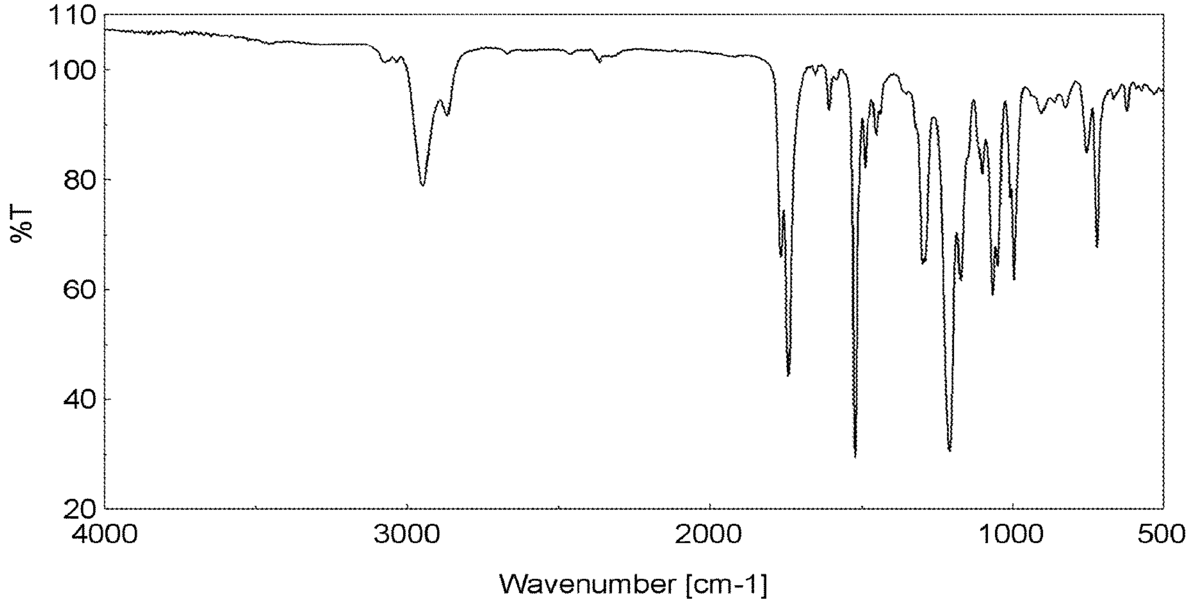
FIG. 6 illustrates the IR chart of the product (A-3) in Example A-3.

The product (A-3) (642 g) was obtained in the same manner as in Example A-1, except that in place of bisphenol A, 330 g (2.0 mol of hydroxy group) of dicyclopentadiene-phenol polyadduct (softening temperature of 85° C. and hydroxy group equivalent of 165 g/eq.) was used. In the product (A-3), the ester group equivalent was 233 g/eq., and the fluorine atom content was 13.6% by mass. With regard to the obtained product (A-3), GPC and IR were measured with similar manners as in Example A-1. FIG. 5 illustrates the GPC chart of the obtained product (A-3). FIG. 6 illustrates the IR chart of the obtained product (A-3). By the mass spectrum analysis, the peak at m/z=498, corresponding to the n=0 component, the peak at m/z=948, corresponding to the n=1 component, and the peak at m/z=1399, corresponding to the n=2 component, could be recognized.

Example A-4

Figure 7:
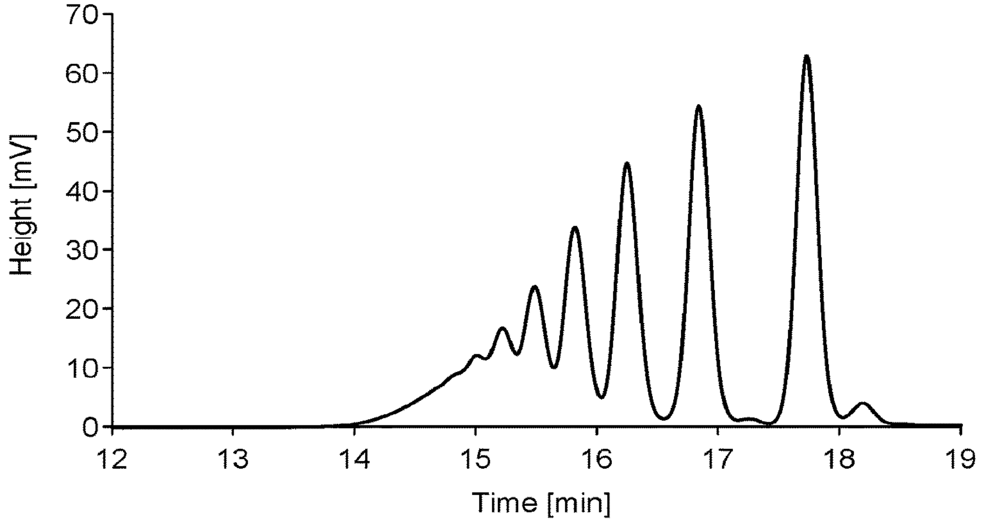
FIG. 7 illustrates the GPC chart of the product (A-4) in Example A-4.
Figure 8:
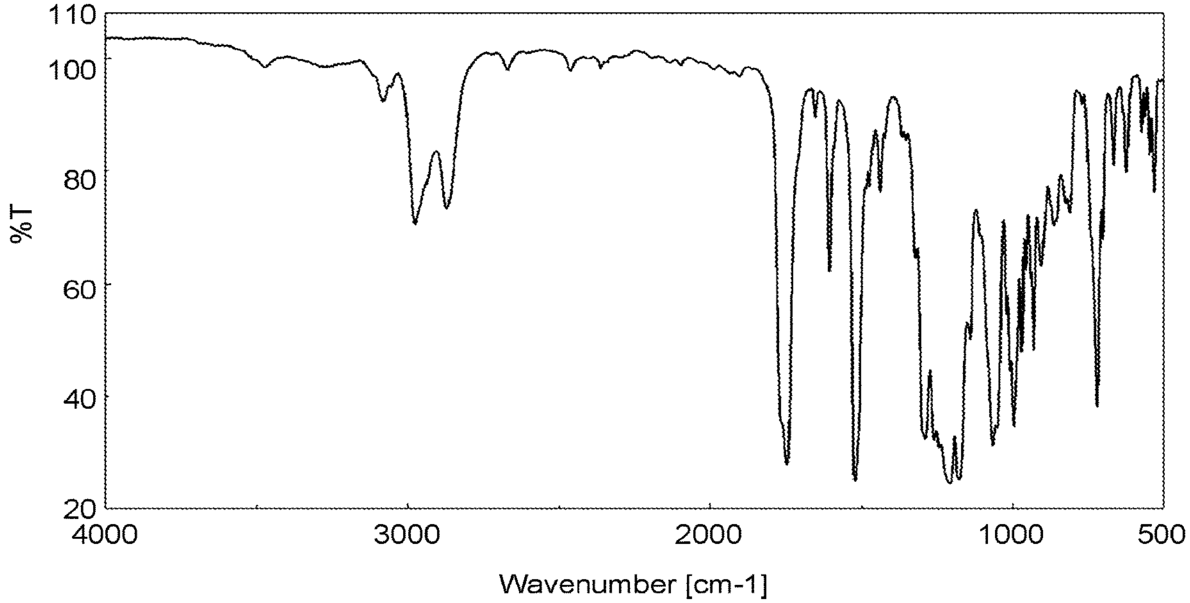
FIG. 8 illustrates the IR chart of the product (A-4) in Example A-4.

The product (A-4) (640 g) was obtained in the same manner as in Example A-1, except that in place of bisphenol A, 336 g (1.0 mol) of 2,2-bis(4-hydroxyphenyl)hexafluoropropane (bisphenol AF) was used. In the product (A-4), the ester group equivalent was 238 g/eq., and the fluorine atom content was 29.2% by mass. With regard to the obtained product (A-4), GPC and IR were measured with similar manners as in Example A-1. FIG. 7 illustrates the GPC chart of the obtained product (A-4). FIG. 8 illustrates the IR chart of the obtained product (A-4). By the mass spectrum analysis, the peak at m/z=498, corresponding to the n=0 component, the peak at m/z=964, corresponding to the n=1 component, and the peak at m/z=1430, corresponding to the n=2 component, could be recognized.

Example A-5

Figure 9:
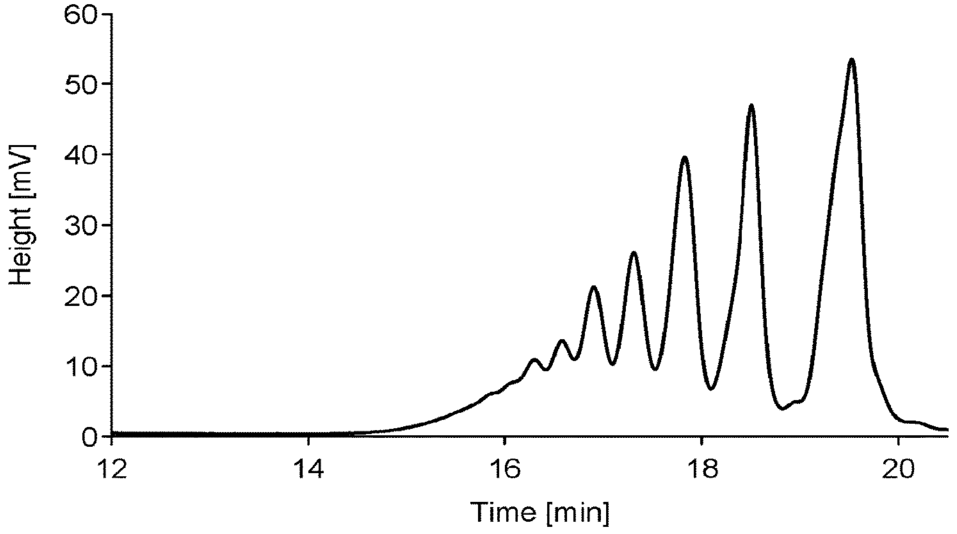
FIG. 9 illustrates the GPC chart of the product (A-5) in Example A-5.
Figure 10:
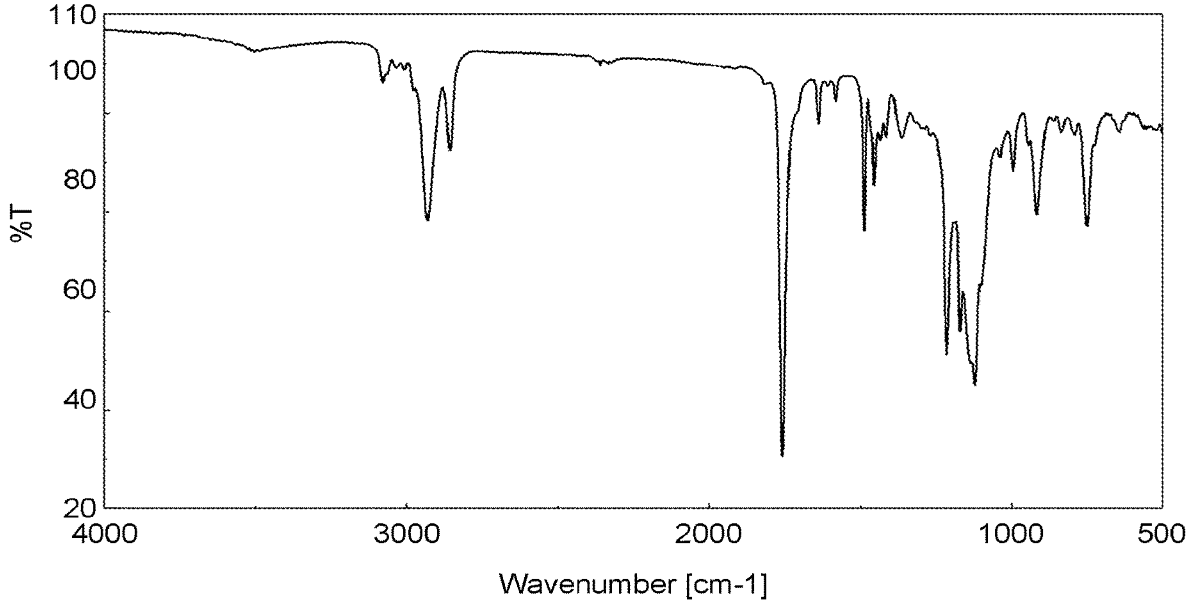
FIG. 10 illustrates the IR chart of the product (A-5) in Example A-5.

The product (A-5) (535 g) was obtained in the same manner as in Example A-4, except that 121 g (1.0 mol) of 4-fluorophenol was used in place of pentafluorophenol. In the product (A-5), the ester group equivalent was 215 g/eq., and the fluorine atom content was 20.7% by mass. With regard to the obtained product (A-5), GPC and IR were measured with similar manners as in Example A-1. FIG. 9 illustrates the GPC chart of the obtained product (A-5). FIG. 10 illustrates the IR chart of the obtained product (A-5). By the mass spectrum analysis, the peak at m/z=354, corresponding to the n=0 component, the peak at m/z=820, corresponding to the n=1 component, and the peak at m/z=1286, corresponding to the n=2 component, could be recognized.

Comparative Example A-1

Figure 11:
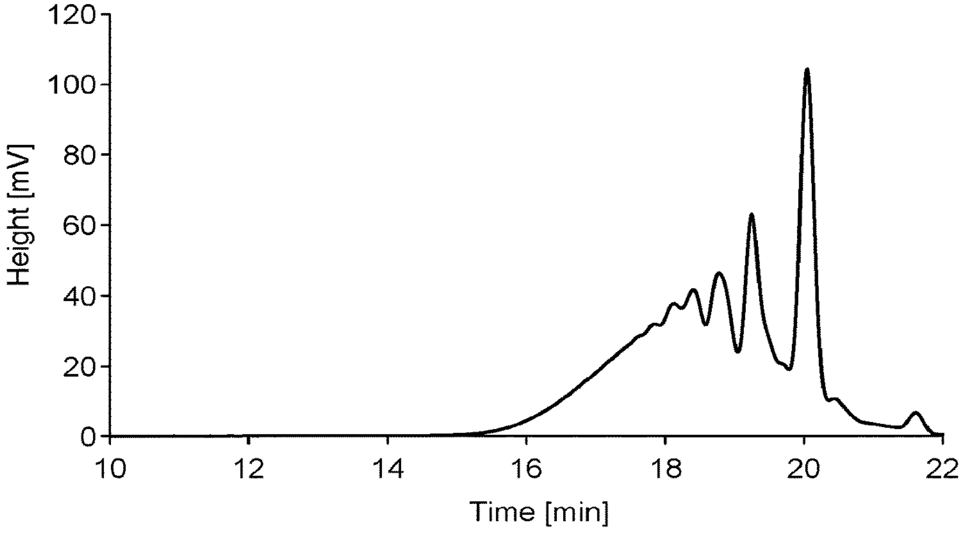
FIG. 11 illustrates the GPC chart of the product (A-1') in Comparative Example A-1.
Figure 12:
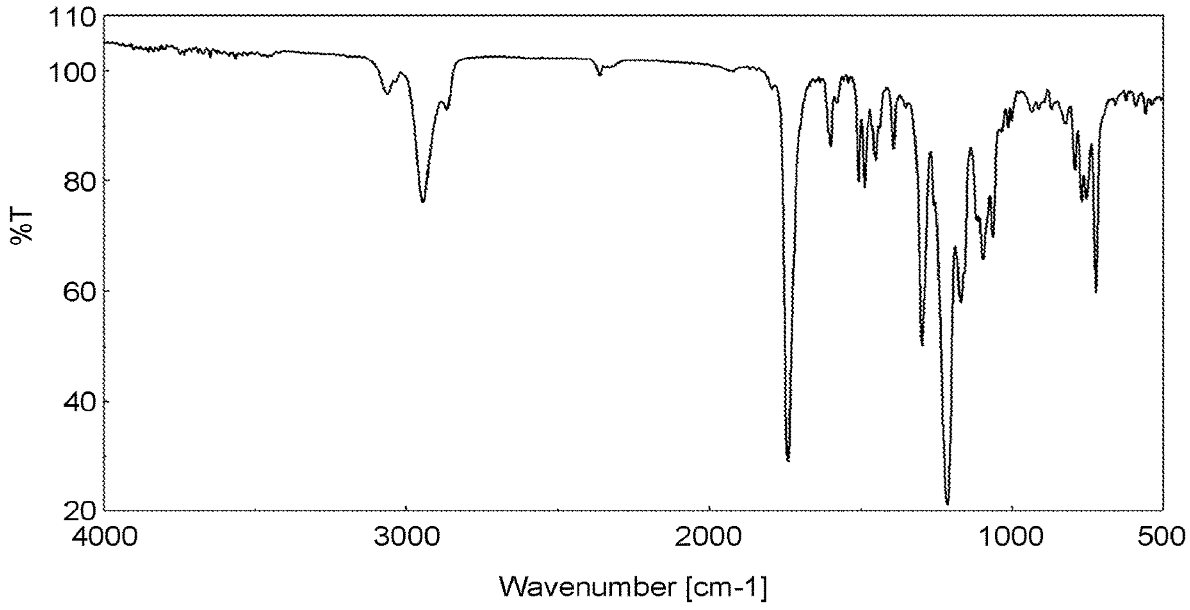
FIG. 12 illustrates the IR chart of the product (A-1') in Comparative Example A-1.

The product (A-1') (502 g) was obtained in the same manner as in Example A-1, except that 94 g (1.0 mol) of phenol was used in place of pentafluorophenol. In the product (A-1'), the ester group equivalent was 208 g/eq., and the fluorine atom content was 18.2% by mass. With regard to the obtained product (A-1'), GPC and IR were measured with similar manners as in Example A-1. FIG. 11 illustrates the GPC chart of the obtained product (A-1'). FIG. 12 illustrates the IR chart of the obtained product (A-1'). By the mass spectrum analysis, the peak at m/z=318, corresponding to the n=0 component, the peak at m/z=784, corresponding to the n=1 component, and the peak at m/z=1250, corresponding to the n=2 component, could be recognized.

The compound of the main component, the ester group equivalent, and the fluorine atom content in each of the above products (A-1) to (A-5) and (A-1') are summarized in Table 1.

TABLE 1
| Examples | | Structures of main component | Ester group equivalent (g/eq.) | Fluorine atoms content (% by mass) |
|---|---|---|---|---|
| | A-1 | 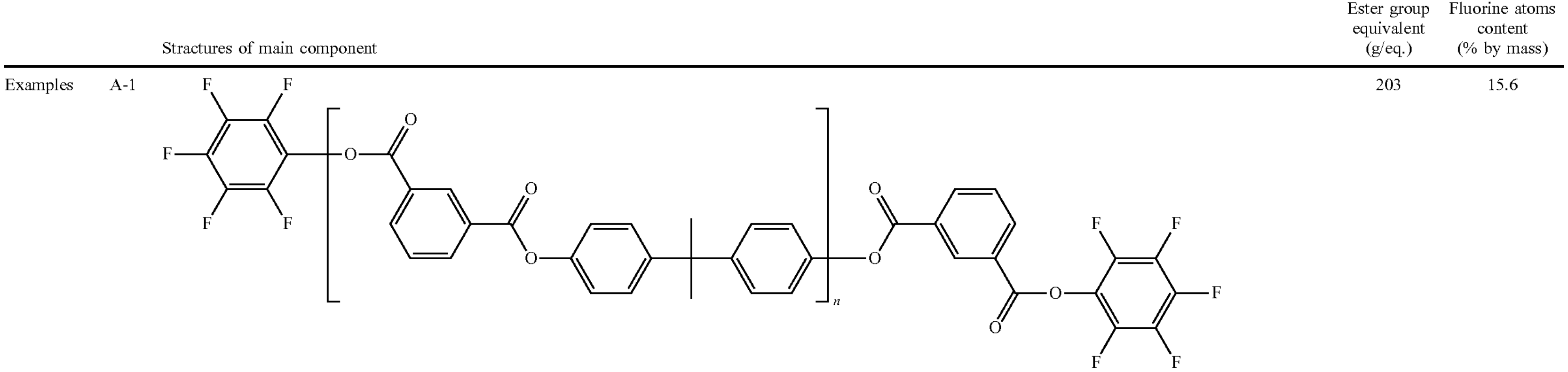 | 203 | 15.6 |
| | A-2 | 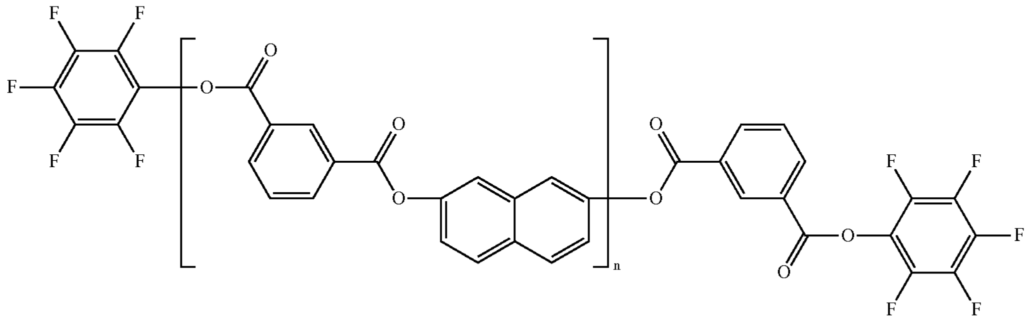 | 194 | 24.1 |
| | A-3 | 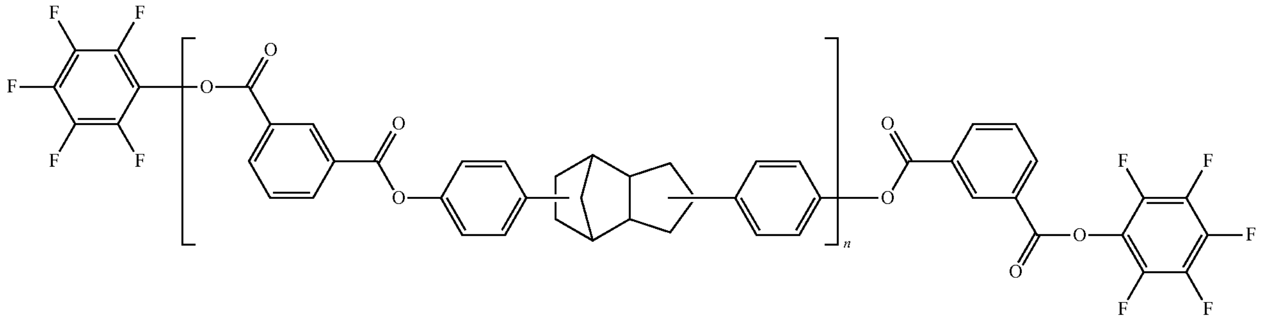 | 233 | 13.6 |

TABLE 1-continued
| | | Structures of main component | Ester group equivalent (g/eq.) | Fluorine atoms content (% by mass) |
|---|---|---|---|---|
| | A-4 | 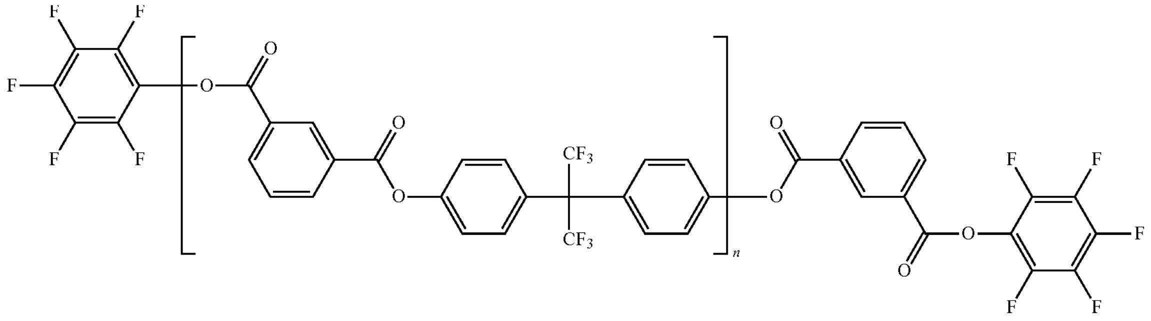 | 238 | 29.2 |
| | A-5 | 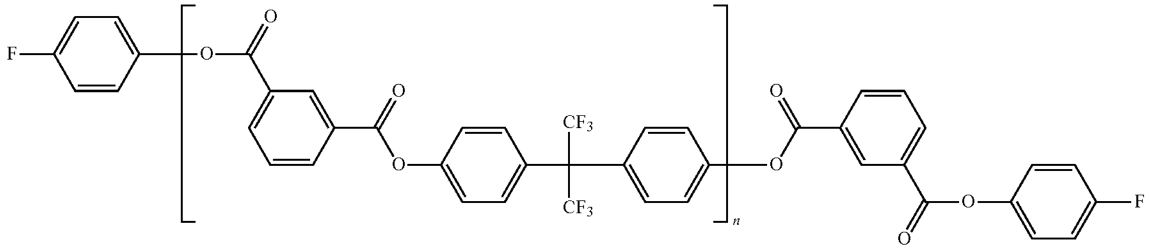 | 215 | 20.7 |
| Comparative Example | A-1 | 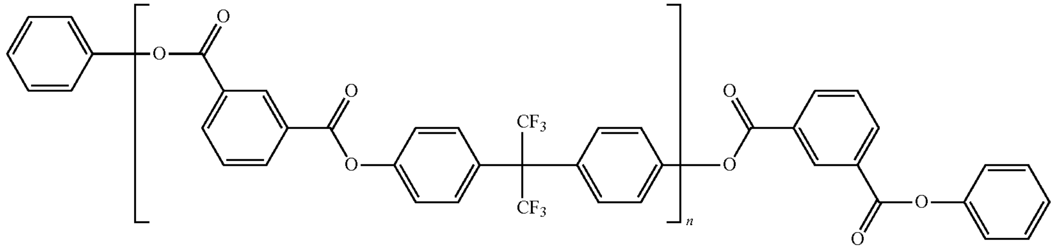 | 208 | 18.2 |

Example B-1: Preparation of Resin Composition (B-1)

The resin composition (B-1) for evaluation of the curing property was prepared by dissolving 203 g of the product (A-1) obtained in Example A-1 and 275 g of biphenyl aralkyl epoxy resin ("NC-3000" manufactured by Nippon Kayaku Co., Ltd., epoxy equivalent of 275 g/eq.) into 500 g of methyl ethyl ketone, followed by addition of 5.0 g of dimethylaminopyridine as the curing accelerator.

Example B-2: Preparation of Resin Composition (B-2)

The resin composition (B-2) was prepared in the same manner as in Example B-1, except that in place of the product (A-1) obtained in Example A-1, 194 g of the product (A-2) obtained in Example A-2 was used.

Example B-3: Preparation of Resin Composition (B-3)

The resin composition (B-3) was prepared in the same manner as in Example B-1, except that in place of the product (A-1) obtained in Example A-1, 233 g of the product (A-3) obtained in Example A-3 was used.

Example B-4: Preparation of Resin Composition (B-4)

The resin composition (B-4) was prepared in the same manner as in Example B-1, except that in place of the product (A-1) obtained in Example A-1, 238 g of the product (A-4) obtained in Example A-4 was used.

Example B-5: Preparation of Resin Composition (B-5)

The resin composition (B-5) was prepared in the same manner as in Example B-1, except that in place of the product (A-1) obtained in Example A-1, 215 g of the product (A-5) obtained in Example A-5 was used.

Comparative Example B-1: Preparation of Resin Composition (B-1')

The resin composition (B-1') was prepared in the same manner as in Example B-1, except that in place of the product (A-1) obtained in Example A-1, 208 g of the product (A-1') obtained in Comparative Example A-1 was used.

Test Example 1: Evaluation of Curing Property by Measuring Gelling Time

The gelling times of the resin compositions (B-1) to (B-5) and (B-1') were measured using a cure plate at 160° C. The evaluation results of the curing property of the resin compositions (B-1) to (B-5) and (B-1') prepared in Examples B-1 to B-5 and Comparative Example B-1, respectively, are summarized in Table 2.

TABLE 2

| | | Resin compositions | Products used | Gelling times (sec) |
|---|---|---|---|---|
| Examples | B-1 | Resin composition (B-1) | Product (A-1) | 52 |
| | B-2 | Resin composition (B-2) | Product (A-2) | 48 |
| | B-3 | Resin composition (B-3) | Product (A-3) | 62 |
| | B-4 | Resin composition (B-4) | Product (A-4) | 51 |
| | B-5 | Resin composition (B-5) | Product (A-5) | 73 |
| Comparative Example | B-1 | Resin composition (B-1') | Product (A-1') | 102 |

The structure of the compound according to the present invention in which the fluorine atom is directly bonded to the aromatic carbon is thought to contribute to improvement in the curing property because of the fast ester exchange reaction (cross-linking reaction of the active ester) due to the electron density.

Example C-1: Preparation of Resin Composition (C-1)

Fifteen parts of liquid bisphenol A epoxy resin (epoxy equivalent of 180; "828US" manufactured by Mitsubishi Chemical Corp.) and 15 parts of biphenyl epoxy resin (epoxy equivalent of 291; "NC3000H" manufactured by Nippon Kayaku Co., Ltd.) were dissolved in 15 parts of methyl ethyl ketone (hereinafter this is simply referred to as "MEK") and 15 parts of cyclohexanone by heating with stirring. Then, 40 parts of the product (A-1) obtained in Example A-1 (ester group equivalent of 203 g/eq.; toluene solution with 65% solid content), 0.15 parts of a curing accelerator (4-dimethylaminopyridine; manufactured by Koei Chemical Co., Ltd.), 100 parts of spherical silica ("SO—C2"; treated with phenylaminosilane; average particle diameter of 0.5 μm; 0.18% carbon content per unit mass; manufactured by Admatechs Co., Ltd.), and 15 parts of phenoxy resin ("YL6954BH30"; manufactured by Mitsubishi Chemical Corp.; MEK solution with 30% by mass of solid content; weight-average molecular weight of 40000) were uniformly dispersed by using a high-speed rotary mixer to prepare the resin composition (C-1).

Example C-2: Preparation of Resin Composition (C-2)

The resin composition (C-2) was prepared in the same manner as in Example C-1, except that in place of 40 parts of the product (A-1), 38 parts of the product (A-2) obtained in Example A-2 was used.

Example C-3: Preparation of Resin Composition (C-3)

The resin composition (C-3) was prepared in the same manner as in Example C-1, except that in place of 40 parts of the product (A-1), 46 parts of the product (A-3) obtained in Example A-3 was used.

Example C-4: Preparation of Resin Composition (C-4)

The resin composition (C-4) was prepared in the same manner as in Example C-1, except that in place of 40 parts of the product (A-1), 47 parts of the product (A-4) obtained in Example A-4 was used.

Example C-5: Preparation of Resin Composition (C-5)

The resin composition (C-5) was prepared in the same manner as in Example C-1, except that in place of 40 parts of the product (A-1), 42 parts of the product (A-5) obtained in Example A-5 was used.

Comparative Example C-1: Preparation of Resin Composition (C-1')

The resin composition (C-1') was prepared in the same manner as in Example C-1, except that in place of 40 parts of the product (A-1), 41 parts of the product (A-1') obtained in Comparative Example A-1 was used.

Test Example 2: Evaluation of Insulation Reliability (1) Preparation of Resin Sheet Each of the resin compositions (C-1) to (C-5) and (C-1') obtained in Examples C-1 to C-5 and Comparative Example C-1, respectively, was applied onto polyethylene terephthalate (thickness of 38 μm; hereinafter this is simply referred to as "PET") using a die coater so as to give the resin thickness of 40 μm after dried. Then, this was dried in the temperature range of 80 to 120° C. (average 100° C.) for 6 minutes to obtain a resin sheet.

(2) Surface Treatment of Laminate

Both sides of a both-sides copper-clad glass cloth substrate epoxy resin laminate (copper foil thickness of 18 μm; residual copper ratio of 60%; substrate thickness of 0.3 mm; R5715ES; manufactured by Matsushita Electric Works Co., Ltd.) formed with an inner circuit were immersed in CZ8100 manufactured by MEC Co., Ltd. to roughen the copper surface.

(3) Lamination of Resin Sheet

Both sides of the laminate were laminated with the resin sheet prepared in (1) by using a batch vacuum pressing laminator MVLP-500 (manufactured by Meiki Co., Ltd.). The lamination was carried out by depressurizing over 30 seconds to bring the pressure to 13 hPa or less, followed by press adhesion with the pressure of 0.74 MPa and the temperature of 100° C. for 30 seconds.

(4) Curing of Resin Composition

The PET film was peeled off from the laminated resin sheet, and then, the resin composition was cured under the curing condition of 170° C. for 30 minutes.

(5) Roughening Treatment

The laminate was immersed in Swelling Dip Securigand P containing diethylene glycol monobutyl ether manufactured by Atotech Japan Co., Ltd. at 60° C. for 10 minutes. Then, this was immersed in Concentrate Compact P (water solution of $KMnO_4$: 60 g/L, NaOH: 40 g/L) manufactured by Atotech Japan Co., Ltd. as the roughening solution at 80° C. for 20 minutes. Finally, this was immersed in Reduction Solution Securiganth P manufactured by Atotech Japan Co. as the neutralizing solution at 40° C. for 5 minutes. The laminate obtained after the roughening treatment was designated as Sample A.

(6) Plating Formation by Semi-Additive Process

To form a circuit on the surface of the insulating layer, the laminate thus obtained was immersed in an electroless plating liquid containing $PdCl_2$, followed by immersion in an electroless copper plating liquid. After annealing at 150° C. for 30 minutes, an etching resist was formed. After patterned by etching, the copper sulfate electrolytic plating was carried out to form a conductive layer having a thickness of 30 μm. Next, annealing was carried out at 180° C. for 60 minutes. This laminate was designated as Sample B.

(7) Insulation Reliability Evaluation (Heat and Moisture Resistance Evaluation)

A circularly cut resist tape (ELEP Masking Tape N380; manufactured by Nitto Denko Corp.) was attached on the conductive layer of Sample B and immersed in an aqueous ferric chloride solution for 30 minutes. The conductive layer in the portion not attached with the resist tape was removed to obtain an evaluation substrate having a circular conductive layer formed on the insulating layer. Then, a portion of the insulating layer was scraped off to expose the underlying copper foil. The exposed copper foil was then connected to the circular conductive layer by wiring (wire). After a DC power source (TP018-3D; manufactured by Takasago Ltd.) was connected to the wiring of the evaluation substrate, a voltage of 3.3 V was applied at 130° C. and 85% RH for 200 hours. The resistance was measured after 200 hours, and those exhibiting the resistance of $1.0\times10^8\Omega$ or more were designated "O", and those exhibiting an insulation resistance of $1.0\times10^7\Omega$ or more to less than $1.0\times10^8\Omega$ were designated "A", and those exhibiting an insulation resistance of less than $1.0\times10^7\Omega$ were designated as "X".

Test Example 3: Measurement of Dielectric Property (Dielectric Loss Tangent)

The resin sheet prepared in Test Example 2 (1) was thermally cured at 190° C. for 90 minutes, and the PET film was peeled off to obtain a sheet-like cured product. The resulting cured product was cut into a test piece having the size of 2 mm wide and 80 mm long; with this, the dielectric loss tangent (tan δ) was measured at the measurement frequency of 5.8 GHz and 23° C. by the cavity resonance method, by respectively using the relative permittivity measurement instrument CP521 with the cavity resonator perturbation method manufactured by Kanto Electronic Application and Development Inc., and the network analyzer E8362B manufactured by Agilent Technologies Japan, Ltd. The measurements were carried out for two test pieces, and the average value thereof was calculated.

Test Example 4: Measurement of Glass Transition Temperature

The sheet-like cured product obtained in Test Example 3 was cut to a test specimen having the size of approximately 5 mm wide and approximately 15 mm long; and the thermomechanical analysis thereof was carried out using a dynamic viscoelasticity measurement instrument (EXSTAR 6000, manufactured by SII Nanotechnology, Inc.) with a tensile weighting method. After mounting the test specimen on the instrument, the measurement was carried out with a load of 200 mN and a temperature raising rate of 2° C./min. The obtained peak top of the resulting tan δ was calculated as the glass transition temperature (° C.).

The measurement and evaluation results of Test Examples 2 to 4 are summarized in Table 3 below.

TABLE 3

(Table 3)

| | | Resin compositions | Products used | Dielectric loss tangent (tanδ) | Glass transition temperature (° C.) | Insulation reliability |
|---|---|---|---|---|---|---|
| Examples | C-1 | Resin composition (C-1) | Product (A-1) | 0.0044 | 159 | ○ |
| | C-2 | Resin composition (C-2) | Product (A-2) | 0.0045 | 168 | ○ |
| | C-3 | Resin composition (C-3) | Product (A-3) | 0.0039 | 172 | ○ |
| | C-4 | Resin composition (C-4) | Product (A-4) | 0.0040 | 170 | ○ |
| | C-5 | Resin composition (C-5) | Product (A-5) | 0.0055 | 145 | Δ |
| Comparative Example | C-1 | Resin composition (C-1') | Product (A-1') | 0.0068 | 123 | x |

As can be seen in Tables 2 and 3, when the ester compound (A) is used as the component of the resin composition, the curing property, the dielectric property, the heat resistance, and the moisture resistance are superior to those of conventional active ester compounds.

In particular, the structure in which the fluorine atom is directly bonded to the aromatic carbon is so rigid that the fluctuation of the molecular chain in response to changes in temperature and electric field is small, which presumably contributes to improvement in the insulation reliability and in the dielectric property.

In other words, the resin composition and the cured product using the ester compound (A) are the materials that can have a high level of suppression of the transmission loss, which is required in a high-frequency environment such as a 5G device, without sacrificing processability and reliability.

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A compound comprising, in one molecule thereof, a structure represented by formula (1):

(1)

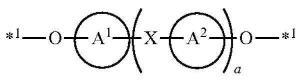

wherein a ring $A^1$ and a ring $A^2$ each independently represent an aromatic ring optionally having a substituent group;

X represents a single bond or a divalent organic group;

a represents 0 or 1; and

*1 indicates a bonding site to a carbonyl carbon atom to form an ester structure by bonding to the carbonyl carbon atom;

a structure represented by formula (2):

(2)

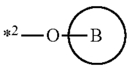

wherein a ring B represents an aromatic ring substituted with one or more fluorine atoms; and

*2 indicates a bonding site with a carbonyl carbon atom to form an ester structure by bonding to the carbonyl carbon atom; and a structure represented by formula (3):

(3)

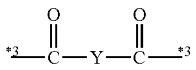

wherein

Y represents a divalent organic group; and

*3 indicates a bonding site with an oxygen atom to form an ester structure by bonding to the oxygen atom.

2. The compound according to claim 1, wherein the ring B is an aromatic ring substituted with two or more fluorine atoms.

3. The compound according to claim 1, wherein the structure represented by the formula (1) comprises 3 or more fluorine atoms in one unit of the structure.

4. The compound according to claim 1, wherein the compound is represented by formula (A1):

(A1)

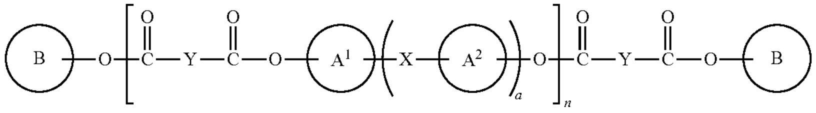

wherein the ring $A^1$ and the ring $A^2$ each independently represent an aromatic ring optionally having a substituent group;

each of the ring B independently represents an aromatic ring substituted with one or more fluorine atoms;

each X independently represents a single bond or a divalent organic group;

each Y independently represents a divalent organic group;

each a independently represents 0 or 1; and n represents an integer of 1 or more.

5. The compound according to claim 4, wherein the compound is represented by formula (A2):

(A2)

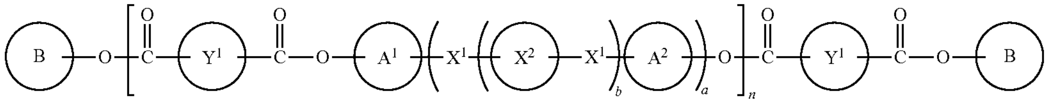

wherein the ring $A^1$ and the ring $A^2$ each independently represent an aromatic ring optionally having a substituent group;

each of the ring B independently represents an aromatic ring substituted with one or more fluorine atoms;

each $X^1$ independently represents a single bond, $—C(R^x)_2—$, —O—, —CO—, —S—, —SO—, $—SO_2—$, —CONH—, or —NHCO—;

each $R^x$ independently represents a hydrogen atom, an alkyl group optionally having a substituent group, or an aryl group optionally having a substituent group;

each of the ring $X^2$ independently represents an aromatic ring optionally having a substituent group or a non-aromatic ring optionally having a substituent group;

each of the ring $Y^1$ independently represents an aromatic carbon ring optionally having a substituent group;

each a independently represents 0 or 1;

each b independently represents an integer of 0 to 3; and n represents an integer of 1 or more.

6. The compound according to claim 1, wherein a content of the fluorine atom is 28% or more by mass.

7. An epoxy resin curing agent comprising the compound according to claim 1.

8. A method for producing a compound comprising, in one molecule thereof, a structure represented by formula (1):

(1)

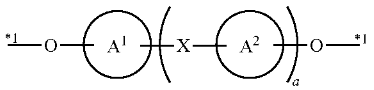

wherein a ring $A^1$ and a ring $A^2$ each independently represent an aromatic ring optionally having a substituent group;

X represents a single bond or a divalent organic group;

a represents 0 or 1; and

*1 indicates a bonding site to a carbonyl carbon atom to form an ester structure by bonding to the carbonyl carbon atom;

a structure represented by formula (2):

(2)

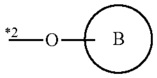

wherein a ring B represents an aromatic ring substituted with one or more fluorine atoms; and

*2 indicates a bonding site with a carbonyl carbon atom to form an ester structure by bonding to the carbonyl carbon atom; and a structure represented by formula (3):

(3)

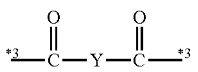

wherein

Y represents a divalent organic group; and

*3 indicates a bonding site with an oxygen atom to form an ester structure by bonding to the oxygen atom, the method comprising reacting a mixture comprising a compound represented by formula (B1):

(B1)

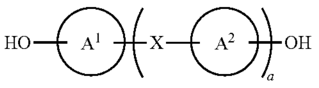

wherein all the symbols are the same as those described above, a compound represented by formula (C1):

(C1)

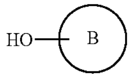

wherein all the symbols are the same as those described above, and a compound represented by formula (D1-1) or (D1-2):

(D1-1)

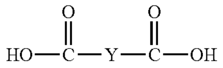

(D1-2)

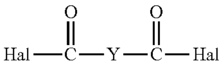

wherein Hal represents a halogen atom; other symbols are the same as those described above, or a salt thereof.

9. A product obtained by reacting a mixture comprising a compound represented by formula (B1):

(B1)

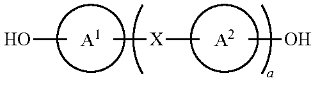

wherein a ring $A^1$ and a ring $A^2$ each independently represent an aromatic ring optionally having a substituent group; X represents a single bond or a divalent organic group; and a represents 0 or 1;

a compound represented by formula (C1):

(C1)

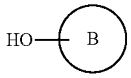

wherein a ring B represents an aromatic ring substituted with one or more fluorine atoms; and a compound represented by formula (D1-1) or (D1-2):

(D1-1)

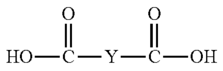

-continued (D1-2)

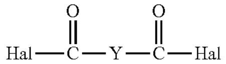

wherein Hal represents a halogen atom; Y represents a divalent organic group, or a salt thereof.

10. A resin composition comprising an epoxy resin and a compound comprising, in one molecule thereof, a structure represented by formula (1):

(1)

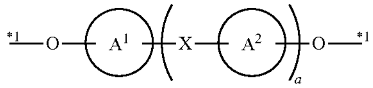

wherein a ring $A^1$ and a ring $A^2$ each independently represent an aromatic ring optionally having a substituent group;

X represents a single bond or a divalent organic group;

a represents 0 or 1; and

*1 indicates a bonding site to a carbonyl carbon atom to form an ester structure by bonding to the carbonyl carbon atom;

a structure represented by formula (2):

(2)

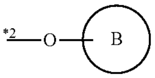

wherein a ring B represents an aromatic ring substituted with one or more fluorine atoms; and

*2 indicates a bonding site with a carbonyl carbon atom to form an ester structure by bonding to the carbonyl carbon atom; and a structure represented by formula (3):

(3)

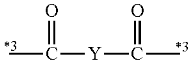

wherein

Y represents a divalent organic group; and

*3 indicates a bonding site with an oxygen atom to form an ester structure by bonding to the oxygen atom.

11. The resin composition according to claim 10, further comprising an inorganic filler.

12. The resin composition according to claim 11, wherein a content of the inorganic filler is 60% or more by mass relative to 100% by mass of nonvolatile components in the resin composition.

13. The resin composition according to claim 10, wherein the resin composition is to form an insulating layer of a printed wiring board.

14. The resin composition according to claim 10, wherein the resin composition is to encapsulate a semiconductor chip.

15. A cured product of a resin composition according to claim 10.

16. A sheet-like laminate material comprising a resin composition according to claim 10.

17. A resin sheet comprising:

a support; and a resin composition layer formed on the support, the resin composition layer being formed of a resin composition according to claim 10.

18. A printed wiring board comprising an insulating layer formed of a cured product of a resin composition according to claim 10.

19. A semiconductor device comprising a printed wiring board according to claim 18.

20. The semiconductor device according to claim 19, wherein the semiconductor device is a Fan-Out semiconductor device.

* * * * *